United States Patent
Martin et al.

(10) Patent No.: US 8,941,394 B2
(45) Date of Patent: Jan. 27, 2015

(54) CAPACITIVE SENSOR SYSTEM WITH NOISE REDUCTION

(75) Inventors: Bradley Martin, Austin, TX (US);
Dazhi Wei, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 1141 days.

(21) Appl. No.: 12/895,087

(22) Filed: Sep. 30, 2010

(65) Prior Publication Data

US 2011/0157077 A1    Jun. 30, 2011

Related U.S. Application Data

(63) Continuation-in-part of application No. 12/650,748, filed on Dec. 31, 2009, now abandoned.

(51) Int. Cl.
*G01R 27/26* (2006.01)
*G06F 3/044* (2006.01)
*G06F 3/041* (2006.01)

(52) U.S. Cl.
CPC .............. *G06F 3/044* (2013.01); *G06F 3/0418* (2013.01); *G01R 27/2605* (2013.01)
USPC ......................................... 324/681; 324/658

(58) Field of Classification Search
CPC ... G06F 3/044; G06F 3/0416; G06F 3/03547; G06F 3/0418; G06F 3/0383; G09G 3/325; G09G 3/3283; G09G 2300/0842; G09G 2310/0248; H03K 2017/9602; H03K 17/962; H03K 17/955; H03K 2217/960705; H03K 2217/960725; H03K 2217/960715; H03K 2217/960755; H03K 2217/96077; G02F 1/13338; G01D 5/24; G01R 27/2605; G01R 29/26

USPC .................................................. 324/658, 681
See application file for complete search history.

(56) References Cited

U.S. PATENT DOCUMENTS

| | | | | |
|---|---|---|---|---|
| 3,428,828 A * | 2/1969 | Korzekwa et al. | ............... | 327/93 |
| 5,469,364 A * | 11/1995 | Hughey et al. | .................. | 702/65 |
| 5,543,588 A * | 8/1996 | Bisset et al. | ............... | 178/18.06 |
| 5,543,590 A * | 8/1996 | Gillespie et al. | ............ | 178/18.06 |
| 5,543,591 A * | 8/1996 | Gillespie et al. | ............ | 178/18.03 |
| 5,586,042 A * | 12/1996 | Pisau et al. | ....................... | 702/65 |
| 5,889,511 A * | 3/1999 | Ong et al. | ....................... | 345/173 |
| 6,049,620 A * | 4/2000 | Dickinson et al. | ............ | 382/124 |
| 6,538,456 B1 * | 3/2003 | Dickinson et al. | ............ | 324/658 |
| 6,949,937 B2 * | 9/2005 | Knoedgen | ....................... | 324/658 |
| 7,129,714 B2 * | 10/2006 | Baxter | .......................... | 324/678 |
| 7,986,193 B2 * | 7/2011 | Krah | ............................... | 331/44 |
| 8,035,622 B2 * | 10/2011 | Hotelling et al. | ............. | 345/173 |

(Continued)

*Primary Examiner* — Patrick Assouad
*Assistant Examiner* — Sean Curtis

(57) ABSTRACT

A system for reducing noise when detecting the capacitance value of a capacitor in a touch display that operates in a potentially noisy environment. A capacitance sensor is provided for determining the size of the capacitor in the touch screen display and includes a charging circuit that charges the capacitor and a discharge circuit that resets the charge of the capacitor to substantially zero. A control circuit controls the capacitance sensor and the operation of the charge and discharge circuits in accordance with a predetermined charging/discharging algorithm to resolve the value of the capacitor and output such value in a sampling operation. The operation of the control circuit and the charging/discharging algorithm is subject to errors as a function of the noisy environment, which errors will be reflected in the output value. A noise reduction circuit is provided to modify the operation of the control circuit to reduce noise.

11 Claims, 27 Drawing Sheets

(56) References Cited

U.S. PATENT DOCUMENTS

| | | | |
|---|---|---|---|
| 8,054,090 B2* | 11/2011 | Philipp et al. | 324/684 |
| 8,154,310 B1* | 4/2012 | Maharyta et al. | 324/686 |
| 8,355,010 B2* | 1/2013 | Lin et al. | 345/174 |
| 8,378,981 B2* | 2/2013 | Yilmaz et al. | 345/173 |
| 8,502,801 B2* | 8/2013 | Goh et al. | 345/174 |
| 8,536,880 B2* | 9/2013 | Philipp | 324/658 |
| 8,552,315 B2* | 10/2013 | Yilmaz | 178/18.06 |
| 8,605,037 B2* | 12/2013 | Philipp et al. | 345/173 |
| 2004/0004488 A1* | 1/2004 | Baxter | 324/678 |
| 2005/0099188 A1* | 5/2005 | Baxter | 324/678 |
| 2005/0134292 A1* | 6/2005 | Knoedgen | 324/658 |
| 2008/0048997 A1* | 2/2008 | Gillespie et al. | 345/174 |
| 2008/0158184 A1* | 7/2008 | Land et al. | 345/173 |
| 2008/0179112 A1* | 7/2008 | Qin et al. | 178/18.06 |
| 2009/0009487 A1* | 1/2009 | Nishitani et al. | 345/174 |
| 2009/0244014 A1* | 10/2009 | Hotelling et al. | 345/173 |
| 2009/0256815 A1* | 10/2009 | Westerinen et al. | 345/174 |
| 2009/0303198 A1* | 12/2009 | Yilmaz et al. | 345/173 |
| 2009/0303203 A1* | 12/2009 | Yilmaz et al. | 345/174 |
| 2010/0044122 A1* | 2/2010 | Sleeman et al. | 178/18.06 |
| 2010/0045632 A1* | 2/2010 | Yilmaz et al. | 345/174 |
| 2010/0051354 A1* | 3/2010 | Ningrat et al. | 178/18.06 |
| 2010/0053097 A1* | 3/2010 | Goh et al. | 345/173 |
| 2010/0079387 A1* | 4/2010 | Rosenblatt et al. | 345/173 |
| 2010/0096193 A1* | 4/2010 | Yilmaz et al. | 178/18.06 |
| 2010/0097078 A1* | 4/2010 | Philipp et al. | 324/684 |
| 2010/0139991 A1* | 6/2010 | Philipp et al. | 178/18.06 |
| 2010/0301879 A1* | 12/2010 | Philipp | 324/679 |
| 2011/0048812 A1* | 3/2011 | Yilmaz | 178/18.06 |
| 2011/0048813 A1* | 3/2011 | Yilmaz | 178/18.06 |
| 2011/0141052 A1* | 6/2011 | Bernstein et al. | 345/174 |
| 2011/0157077 A1* | 6/2011 | Martin et al. | 345/174 |
| 2011/0254802 A1* | 10/2011 | Philipp | 345/174 |
| 2011/0298759 A1* | 12/2011 | Yang et al. | 345/178 |
| 2012/0043972 A1* | 2/2012 | Jayaraman | 324/658 |
| 2012/0139846 A1* | 6/2012 | Krah et al. | 345/173 |
| 2014/0015796 A1* | 1/2014 | Philipp | 345/174 |

* cited by examiner

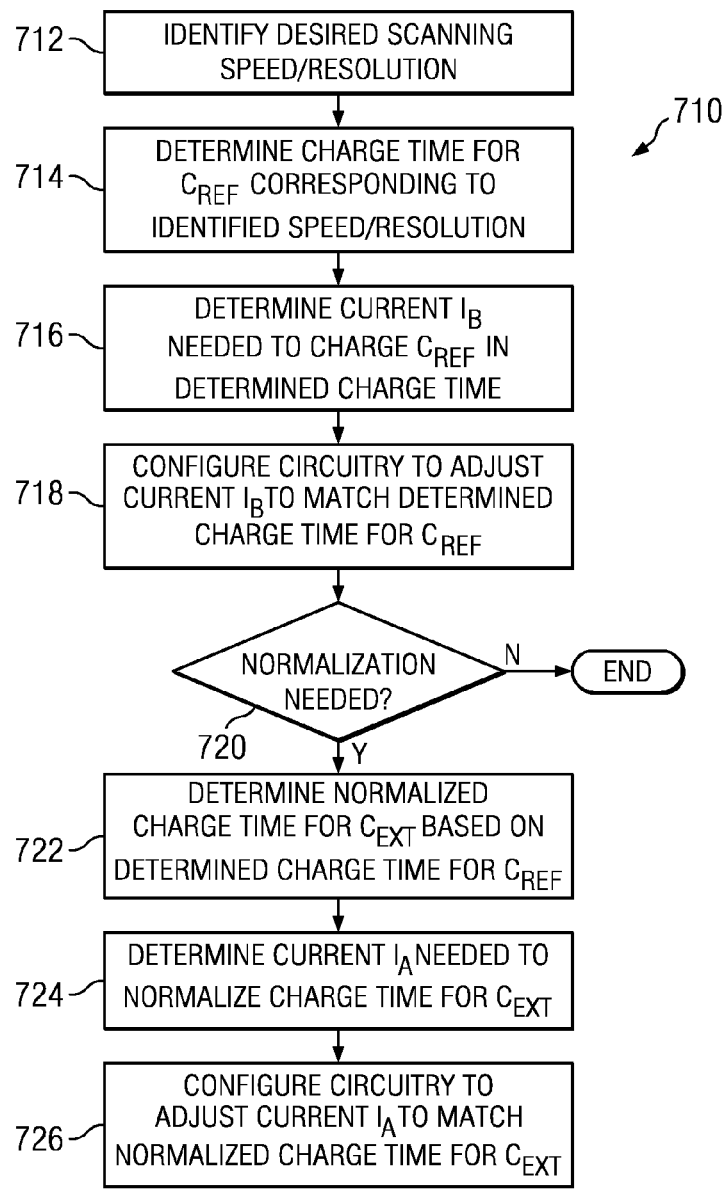

| Ramp period | ramp_sel<1> | ramp_sel<0> |
|---|---|---|
| T8 | 1 | 1 |
| T4 | 1 | 0 |
| T2 | 0 | 1 |
| T1 | 0 | 0 |

| sel_lp<2:0> | | | T1 nmos | T1 pmos | T2 nmos | T2 pmos | T4 nmos | T4 pmos | T8 nmos | T8 pmos |
|---|---|---|---|---|---|---|---|---|---|---|
| 0 | 0 | 0 | Swn1=1 | Swp1=0 | Swn1=1 | Swp1=0 | Swn1=1 | Swp1=0 | Swn1=1 | Swp1=0 |
| 0 | 0 | 1 | Swn1=1 | Swp2=0 | Swn2=1 | Swp2=0 | Swn3=1 | Swp3=0 | Swn4=1 | Swp4=0 |
| 0 | 1 | 0 | Swn1=1 | Swp2=0 | Swn2=1 | Swp3=0 | Swn3=1 | Swp5=0 | Swn4=1 |  |
| 0 | 1 | 1 | Swn2=1 | Swp2=0 | Swn3=1 | Swp2=0 | Swn4=1 | Swp4=0 |  | Swp5=0 |
| 1 | 0 | 0 | Swn2=1 | Swp3=0 | Swn3=1 | Swp3=0 | Swn4=1 |  | Swn5=1 | Swp6=0 |
| 1 | 0 | 1 | Swn3=1 | Swp3=0 | Swn3=1 | Swp4=0 |  | Swp5=0 | Swn5=1 |  |
| 1 | 1 | 0 | Swn3=1 | Swp4=0 | Swn4=1 | Swp5=0 | Swn5=1 |  | Swn5=1 | Swp6=0 |
| 1 | 1 | 1 | Swn4=1 | Swp4=0 |  | Swp5=0 |  | Swn5=1 |  | Swp6=0 |

*FIG. 12B*

| sel_lp<2:0> | | | T1 Res_nmos | T1 Res_pmos | T2 Res_nmos | T2 Res_pmos | T4 Res_nmos | T4 Res_pmos | T8 Res_nmos | T8 Res_pmos |
|---|---|---|---|---|---|---|---|---|---|---|
| 0 | 0 | 0 | 0 | 0 | 0 | 0 | 0 | 0 | 0 | 0 |
| 0 | 0 | 1 | 0 | 75k | 75k | 75k | 225k | 225k | 525k | 525k |
| 0 | 1 | 0 | 0 | 225k | 225k | 225k | 225k | 1125k | 525k | 2325k |
| 0 | 1 | 1 | 75k | 225k | 225k | 525k | 525k | 525k | 1125k | 1125k |
| 1 | 0 | 0 | 75k | 525k | 525k | 225k | 525k | 2325k | 1125k | 4725k |
| 1 | 0 | 1 | 225k | 225k | 525k | 1125k | 1125k | 1125k | 2325k | 2325k |
| 1 | 1 | 0 | 225k | 525k | 525k | 525k | 1125k | 2325k | 2325k | 4725k |
| 1 | 1 | 1 | 525k | 525k | 1125k | 1125k | 2325k | 2325k | 2325k | 4725k |

*FIG. 12C*

| sel_lp<2:0> | | | T1 | | T2 | | T4 | | T8 | |
|---|---|---|---|---|---|---|---|---|---|---|
| | | | freq_nmos | freq_pmos | freq_nmos | freq_pmos | freq_nmos | freq_pmos | freq_nmos | freq_pmos |
| 0 | 0 | 0 | 1000k | 1000k | 1000k | 1000k | 1000k | 1000k | 1000k | 1000k |
| 0 | 0 | 1 | 1000k | 500k | 500k | 500k | 250k | 250k | 125k | 125k |
| 0 | 1 | 0 | 1000k | 250k | 500k | 125k | 250k | 62.5k | 125k | 31.25k |
| 0 | 1 | 1 | 500k | 500k | 250k | 250k | 125k | 125k | 62.5k | 62.5k |
| 1 | 0 | 0 | 500k | 125k | 250k | 62.5k | 125k | 31.25k | 62.5k | 15.6k |
| 1 | 0 | 1 | 250k | 250k | 125k | 125k | 62.5k | 62.5k | 31.25k | 31.25k |
| 1 | 1 | 0 | 250k | 125k | 125k | 62.5k | 62.5k | 31.25k | 31.25k | 15.6k |
| 1 | 1 | 1 | 125k | 125k | 62.5k | 62.5k | 31.25k | 31.25k | 15.6k | 15.6k |

1206

CAPACITIVE SENSOR SYSTEM WITH NOISE REDUCTION

CROSS-REFERENCE TO RELATED APPLICATIONS

This application is a Continuation-in-Part of U.S. patent application Ser. No. 12/650,748, filed Dec. 31, 2009, entitled CAPACITIVE SENSOR WITH VARIABLE CORNER FREQUENCY FILTER, which is related to U.S. patent application Ser. No. 12/494,417, filed on Jun. 30, 2009, entitled SYSTEM AND METHOD FOR DETERMINING CAPACITANCE VALUE, U.S. patent application Ser. No. 12/146,349, filed on Jun. 25, 2008, entitled LCD CONTROLLER CHIP, co-pending U.S. patent application Ser. No. 12/146,349, filed Dec. 31, 2009, entitled SYSTEM AND METHOD FOR CONFIGURING CAPACITIVE SENSING SPEED, and co-pending U.S. patent application Ser. No. 12/651,152, filed Dec. 31, 2009, entitled TOUCH SCREEN POWER-SAVING SCREEN SCANNING ALGORITHM, all of which are incorporated herein by reference in their entirety.

TECHNICAL FIELD

The present invention relates to noise reduction in a touch capacitive sensing system, and more particularly, to a system and method for reducing noise from various sources that may affect touch capacitor sensing.

BACKGROUND

Electronic circuit design often requires the use of various interface circuitries such as capacitive sensor arrays that enable the user to interact with or receive information from an electronic circuit. Typically, dedicated sensing circuitry may be used to detect the activation of various capacitive switches within a capacitive sensor array enabling a user to input particular information into a circuit.

Within a capacitive sensor array there is needed the ability to detect differences in the capacitance value of a capacitive switch responsive to the placement of an object upon or in the proximity of the capacitive switch. Current technologies lack the ability to adequately reduce noise that may affect such detection and improvements are needed. Further, the displays that incorporate such capacitive switches are subject to various noise sources that can affect the capacitance measurement.

SUMMARY

The present invention, as disclosed and described herein, in one aspect thereof, comprises a system for reducing noise when detecting the capacitance value of a capacitor in a touch display that operates in a potentially noisy environment. A capacitance sensor is provided for determining the size of the capacitor in the touch screen display and includes a charging circuit that charges the capacitor and a discharge circuit that resets the charge of the capacitor to substantially zero. A control circuit controls the capacitance sensor and the operation of the charge and discharge circuits in accordance with a predetermined charging/discharging algorithm to resolve the value of the capacitor and output such value in a sampling operation. The operation of the control circuit and the charging/discharging algorithm is subject to errors as a function of the noisy environment, which error will be reflected in the output value. A noise reduction circuit is provided to modify the operation of the control circuit to reduce noise.

BRIEF DESCRIPTION OF THE DRAWINGS

For a more complete understanding, reference is now made to the following description taken in conjunction with the accompanying Drawings in which:

FIG. 7A is a flow chart illustrating one embodiment of a scanning process that may be performed using aspects of the present disclosure;

FIG. 7B is a flow chart illustrating one embodiment of a method for setting a scanning speed in the analog front end circuitry of FIG. 5B;

FIG. 12B is a table illustrating one embodiment of control bits that may be used to set the resistance of a variable resistance path;

FIG. 12C is a table illustrating one embodiment of resistance values corresponding to the control bits of FIG. 12B;

DETAILED DESCRIPTION

Figure 1A:
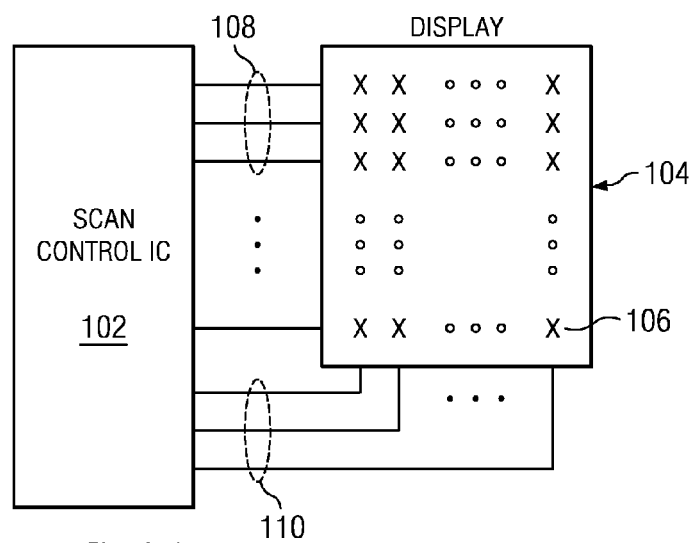
FIG. 1A illustrates an overall diagram of a scan control IC interface with a touch screen.

Referring now to the drawings, wherein like reference numbers are used herein to designate like elements throughout, the various views and embodiments of a capacitive touch sensor are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to FIG. 1A, there is illustrated a diagrammatic view of a scan control IC 102 that is interfaced with a touch screen 104 that can be used by itself or in conjunction with a display as an overlay. The touch screen 104 is a touch screen having a plurality of distributed capacitors 401 disposed at intersections of columns and rows. There are a plurality of rows 108 and a plurality of columns 110 interfaced with the scan control IC. Thus, a row line will be disposed across each row which intersects with a column line on the touch screen surface and these are interfaced with the scan control IC 102. It should be understood that a capacitive touch pad refers to an area on the touch screen, but will be used to refer to an intersection between a row line and a column line. The term "touch pad" and "intersection" shall be used interchangeably throughout.

As will be described herein below, the self capacitance of a particular row or a particular column in one mode is evaluated by determining the capacitance that is associated with a particular row or column line, this being an external capacitance. Any change to this capacitance will be sensed and evaluated, this change being due to such things as a finger touching an area of the touch screen 104. By sensing both the row and the column lines and determining the self capacitance associated therewith, the particular capacitive touch pad 106 (or area of the touch screen) touched can be determined which will be indicated by an increase in capacitance on a row and a column line (for a single touch). In another mode, mutual capacitance between the intersection of a row and a column is determined.

Figure 1B:
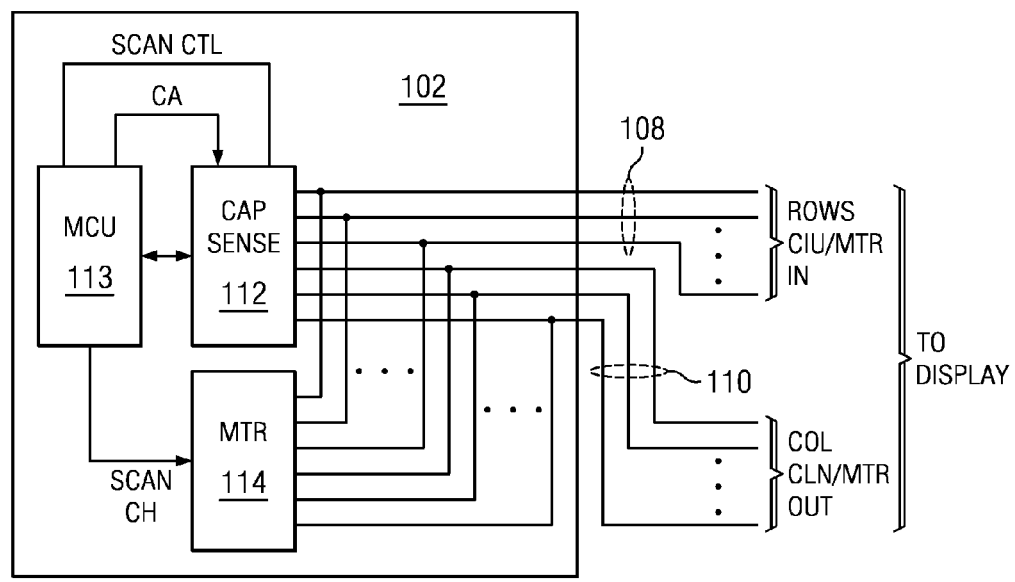
FIG. 1B illustrates a more detailed diagram of the scan control IC illustrating the two scan functions.

Referring now to FIG. 1B, there is illustrated a more detailed diagrammatic view of the scan control IC 102. In determining a change in capacitance at a particular for a particular row or column line, there can be multiple techniques utilized. The first technique is to merely sense the value of the self capacitance for all or a select one or ones of the row or column lines and then utilize some type of algorithm to determine if the capacitance value has changed and then where that change occurred, i.e., at what intersection of row and column lines. The scan control IC 102 provides this functionality with a capacitive sense block 112. This block 112 just determines if a change has occurred in the self capacitance value of the particular row or column line to ground. Another technique is that referred to as a "multi-touch resolve" (MTR) functionality provided by a functional block 114. This is for sensing changes in the mutual capacitance at the intersection of a row and column line. The cap sense block 112 is basically controlled to scan row and column lines and determine the self capacitance thereof to ground. If a change in the self capacitance occurs, this indicates that some external perturbance has occurred, such as a touch. By evaluating the self capacitance values of each of the rows and columns and compare them with previously determined values, a determination can be made as to where on the touch screen a touch has been made. However, if multiple touches on the touch screen have occurred, this can create an ambiguity. The MTR module 114, as will be described in more detail herein below, operates to selectively generate a pulse or signal on each of the column lines and then monitor all the row lines to determine the coupling from the column line to each of the row lines. This provides a higher degree of accuracy in determining exactly which intersection of a particular row and column was touched. Each of the row lines is monitored to determine the value of signal coupled across the intersection with the column line being driven by the pulse or signal. Thus, if a pulse or any type of signal is generated on a particular column line, for example, it will be most strongly coupled across the intersection between that column line and a row line having a finger disposed across the particular intersection since this particular intersection will exhibit the highest change in mutual capacitance. In general, the capacitance across the intersection between row and column line will actually decrease when a finger is disposed in close proximity thereto. It should be understood that the pulse could be generated on row lines and the column lines sensed, as opposed to the illustrated embodiment wherein the pulse is generated on the column lines and then the row lines sensed. It is noted that for each generation of a pulse, the row lines are monitored at substantially the same time. This could be facilitated with dedicated analog-to-digital converters for each row/column line or a multiplexed bank of such. Such systems are disclosed in U.S. Patent Publication No. 2009-273570, entitled MULTI-TOUCH SENSOR PATTERNS AND STACK-UPS, filed Sep. 30, 2008 and U.S. Patent Publication No. 2009-0273579, entitled MULTI-TOUCH DETECTION, filed Apr. 30, 2009, both of which are incorporated herein by reference in their entireties.

Figure 1C:
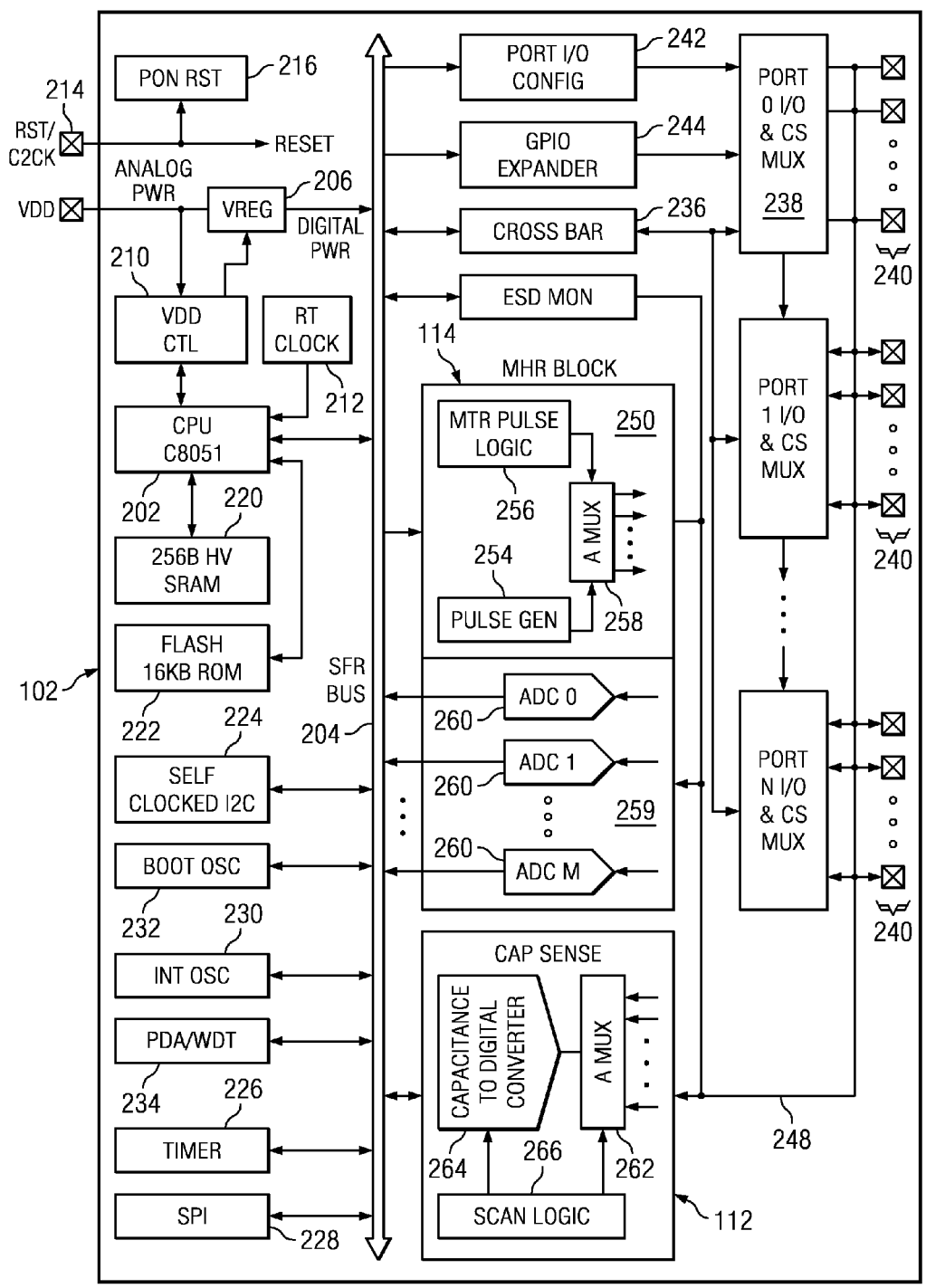
FIG. 1C illustrates a more detailed diagram of the logic of the scan control IC.

Referring now to FIG. 1C, there is illustrated a more detailed block diagram of the scan control IC 102. At the heart of the scan control IC 102 is an 8051 central processing unit (CPU) 202. The scan control IC 102 is basically a microcontroller unit (MCU) which is described in detail in U.S. Pat. No. 7,171,542, issued Jan. 30, 2007 to the present assignee and entitled RECONFIGURABLE INTERFACE FOR COUPLING FUNCTIONAL INPUT/OUTPUT BLOCKS TO LIMITED NUMBER OF I/O PINS, which is incorporated herein by reference in its entirety. This is a conventional MCU that utilizes an 8051 core processor, flash ROM and various configurable ports that are configured with a cross bar switch. The CPU 202 interfaces with a special function register (SFR) bus 204 to allow interface between the CPU domain and that of the internal resources. The CPU 202 is powered with a digital voltage that is provided by a regulator 206 that receives power from an external $V_{DD}$ source to power the digital circuitry on the chip. Analog power is provided at the $V_{DD}$ level which has a wider range, as this can sometimes be supplied by a battery. The regulator 206 is controlled with a $V_{DD}$ controller 210. A real time clock 212 is provided to allow the CPU to operate in a sleep mode with the clock 212 being activated. This is described in detail in U.S. Pat. No. 7,343,504, issued Mar. 11, 2008, entitled MICROCONTROLLER UNIT (MCU) WITH RTC, which is incorporated herein by reference in its entirety A RST/C2CK pin 214 provides a reset pulse and also provides the ability to communicate with the chip on a two-wire communication protocol with a clock and a data line. It provides a multi-function input of either the reset or the communication channel. This is interfaced with a power on reset block 216 for the reset mode. The CPU 202 has SRAM 220 associated therewith and the overall chip has associated therewith a block of flash ROM 222 to allow for storage of instructions and configuration information and the such to control the overall operation of the chip and provide the user with the flexibility of programming different functionalities therefor.

There are a plurality of resources that are associated with the chip, such as an I²C two-wire serial bus provided by a function block 224, timer functionality provided by block 226, a serial peripheral interface functionality provided by block 228, etc. These are described in detail in U.S. Pat. No. 7,171,542, which was incorporated herein by reference. There is provided a timing block 230 that provides the various clock functions that can be provided by internal oscillator, an external oscillator, etc. A boot oscillator 232 is provided for the boot operation and a PDA/WDT functionalities provided by block 234.

The SFR bus is interfaced through various internal resources to a plurality of output pins. Although not described in detail herein, a cross bar switch 236 determines the configuration of the I/O pins to basically "map" resources onto these pins. However, this cross bar functionality has been illustrated as a simple block that interfaces with a plurality of port I/O blocks 238 labeled port 0, port 1 . . . port N. Each of these port I/O blocks 238 interfaces with a plurality of associated output pins 240 and each is operable to selectively function as a digital input/output port such that a digital value can drive the output pin or a digital value can be received therefrom. Alternatively, each of the output pins can be configured to be an analog pin to output an analog voltage thereto or receive an analog voltage therefrom. Each of the ports is configured with a port I/O configuration block 242 that configures a particular port and a particular output therefrom as either a digital I/O or as an analog port. A GPIO expander block 244 controls the operation of each of the ports. All of the output pins are illustrated as being connected to an analog bus 248. The configuration of the analog bus 248 illustrates this as a common single line but in actuality, this is a bus of multiple lines such that each individual port can be selectively input to a particular multiplexer or a particular analog input/output function block, as will be described herein below.

The MTR block 114 is illustrated as having associated therewith two functionalities, one functionality is provided by an upper block 250 and this provides the pulse logic for generating a pulse. This requires a pulse generator 254 and pulse scanning logic 256. An analog multiplexer 258 selectively outputs the pulse from the pulse generator 254 to a selectively mapped port through the analog bus 248. The pulse scanning logic 256 determines which port is selected by the multiplexer 258. A lower functional block 259 of the MTR block 114 provides a plurality of analog-to-digital converters (ADC) 260, each for interface with an associated one of the MTR-CDC in designated pins that represents an input from one of the column lines or one of the row lines, depending upon which is the sensed side of the MTR function. Even though a plurality of dedicated ADCs 260 are provided, it should be understood that a lower number of ADCs could be utilized and the function thereof multiplexed.

The cap sense function is provided by the block 112 and this is comprised of an analog multiplexer 262 which is interfaced to a ADC 264 for selectively processing the selected column or row input received from the multiplexer 262. A scan logic block 266 provides the scanning control of the multiplexer 262. Thus, in one mode when the cap sense block 112 is utilized, the analog multiplexer 262 will select respective ones of the column and rows from the touch screen 104 for sensing the external capacitance thereon to determine if a change in the associated self capacitance has occurred. In a second mode, the MTR block 114 will be utilized to make a determination as to which of a row and column lines was actually touched in order to resolve any ambiguities when multiple touches on the screen occur. Further, as will be described herein below, it is possible to scan only a portion of the touch screen 104 in any one of the two modes. As will also be described herein below, the scan control IC 102 can be operated in conjunction with various power saving modes. These are referred to as "sleep" modes wherein the digital circuitry is essentially powered off and, at certain times, the chip is powered up and a scan completed. The scans can be a "fast" scan or a "slow" scan to vary the accuracy of the scan and, to further conserve power by reducing scan time, only a portion of the touch screen need be scanned, this portion defined by a determination in a fast scan mode that a certain portion of the touch screen indicates a touch which, thereafter, only requires a higher accuracy scan of that portion or, in an alternative embodiment, an application may only require that a certain portion of the touch screen be scanned. By limiting the area which is scanned, power can be conserved by only operating the digital section of the scan control IC 102 for that period of time, after which the digital section of the chip is placed back in a sleep mode of operation. The sleep mode of operation is described in U.S. Pat. No. 7,504,902, issued Mar. 3, 2009 and entitled PRECISION OSCILLATOR HAVING LINBUS CAPABILITIES, which is incorporated herein by reference in its entirety.

Figure 2:
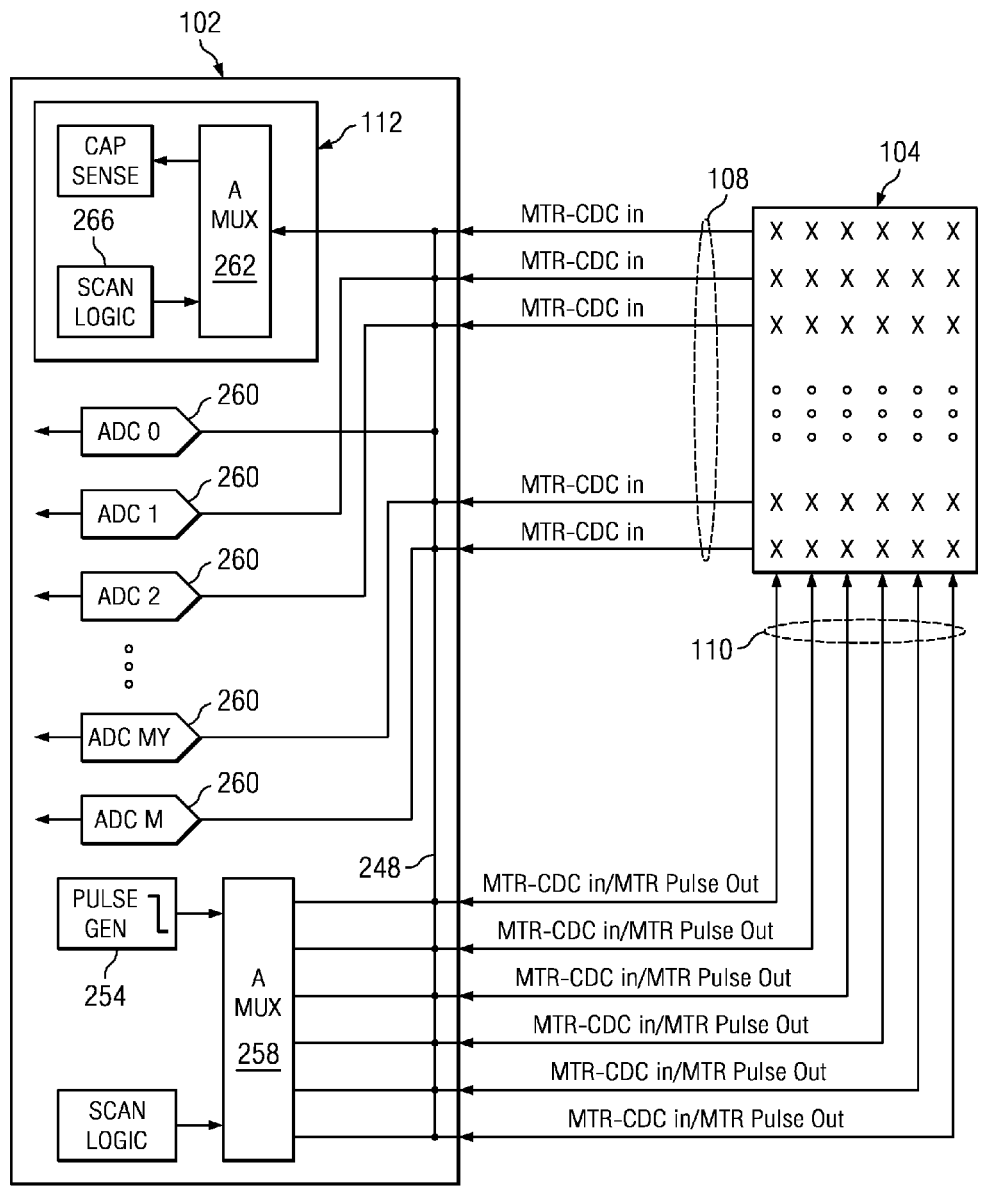
FIG. 2 illustrates a diagrammatic view of the scan control IC interface with a touch screen and the port mapping functions.

Referring now to FIG. 2, there is illustrated a diagrammatic view of the scan control chip 102 interfaced with the touch screen 104 showing only the analog interface between the scan control logic for cap sense and MTR modes of operation. It can be seen that there are a plurality of pins that are associated with either the row lines 108 or the column lines 110. The analog line 248 (which was noted as being an analog bus) is interfaced with the cap sense block 112 via the multiplexer 262 to select each of the row and column lines in any combination for sensing the self capacitance associated therewith, or with the output of each of the ADCs 260 associated with each of the MTR CDC in inputs (for the rows in this example) to sense the analog value thereof. Alternatively, each of the column lines 110 in this embodiment can be accessed with the pulse generator 254 in the MTR mode via the analog line (bus) 248. Therefore, there will be two modes of operation, one being for the MTR mode wherein a pulse or any kind of signal is generated on a particular columns (or rows) and then sensed on each of the row (or column) to determine the mutual capacitance therebetween and a second mode to determine the self capacitance of each of the row or column lines. Therefore, since each of the pins that can be associated with the touch screen 104 has the ability to function as an analog port to the chip, an analog signal can be output therefrom or received thereon and interfaced with the respective one of the capacitive sense block 112 or the MTR block 114.

Figure 2A:
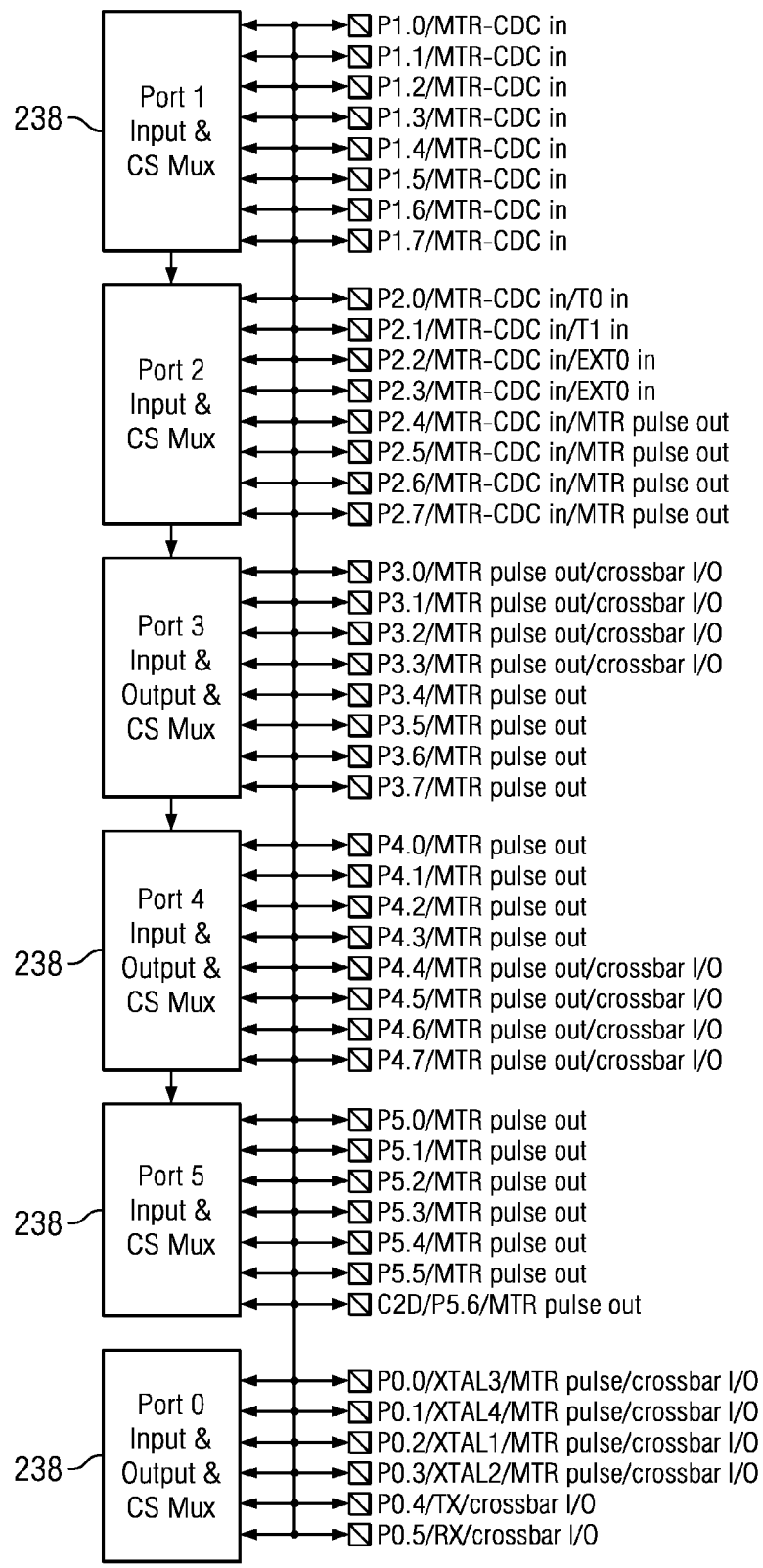
FIG. 2A illustrates a diagrammatic view of the port mapping functions.

Referring now to FIG. 2A, there is illustrated a detail of the port blocks 238 which illustrate the mapping thereto in one embodiment, this embodiment for scanning touch screens. There are illustrated six port blocks 238 which have the mapping defined typically by the cross bar switch and the analog connections. The cross bar is operable to define the digital interface between various functional blocks and the output pads 240. In this configuration, there are provided 16 MTR-CDC in pins and 31 MTR pulse out connections. This provides for essentially 31 rows and 16 columns, it being noted that the pulse can be input to either the rows or the columns with the sensing being done respectively, on either the columns or rows. All of the pulse out connections are able to be sensed by the cap sense functionality. Thus, the MTR-CDC in constitute the columns and the MTR pulse out connections provide the rows for the touch screen. It can be seen that the block 238 for port 1 services the MTR-CDC in exclusively whereas all of the pins associated with port 2 provide the same functionality. In addition, some of the port 2 output pins have a GPIO function, two of them being timer inputs and two of them being ext0 inputs. Four of the output pins associated with port 2 are associated with both the input and the pulse out functions of the MTR. For port 3, it can be seen that four pins are mapped to the cross bar I/O for a digital functionality as well as four of the pins on port 4. Substantially all of the pins associated with port 5 are associated with the MTR pulse outputs. A number of the port 0 outputs are associated with a crystal functionality and two are associated with the transmit/receive functionality for a serial port interface and various ones are associated with the cross bar inputs/outputs. It should be understood that the crossbar switch can be configured to map the outputs of multiple functional blocks within the IC 102 (internal resources) to the input/output pins and the various analog outputs/inputs of the pins can be interfaced with the two functional blocks 112 and 114 for sensing the capacitive value of the touch screen.

Figure 3:
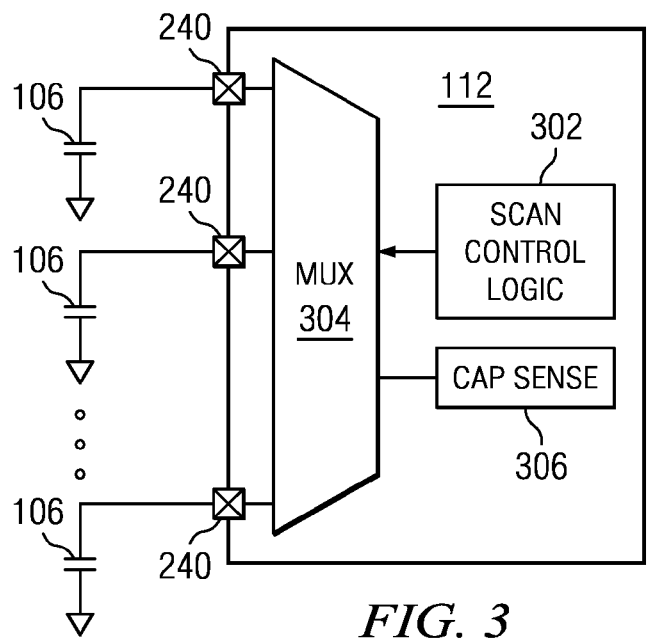
FIG. 3 is an upper level block diagram of one embodiment of an integrated circuit containing controller functionality coupled to the capacitive array of FIG. 1 via a multiplexer.

Referring to FIG. 3, there is illustrated one embodiment of a block diagram of the cap sense block 112 of FIG. 1. In the present example, the interface between the block 112 and the row lines or column lines (FIG. 1) are illustrated and these are referred to, for simplicity purposes, as "capacitive touch pads." More specifically, the block 112 interfaces with the plurality of row or column lines (noted in the drawing as capacitive touch pads 106) that are each interfaced with the block 112 through respective external row lines 108 or column lines 110. The touch pads 106 are typically arranged in rows and columns and the illustrated touch pad 106 represents the self capacitance of one or a plurality of row lines or column lines. The capacitive touch pads 106 can be stand alone elements or they can be part of a capacitive sensor array, such as the touch screen 104 previously described. Although not illustrated, the block 112 also interfaces with columns on dedicated column pins (not shown).

The block 112 includes a multiplexer 304 that is operable to select one of the pins 240 and one plate of an associated capacitive touch pad 106 (or row line) for input to a capacitive sense block 306. The capacitive sense block 306 is operable to determine the value of the self capacitance for the row line (column line) associated with the selected pin 240. This will then allow a determination to be made as to the value of the self capacitance, which will be referred to as the capacitance associated with an "external capacitance switch," (or row of switches) this value being the sum of the value of the associated capacitive touch pad(s) 106 attached to a given pin 240 and any parasitic capacitance such as may result from a finger touch, external interference, etc. (In actuality, all that is attached to a pin 240 is a row or column line but, as set forth hereinabove, a touch screen array of row and column lines that overlap will be referred to as an array of "switches.") The information as to the self capacitance value of the external capacitance switch is then passed on to the MCU 113 for the purpose of determining changes in the capacitance value as compared to previous values, etc., with the use of executable instructions and methods. The multiplexer 304 is controlled by scan control logic 302 to sequentially scan the pins 240 from a beginning pin 240 and an end pin 240. This can be programmable through an SFR or it can be hardwired in combinational logic. One example of an application of such is described in previously incorporated U.S. patent application Ser. No. 12/146,349, filed on Jun. 25, 2008, entitled "LCD CONTROLLER CHIP."

In general, one application would be to individually sense the static value of the self capacitance each of the row or column lines at each of the pins 240 at any given time and continually scan all or a portion of these row or column lines to determine if a change in self capacitance has occurred, i.e., whether the value of the self capacitance has changed by more than a certain delta. If so, with the use of a predetermined algorithm, a decision can be made as to whether this constitutes a finger touch or external interference. However, the capacitive sense block 112 is primarily operable to determine the self capacitance value of the row or column line connected to a pin 240 and then, possibly, provide some hardware control for accumulating the particular values and comparing them with prior values for generating an interrupt to the MCU 113. However, the first object of the capacitive sense block 112 is to determine the self capacitance value of the row or column line connected to a particular pin 240 being scanned at any particular time.

Figure 4A:
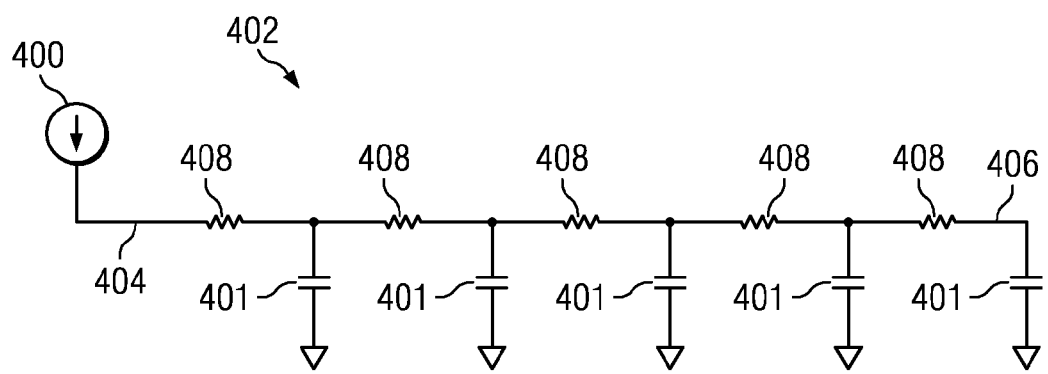
FIG. 4A is a diagram of one embodiment of an idealized transmission line that may form a row in the capacitive array of FIG. 1.

Referring to FIG. 4A, there is illustrated one embodiment of an idealized transmission line 402 coupled to a current source 400 via a row pin 204. The transmission line 402 represents a single column or row line such as may be part of, for example, a touch screen such as may be formed by the touch screen 104. The transmission line 402 may be viewed as a distributed capacitance comprised of a plurality of distributed capacitors 401 representing the row-to-ground capacitance or the column-to-ground capacitance by the capacitive sense block 306 of FIG. 3, with each of the distributed capacitors 401 contributing to the overall capacitance of the transmission line. For purposes of example, the transmission line 402 is shown with the distributed capacitors 401 extending from a near end 404 of the transmission line 402 to a far end (or terminal end) 406 and referred to ground. As illustrated, this places the distributed capacitors 401 so that some of the distributed capacitors 401 are located closer to the near end 404 and others are located closer to the far end 406. This illustrates the distributed capacitance along the column/row line. The transmission line 402 also consists of a distributed resistance represented by resistors 408 disposed thereon distributed capacitors 401. It is understood that the transmission line 402 may be formed in many different ways and that FIG. 4A is provided only for purposes of illustration.

In the present example, the transmission line 402 is a metallic strip formed of a semi-transparent conductor made of indium tin oxide (InSnO) or another suitable material. As is known, InSnO is conductive but highly resistive and the transmission line 402 may have a distributed resistance in the range of one to one hundred kilohms (1-100 k ohms). In touch screens, the metallic strip forming the transmission line 402 is typically relatively wide, which will typically increase the capacitance and reduce the sheet resistance. The distributed resistance and capacitance of the transmission line 402 provide the line with a high time constant and create an RC filter that prevents changes in the distributed capacitors 401 near the terminal end 406 from being fully sensed by the capacitive sense block 306 that is coupled to the near end 404. Not only do the distributed capacitors 401 at the terminal end 406 take longer to charge, but the distributed resistance in the transmission line 402 between the far end distributed capacitors 401 and the near end attenuates the impact of those distributed capacitors 401 on the capacitance sensed by the capacitive sense block 306. In other words, the farther a distributed capacitor 401 is located from the near end 404, the more attenuated its input to the overall capacitance of the transmission line 402 as sensed by the capacitive sense block 306. This also means that the distributed capacitor 401 at the far end 406 defines the resolution of the transmission line 402, as its input is the smallest input into the total capacitance.

Figure 4B:
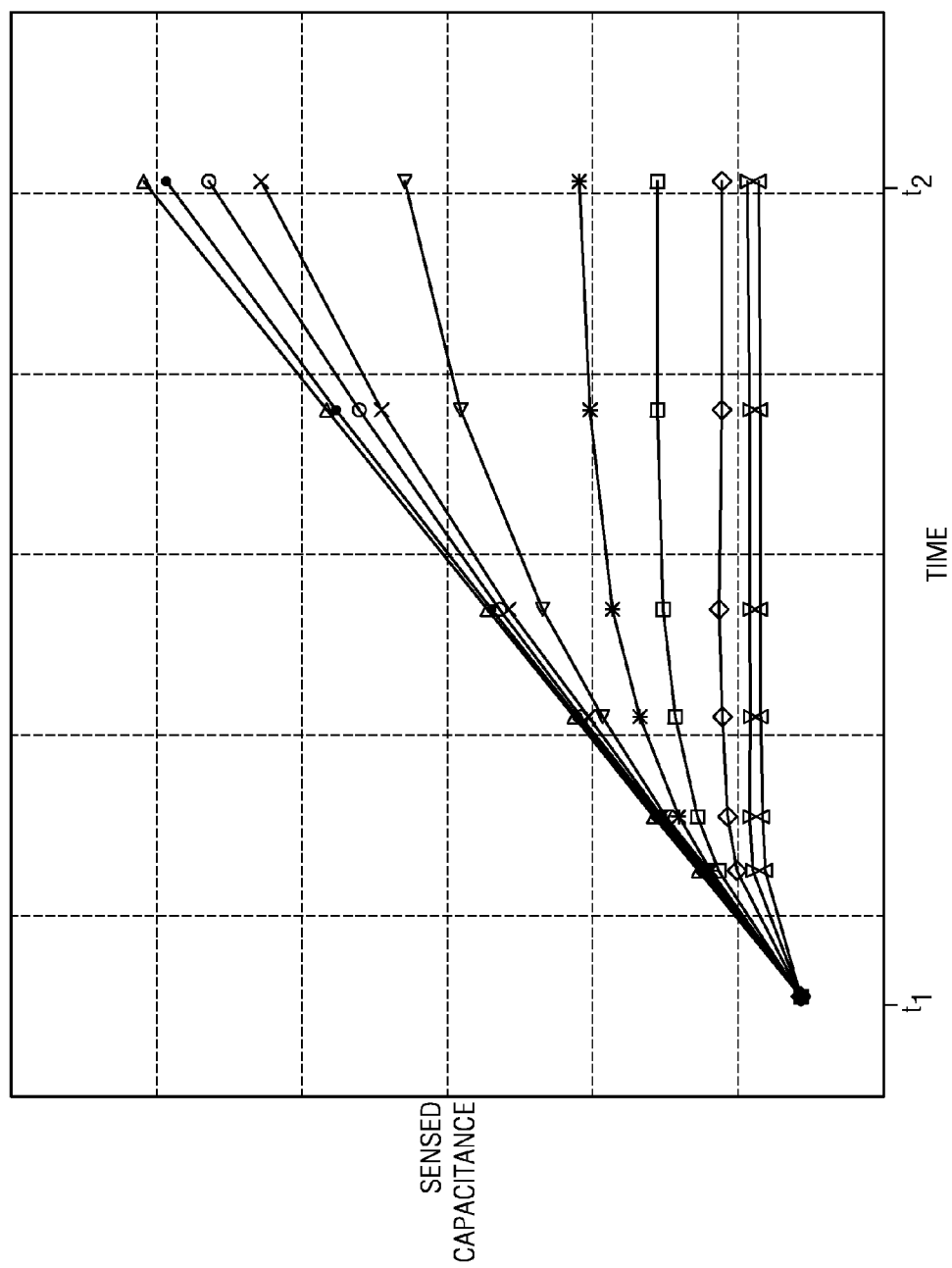
FIG. 4B is a graph illustrating changes in sensed capacitance as resistance increases along the transmission line of FIG. 4A.

Referring to FIG. 4B, there is illustrated a graphical representation 410 of sensed capacitance (y-axis) over charge time (x-axis) for varying levels of resistance from zero to one hundred kilohms (1-100 kΩ) over the transmission line 402 of FIG. 4A. As can be seen in FIG. 4B, with a resistance of zero kilohms, the capacitance change in the distributed capacitor 401 between times $t_1$ and $t_2$ is substantially linear and represents a relatively large increase in capacitance. This change can be easily sensed and means that the corresponding distributed capacitor 401 has a large contribution to the overall capacitance measurement of the transmission line 402 as sensed by the capacitive sense block 306. This also means that the distributed capacitor 401 can be sensed quickly, as relatively small levels of change in capacitance can be detected due to the rapid increase in capacitance caused by even a relatively small change. For purposes of illustration, the distributed capacitor 401 having the lowest resistance in a series therewith will likely be at the near end 404 of the transmission line 402.

However, as the amount of series resistance (and therefore attenuation) increases, it becomes more difficult to detect capacitance changes in a distal portion of a row/column line and more time is needed to allow the most distal distributed capacitor 401 to fully charge in order for the voltage thereacross to be reflected in the voltage at the near end in order to detect the change in capacitance on that capacitor. For example, in the worst case of one hundred kilohms, and a fast ramp rate where the far end distributed capacitor has not been allowed sufficient time to charge, the change in capacitance that is sensed by the capacitive sense block 306 is small (relative to the case of zero resistance) since the voltage contribution of the most distal distributed capacitor 401 to the overall voltage at the near end 404 is minor.

By way of further explanation of the attenuation concept, the current source 400 is controlled to charge the column or row line for a predetermined amount of time. For quick sensing, this time is shortened and for higher resolution sensing, this time is lengthened. Typically, as will be described herein below, the current is varied to drive the transmission line until the voltage reaches a predetermined threshold. The time for reaching this threshold is a set time and the current in current source 400 is adjusted such that the voltage on the top of the transmission line, i.e., at pin 240, will ramp-up and reach the threshold voltage at a fixed time. Therefore, for quick sensing, the time period for this quick sensing and the short time period, what will happen is that the RC time constant for each distributed capacitor 401 will be such that the distributed capacitor 401 is not fully charged, i.e., there will be voltage across the resistance in series with the current source 400. This current is flowing through all the resistors, with the distributed capacitor 401 at the terminal end 406 having the larger series resistance and, hence, the voltage across the series resistance of all of the resistors 408 will be higher. For example, if the time period were such that the distributed capacitor 401 at the near end charged up only to 80% of its value at the end of the fixed time period, any change in the capacitance thereof would only result in an 80% change in the voltage at the top end of the transmission line, i.e., any change in the capacitance value of the first capacitance would result in the voltage across the distributed capacitor 401 and the voltage at the top end being attenuated by 20%. Consider then that the voltage across the distributed capacitor 401 at the terminal end is only 10% of the value at the top end of the transmission line. This means that any change in the capacitance of a distributed capacitor 401 at the terminal end would be 90% attenuated relative to the voltage level at the top of the transmission line. Therefore, a 10% change in the distributed capacitor 401 at the tail end compared to that at the near end would be different. Thus, to have an accurate measurement of the capacitance and any change thereto, it would be desirable to allow all the distributed capacitors 401 to fully charge before making a determination as to the value thereof. Thus, by examining the voltage at the top end of the transmission line, small changes in the capacitance value of the distributed capacitor 401 at the tail end will be difficult to detect when the rate of the ramp is fast and full charging is not possible due to the distributed series resistance, but gross changes can be detectable. Once a gross change is detected, then the fixed time can be reset for the ramp rate such that the current source 400 operates for a longer period of time allowing all the distributed capacitors 401 to more fully charge.

Accordingly, there is a tradeoff between sensing speed and sensing resolution when considering how rapidly to sense the capacitance value of the distributed capacitor 401 provided by the transmission line 402. Sensing the capacitance value at a high enough resolution to detect changes in the far end distributed capacitor 401 needs each of the distributed capacitors 401 along the transmission line 402 to be more fully charged, which requires enough time for the distributed capacitor 401 at the far end 406 to fully charge. However, sensing at an increased speed needs the charging times to be as short as possible in order to scan the columns and rows quickly, which means that some of the distributed capacitors 401 may not have time to fully charge. It may be difficult to sense changes in capacitance if some of the distributed capacitors 401 do not fully charge, particularly when their input is already attenuated due to resistance in the transmission line 402. Therefore, it may be desirable to be able to control the charge time of such distributed capacitors 401 in order to achieve a balance between sensing speed and resolution. This balance may be further adjusted in response to sensed input, with changes in sensing speed and accuracy being made to adapt to input in real time. For purposes of convenience, the present disclosure may refer to either sensing speed and sensing resolution or may refer to sensing speed/resolution and it is understood that they are simply ways to view the same balance issue from different sides. For example, a user interested in sensing resolution may select a speed that provides that resolution in the same manner that the user may select the resolution itself.

Figure 5A:
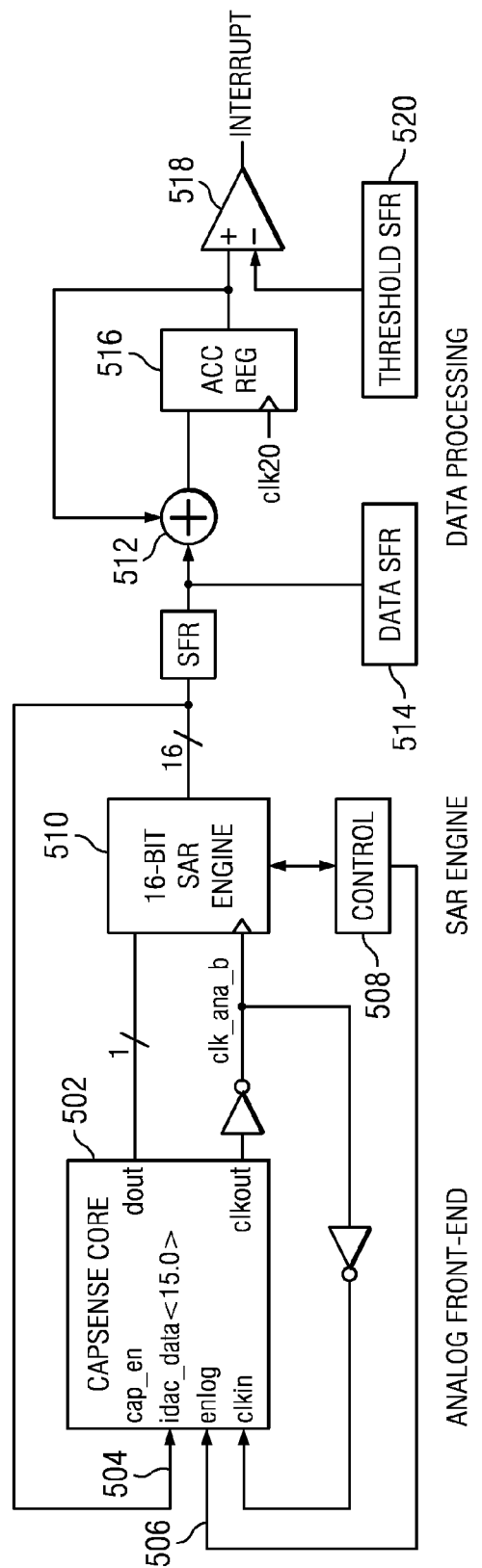
FIG. 5A is a functional block diagram of one embodiment of capacitive touch sense circuitry that may be used to detect capacitance changes in the capacitive array of FIG. 1.
Figure 5B:
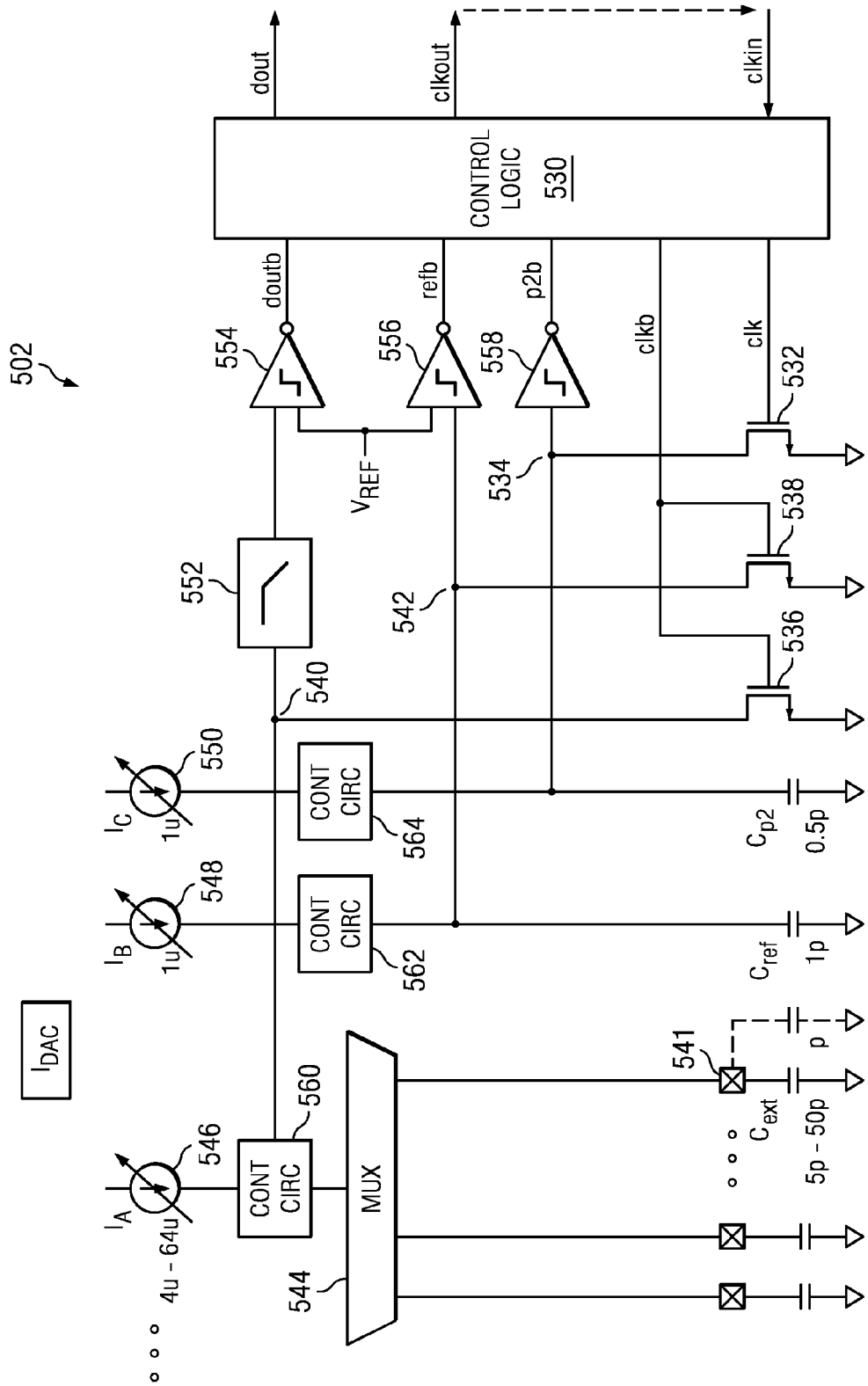
FIG. 5B illustrates a block diagram of one embodiment of analog front end circuitry of the capacitive touch sense circuitry of FIG. 5A.

Referring now to FIGS. 5A and 5B, one embodiment of a functional block diagram of the capacitive touch sense block 306 is illustrated. The analog front end circuitry 502 shown in FIG. 5A is responsible for a connected external capacitance switch (a row or column line) for the purpose of determining the value of the self capacitance thereof. The analog front end circuitry 502 receives a 16-bit current control value which is provided to the input IDAC_DATA via input 504 for controlling a variable current source. This current is generated by a current digital-to-analog converter (IDAC), not shown. The analog front end also receives an enable signal at the input ENLOG 506 from a control circuit 508. The analog front end circuitry 502 additionally provides a clock signal. A 16-bit successive approximation register (SAR) engine 510 controls a first variable current source within the analog front end circuitry 502 that drives the external capacitance switch. The 16-bit SAR engine 510 changes a control value which defines a present value of a variable current $I_A$ that drives an external capacitor $C_{EXT}$ (as seen in FIG. 5B) on a selected one of the output pads 541. This selection is made by multiplexer 544, and the capacitor $C_{EXT}$ corresponds to self capacitance of the respective row or column line in combination with any parasitic capacitance of the row or column line. The current source generating the current $I_A$ that drives the selected external capacitor $C_{EXT}$ from current source 546 will cause a voltage to be generated on that external capacitor $C_{EXT}$ that is compared to the voltage across an internal reference capacitor $C_{REF}$ (as shown in FIG. 5B). This capacitor $C_{REF}$ is an internal capacitor and the current provided thereto from an internal current source is a constant current for a given capacitance measurement. The currents $I_A$ and $I_B$ may be further configurable via respective current control circuitry 560 and 562 to vary the current (seen in FIG. 5B), as will be described below.

Both capacitors, the selected capacitor $C_{EXT}$ and the reference capacitor $C_{REF}$, are initialized at a predetermined point and the currents driven thereto allow the voltages on the capacitors $C_{EXT}$ and $C_{REF}$ to ramp-up at the rate determined by the respective capacitance value and the current provided by the respective current sources and current control circuitry that provide driving current thereto. By comparing the ramp voltages and the ramp rates, a relative value of the two currents can be determined. This is facilitated by setting a digital value to the IDAC and determining if the ramp rates are substantially equal. If the capacitors $C_{EXT}$ and $C_{REF}$ were identical, then the two ramp rates would be substantially identical when the current driving capacitors $C_{EXT}$ and $C_{REF}$ are substantially identical. If the capacitor $C_{EXT}$ is larger, this would require more current to derive a ramp rate that is substantially identical to the capacitor $C_{REF}$. Once the SAR algorithm is complete, the 16-bit value "represents" the capacitance value of the external capacitor on the external node, i.e., the self capacitance of the row or column line.

The current source control value for variable current source 546 is also provided to an adder block 512. The control value establishing the necessary controlled current is stored within a data Special Function Register (SFR) 514 representing the capacitive value of the external capacitance switch. This SFR 514 is a register that allows for a data interface to the CPU 202. Second, an input may be provided to an accumulation register 516 for the purpose of determining that a touch has been sensed on the presently monitored external capacitor switch of the touch screen. Multiple accumulations are used to confirm a touch of the switch, depending upon the particular algorithm utilized. The output of the accumulation register 516 is applied to the positive input of a comparator 518 which compares the provided value with a value from a threshold SFR register 520. When a selected number of repeated detections of activations, i.e., changes, of the associated self capacitance for a given row/column line have been detected, the comparator 518 generates an interrupt to the CPU 202. The output of the accumulation register 516 is also provided to the adder block 512.

Referring now specifically to FIG. 5B, there is illustrated a more detailed diagram of the analog front end circuitry 502. The analog front end circuitry 502 includes control logic 530 that provides an output $d_{out}$ that is provided to the successive approximation register engine 510 and the output clock "clk_out." $d_{out}$ indicates a condition indicating that the ramp voltage on $C_{EXT}$ was faster than the ramp voltage across $C_{REF}$, this indicating that the SAR bit being tested needs to be reset to "zero." The logic 530 receives an input clock signal "clkn" and provides an output clock signal "clk" and an output clock signal "clkb" (clock bar) to a series of transistors.

The output "clk" is provided to a first n-channel transistor 532. The drain/source path of transistor 532 is connected between node 534 and ground. The gate of transistor 532 is connected to receive the "clk" signal. The gates of transistors 536 and 538 are connected to the clock bar signal "clkb." The drain/source path of transistor 536 is connected between node 540 and ground, node 540 being connected to an output pad 541 (similar to pin 240) via multiplexer 544. The drain/source path of transistor 538 is connected between node 542 and ground.

The transistors 536, 538 and 532 act as discharge switches for capacitors $C_{EXT}$, $C_{REF}$ and $C_{P2}$, respectively. Capacitor $C_{EXT}$ is coupled between the associated output of multiplexer 544 and ground. Capacitor $C_{REF}$ is connected between internal node 542 and ground. Capacitor $C_{P2}$ is connected between internal node 534 and ground. The capacitor $C_{EXT}$ represents the self capacitance of the selected capacitor touch pad 106 of the touch screen 104 and is variable in value, this $C_{EXT}$ representing the self capacitance of a given row or column line. For example, the capacitive value thereof can change based upon whether the associated capacitor touch pad 106 is being actuated by the finger of the user or not. The multiplexer 544 or other switching circuitry is utilized to connect other external capacitance switches (row or column lines) within the touch screen 104 to node 540 to determine their self capacitance values.

The variable current source 546 provides a current input to node 540. The variable current source 546 (an IDAC) is under the control of a 16-bit data control value that is provided from the successive approximation register engine 510. The current source 546 is used for charging the capacitor $C_{EXT}$ when transistor 536 is off, this providing a "ramp" voltage since current source 546 provides a constant current $I_A$. The current $I_A$ is further programmable via current control circuitry 560 (described in greater detail below with respect to FIG. 6A) that enables the current $I_A$ to be modified in order to change the nominal charge time of the capacitor $C_{EXT}$, i.e., a coarse adjustment. When transistor 536 is conducting, the charging current and the voltage on capacitor $C_{EXT}$ are shorted to ground, thus discharging $C_{EXT}$.

The current source 548 provides a constant charging current $I_B$ into node 542. This charging current provides a charging source for capacitor $C_{REF}$ when transistor 538 is off to generate a "ramp" voltage, and the current $I_B$ is sunk to ground when transistor 538 is conducting, thus discharging capacitor $C_{REF}$. The current $I_B$ is variable to provide a fine adjustment and programmable via current control circuitry 562 (described in greater detail below with respect to FIG. 6B) to provide a coarse adjustment that enables the current $I_B$ to be modified in order to change the charge time of the capacitor $C_{REF}$, i.e., a coarse adjustment during a capacitance value determining step.

Likewise, current source 550 provides a constant charging current $I_C$ to node 534. This current source 550 is used for charging capacitor $C_{P1}$ to generate a "ramp" voltage when transistor 532 is off, and $I_C$ is sunk to ground when transistor 532 is conducting, thus discharging capacitor $C_{P2}$. The current $I_C$ may be variable to provide a fine adjustment and programmable via current control circuitry 564 (described in greater detail below with respect to FIG. 6C) to provide a coarse adjustment that enables the current $I_C$ to be modified in order to change the discharge time of the capacitor $C_{P2}$.

Connected to node 540 is a low pass filter 552. The low pass filter 552 is used for filtering out high frequency interference created at the self capacitance ($C_{EXT}$) of the given row/column line in the touch screen 104. The output of the low pass filter 552 is connected to the input of a comparator 554. The comparator 554 compares the ramp voltage at node 540 representing the charging voltage on capacitor $C_{EXT}$ to a threshold reference voltage $V_{REF}$ (not shown) and generates a negative pulse when the ramp voltage at node 540 crosses the reference voltage $V_{REF}$. This is provided to the control logic 530 as signal "doutb." Similarly, a comparator 556 compares the ramp voltage of the fixed capacitance $C_{REF}$ at node 542 with the threshold reference voltage $V_{REF}$ and generates an output negative pulse "refb" when the voltage at node 542 crosses the threshold reference voltage $V_{REF}$. Finally, the comparator 558 compares the ramp voltage at node 534 comprising the charge voltage on capacitor $C_{P2}$ with the threshold reference voltage $V_{REF}$ and generates an output responsive thereto as signal "p2b" when the ramp voltage at node 534 exceeds the threshold reference voltage.

In basic operation, the circuit in FIG. 5B operates by initially resetting the voltage on capacitors $C_{EXT}$ and $C_{REF}$ to zero by turning on transistors 536 and 538. This causes the voltage on capacitors $C_{EXT}$ and $C_{REF}$ to discharge to ground. The transistors 536 and 538 are then turned off, and the voltage on capacitors $C_{EXT}$ and $C_{REF}$ begins to ramp up toward the reference voltage $V_{REF}$ responsive to the current output of the respective current sources 546 and 548. If the voltage across capacitor $C_{EXT}$ reaches the threshold voltage $V_{REF}$ prior to the voltage across capacitor $C_{REF}$ reaching the threshold voltage, this trips the output of comparator 554 to provide a negative pulse and this information is provided from the control logic 530 as output $d_{out}$ to the successive approximation register engine 510 to allow the SAR bit being tested to remain a "one," and a next value of the 16-bit control value for the current source 546 will be selected for testing when CREF crosses the threshold reference voltage level $V_{REF}$. Since the comparator 554 "tripped" before comparator 556, this indicates less current is needed for the next bit tested.

The control logic 530 generates the $d_{out}$ signal controlling the operation of setting bits of the 16-bit SAR control value by the successive approximation register engine 510 responsive to the output from comparator 554. The successive approximation register engine 510 initially sets a most significant bit of the 16-bit control value to "one" and the rest to "zero" to control the variable current source 546 to operate at one-half value. If the output of comparator 554 goes low prior to the output of comparator 556 going low, the $d_{out}$ signal provides an indication to the successive approximation register engine 510 to reset this bit to "zero" and set the next most significant bit to "one" for a next test of the 16-bit SAR control value. However, when the output of comparator 556 goes low prior to the output of comparator 554 going low, the bit being tested remains set to "one" and a next most significant bit is then tested. This process continues through each of the 16-bits of the 16-bit control value by the successive approximation register 510 engine responsive to the signal $d_{out}$ from the control logic 530 until the final value of the 16-bit control value to the variable current source 546 is determined.

The "clkb" output resets the voltages across $C_{EXT}$ and $C_{REF}$ by turning on transistors 536 and 538 to discharge the voltages on these capacitors, and the transistors 536 and 538 are turned off to enable recharging of capacitors $C_{EXT}$ and $C_{REF}$ using the provided respective variable current and the respective reference current, respectively. The voltages across the capacitors $C_{EXT}$ and $C_{REF}$ are again compared by comparators 554 and 556 to the threshold reference voltage $V_{REF}$. When the output of comparator 556 provides a negative output pulse prior to the output of comparator 554 this provides an indication to set an associated bit in the 16-bit control value to "one" as described above. The 16-bit control value that is being provided to the variable current source 546 will be stored when the SAR algorithm is complete at which point both voltages ramp-up at substantially the same rate. The current $I_A$ being provided by the variable current source 546 that is associated with the established 16-bit value, the fixed current $I_B$ of current source 548 and the fixed capacitance value $C_{REF}$ may be used to determine the value of the capacitance $C_{EXT}$ according to the equation $I_A/I_B \times C_{REF}$ using associated processing circuitry of the array controller. Even though the actual value of $C_{EXT}$ could be determined with this equation, this is not necessary in order to determine that the self capacitance value of the given row or column line has changed. For capacitive touch sensing, it is only necessary to determine a "delta" between a prior known self capacitance value of the given row or column line and a present value thereof. Thus, by repeatedly scanning all of the external capacitance switches in the capacitive sensor array and comparing a present value therefor with the prior value therefor, a determination can be made as to whether there is a change. Thus, it is only necessary to have a "normalized" value stored and then compare this pre-stored normalized value with a new normalized value. The actual value is not important but only the delta value is important.

By using similar circuitry to generate the ramp voltages and to compare the voltages at nodes 540 and 542, substantially all common mode errors within the circuitry are rejected. Only the filter 552 upsets the common mode balance between the circuits, but this is necessary to prevent high frequency interference from outside sources such as cell phones. The circuitry for measuring the voltages at the nodes provides a proportional balance between the internal reference voltage and the external capacitance voltage. Thus, errors within the comparators or the reference voltage $V_{REF}$ are not critical as they are the same in each circuit. It is noted that, for a given capacitance value determination slip, $C_{EXT}$ and the value of $I_B$ are constant, thus setting the maximum time for charging, i.e., the resolution.

Figure 5C:
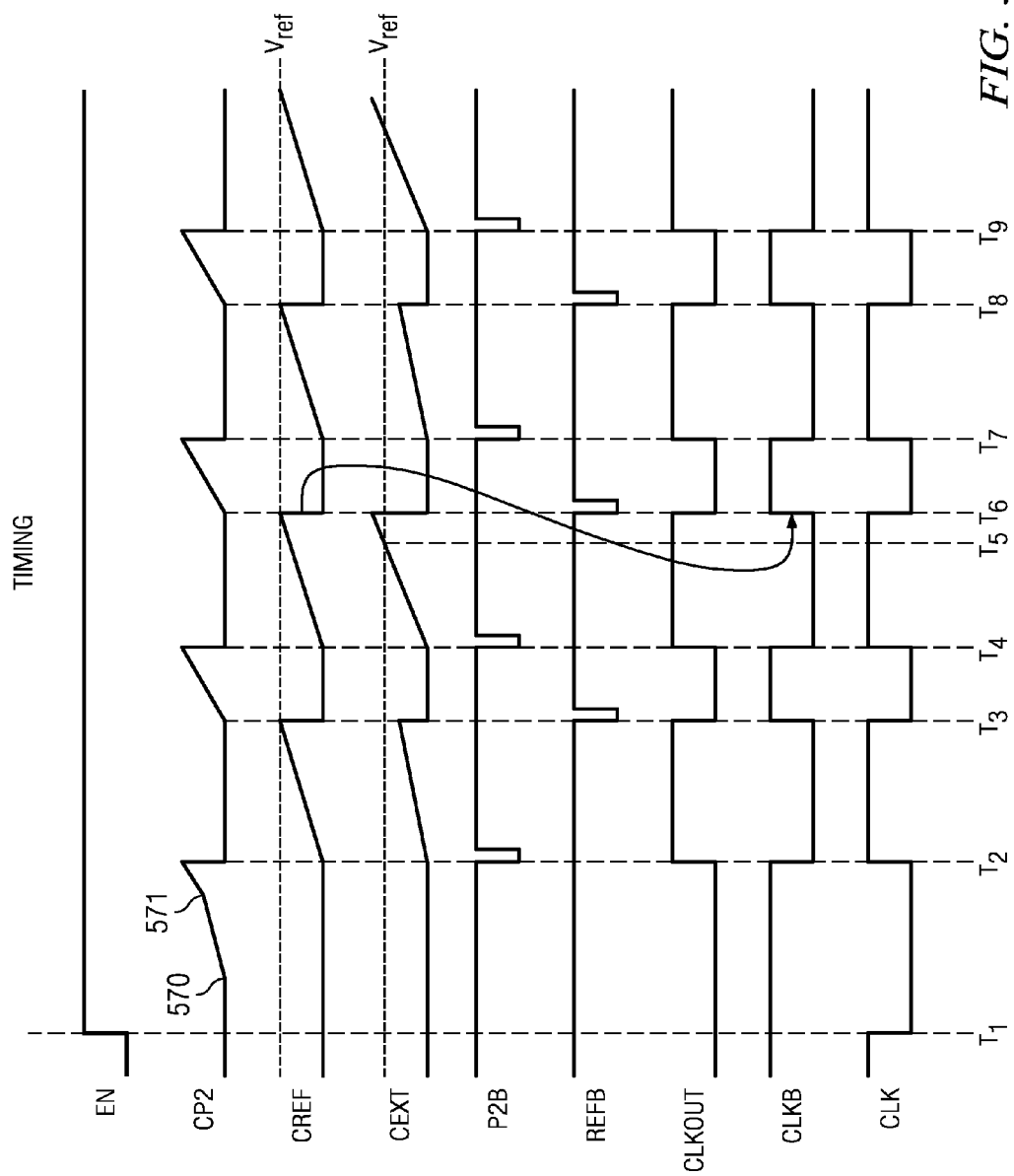
FIG. 5C illustrates a timing diagram for the capacitive touch sense circuitry.

Referring now to FIG. 5c, there is illustrated a timing diagram describing the operation of the analog front end circuitry 502 of FIG. 2b. Responsive to the enable signal going high at time $T_1$ the "clk" signal goes low. Shortly after time $T_1$, the voltage $C_{P2}$ on capacitor $C_{P2}$ begins ramping up at point 570. (Note that the ramp rate for the initial ramp is slower until a point 571 due to start up delays.) When the voltage reaches a set reference voltage level at time $T_2$, the end of a first phase of a two phase clock the comparator 558 generates a low clock pulse as the second phase of the two phase clock as signal P2B and the CLK signal (and CLKOUT signal) goes high. This provides the clock for the analog front end circuitry 502. The CLKB (clock bar) signal also goes low at the same time. The CLKB signal going low turns off transistors 536 and 538 causing the respective voltages across $C_{EXT}$ and $C_{REF}$ to begin ramping up. Once one of voltages CREF or CEXT reaches a reference voltage $V_{REF}$ (in this case the voltage CREF reaches the threshold voltage $V_{REF}$ first at time $T_3$) the output of comparator 556 generates a low pulse as signal REFB. This causes the CLKOUT and CLK signals to go low and the CLKB signal to go high. When the CLKB signal goes high, transistors 536 and 538 are turned on causing the voltages CREF and CEXT to be discharged. Turning off transistor 532 by CLK going low at $T_3$ causes a voltage CP2 to begin ramping up on capacitor $C_{P2}$. This voltage continues to ramp up until it reaches a reference voltage at time $T_4$ causing the output of comparator 558 P2B to pulse low. This causes clock signal CLK and CLKOUT to go high and clock signal CLKB to go low. This discharges the voltage on capacitor $C_{P2}$ and begins ramping up the voltages on capacitors $C_{EXT}$ and $C_{REF}$.

At time $T_5$, the voltage CEXT on capacitor $C_{EXT}$ reaches the reference voltage prior to the voltage CREF reaching the reference voltage. This causes comparator 554 output to go low generation $d_{out}$. When the voltage CREF reaches the reference voltage at time $T_6$, a low pulse is generated on REFB, and the CLKOUT signal and CLK signal go low while the CLKB signal goes high. This discharges the voltage CREF and CEXT and begins charging of capacitor $C_{P2}$ with voltage CP2. The process repeats as necessary for each of the 16-bits of the SAR algorithm.

With further reference to the timing diagram of FIG. 3 and the diagrams of FIGS. 2a and 2b, the operation will be described in more detail. As noted herein above, the basic clock is provided by CP2 and CREF. CP2 provides one phase of the clock, i.e., that portion when the clock is low and CREF provides the second phase of the clock, i.e., that portion when the clock is high. Therefore, CREF controls the second phase and CEXT does not. With reference to the two ramp voltages for CREF and CEXT, this basically represents a race to the threshold voltage. It is noted that both of the comparators 554 and 556 are fabricated with the same circuitry on the same chip and, therefore, drifts with temperature, delays, etc. will be substantially identical such that any variations thereof will be rejected on a common mode basis. It is desirable that $V_{REF}$ for both comparators 554 and 556 be substantially identical and comparator delays be substantially identical. Further, to provide additional immunity from high frequency noise, over and above that associated with the filter 552, these comparators 554 and 556 are designed to be somewhat "sluggish," and such can be accommodated in the SAR algorithm. This provides additional noise immunity in that the low frequency noise rides on the ramp voltage but the ramp voltage is reset after each bit of the 16-bit SAR cycle is tested such that the low frequency noise is only present over one cycle of the 1 kHz SAR cycle. The low frequency noise is a factor for a period of one microsecond. This provides low frequency noise rejection. The circuitry and functionality described herein with respect to FIGS. 5A and 5B are further detailed in previously incorporated U.S. patent application Ser. No. 12/494,417, filed on Jun. 30, 2009, entitled SYSTEM AND METHOD FOR DETERMINING CAPACITANCE VALUE.

Variable Capacitive Sensing Speed

Figure 6A:
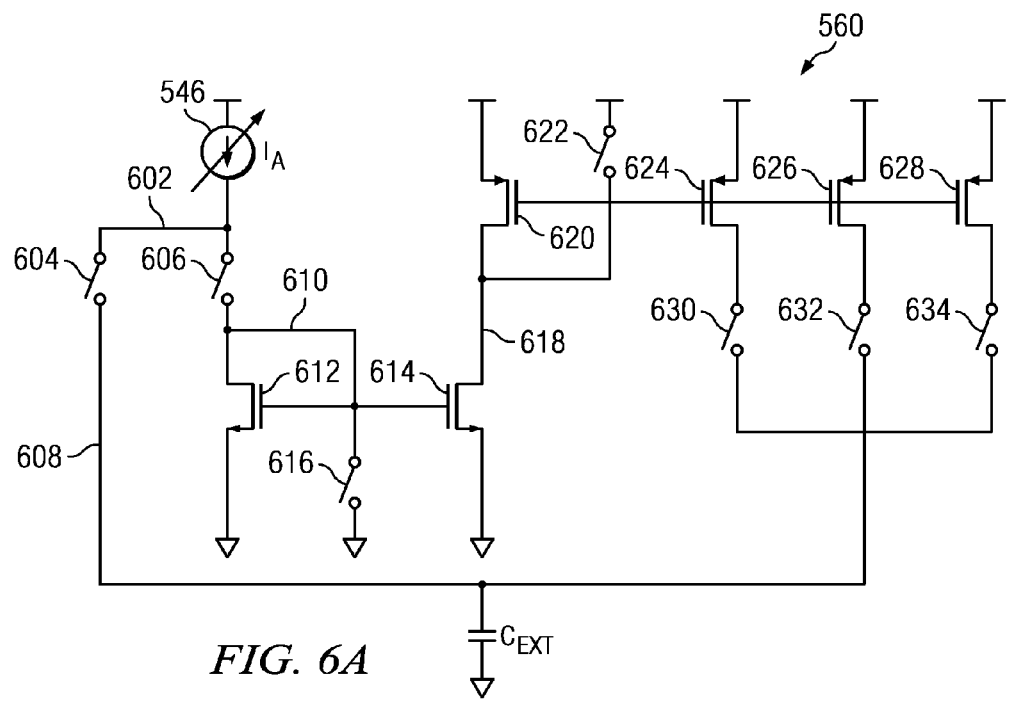
FIG. 6A is a diagram of one embodiment of current control circuitry that may be located in the analog front end circuitry of FIG. 5B that may be used with an external capacitor.

Referring to FIG. 6A, one embodiment of the current control circuitry 560 of FIG. 5B is illustrated in greater detail. The circuitry 560 provides the ability to control the coarse amount of current $I_A$ that is provided to the capacitor $C_{EXT}$ beyond the level of control provided by the current source 546 as described previously. Use of the current control circuitry 560 will be described in conjunction with use of the current control circuitry 562 later with respect to FIG. 7A.

The circuitry 560 is positioned to mirror the current source 546 for $I_A$ to the capacitor $C_{EXT}$. The circuitry 560 includes a node 602 coupled to switches 604 and 606. The switch 604 is directly coupled to the capacitor $C_{EXT}$ via a node 608. The switch 606 is coupled to a node 610 that is in turn coupled to the gates of transistors 612 and 614 that form a current mirror. The source of the transistor 612 is coupled to ground and the drain is coupled to the node 610. The source of the transistor 614 is coupled to ground and the drain is coupled to a node 618. The node 610 is also coupled to ground via a switch 616 that may be actuated to ground the gates of the transistors 612 and 614.

The current mirror is coupled via the node 618 to the drain of a P-channel transistor 620. The node 618 is also coupled to switch 622 that may be actuated to couple the node 618 to the gate of the transistor 620. The gate of the transistor 620 is coupled to the gates of parallel connected P-channel transistors 624, 626, and 628 that, in the present example, are P-channel transistors arranged in a binary weighted manner to provide selectable current values based on input from the SFR 514. Switches 630, 632, and 634 couple the transistors 624, 626, and 628, respectively, to the capacitor $C_{EXT}$ via the node 608 and are controlled by bits from the SFR.

In operation, the switches 630, 632, and 634 may be actuated by control logic 530, control bits from the SFR 514, or another part of the capacitive touch sense circuitry 502. Control bits from the SFR are used to actuate the switches 630, 632, and 634 and therefore add or remove them from the current path in order to modify the coarse value of the current $I_A$ that reaches the capacitor $C_{EXT}$ from the current source 546 with the fine adjustment facilitated with the $I_{DAC}$. In the present embodiment, the current may be provided at ratios as illustrated below in Table 1:

TABLE 1

| Control bits | N (ratio of splitter) |
| --- | --- |
| 000 (default) | 1 |
| 001 | 8/1 = 8 |
| 010 | 8/2 = 4 |
| 011 | 8/3 = 2.67 |
| 100 | 8/4 = 2 |
| 101 | 8/5 = 1.6 |
| 110 | 8/6 = 1.33 |
| 111 | 8/7 = 1.14 |

Figure 6B:
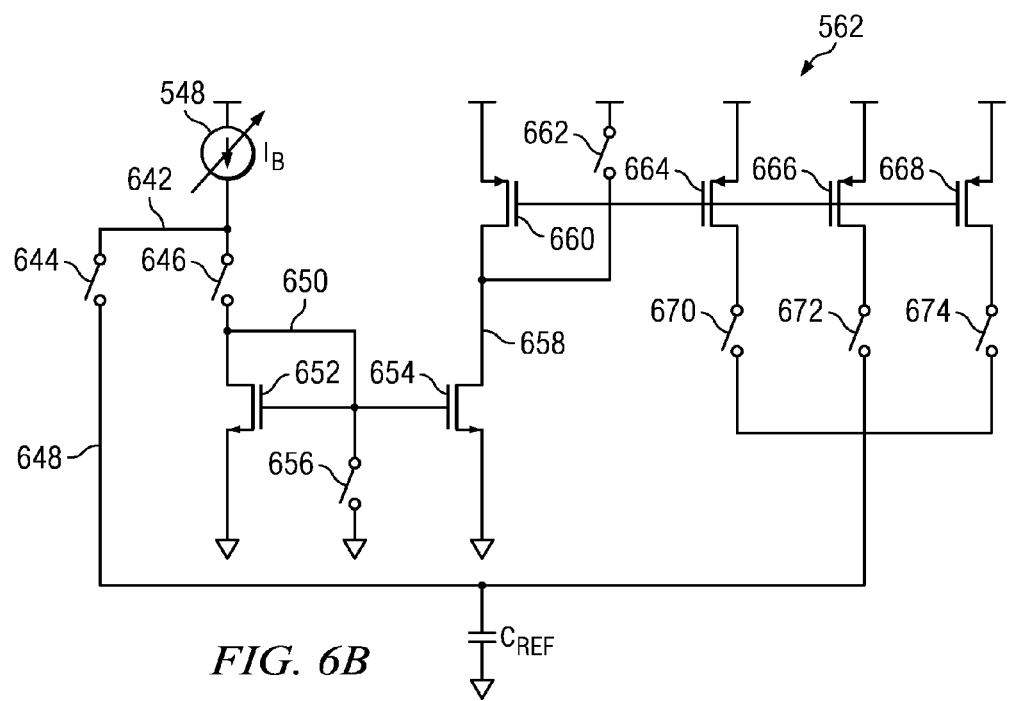
FIG. 6B is a diagram of one embodiment of current control circuitry that may be located in the analog front end circuitry of FIG. 5B that may be used with a reference capacitor.

Referring to FIG. 6B, one embodiment of the current control circuitry 562 of FIG. 5B is illustrated in greater detail. The circuitry 562 provides the ability to control the coarse amount of current $I_B$ that is provided to the capacitor $C_{REF}$ thereby enabling the charge time of the capacitor $C_{REF}$ to be altered (e.g., sped up or slowed down) with fine adjustment provided by an $I_{DAC}$ that generates the $I_B$ current. The control circuitry 640 may be part of the current source 548 or may be external to the current source. Use of the current control circuitry 562 will be described in conjunction with use of the current control circuitry 560 later with respect to FIG. 7A.

The circuitry 562 mirrors the current source 548 for $I_B$ to the capacitor $C_{REF}$. The circuitry 562 includes a node 642 coupled to switches 644 and 646. The switch 644 is directly coupled to the capacitor $C_{REF}$ via a node 648. The switch 646 is coupled to a node 650 that is in turn coupled to the gates of transistors 652 and 654 that form a current mirror. The source of the transistor 652 is coupled to ground and the drain is coupled to the node 650. The source of the transistor 654 is coupled to ground and the drain is coupled to a node 658. The node 650 is also coupled to ground via a switch 616 that may be actuated to ground the gates of the transistors 652 and 654.

The current mirror is coupled via the node 658 to the drain of a P-channel transistor 660. The node 658 is also coupled to switch 662 that may be actuated to couple the node 658 to the gate of the transistor 660. The gate of the transistor 660 is coupled to the gates of parallel connected P-channel transistors 664, 666, and 668 that, in the present example, are arranged in a binary weighted manner to provide selectable current values based on input from the SFR 514. Switches 670, 672, and 674 couple the transistors 664, 666, and 668, respectively, to the capacitor $C_{REF}$ via the node 648 and are controlled by bits from the SFR.

In operation, the switches 670, 672, and 674 may be actuated by control logic 530, control bits from the SFR 514, or another part of the capacitive touch sense circuitry 502. Control bits from the SFR are used to actuate the switches 670, 672, and 674 and therefore add or remove them from the current path in order to modify the coarse value of the current $I_B$ that reaches the capacitor $C_{REF}$ from the current source 548 with the fine adjustment facilitated with an $I_{DAC}$. In the present embodiment, the current may be provided at ratios as illustrated previously with respect to Table 1.

It is understood that different current control circuitry may be needed for each of the capacitors $C_{REF}$ and $C_{EXT}$ due to differences in the minimum and maximum current levels provided to each capacitor by the current sources 548 and 546, respectively. For example, the current source 546 may provide $I_A$ in the range of 4 μA-75 μA, while the current source 548 may provide $I_B$ in the range of 0.125 μA-1 μA.

Figure 6C:
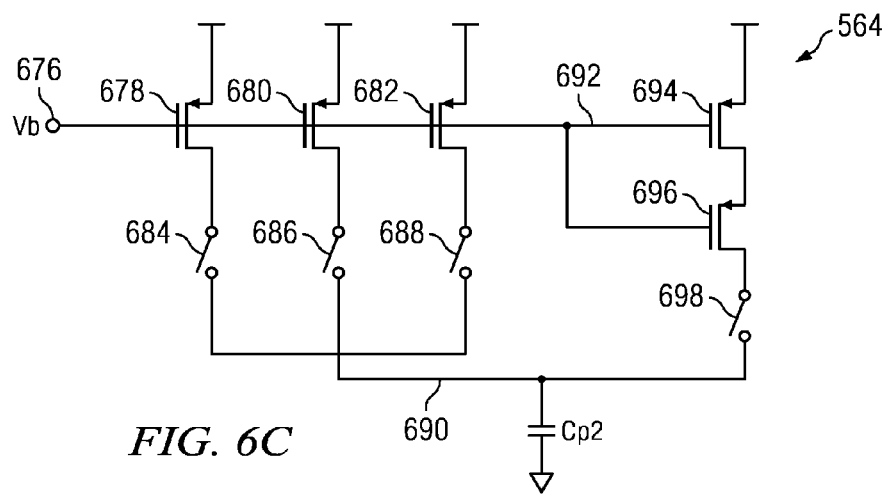
FIG. 6C is a diagram of one embodiment of current control circuitry that may be located in the analog front end circuitry of FIG. 5B.

Referring to FIG. 6C, one embodiment of the current control circuitry 564 of FIG. 5B is illustrated in greater detail. The circuitry 564 provides the ability to control the amount of current $I_C$ that is provided to the capacitor $C_{P1}$ thereby enabling the discharge time of the capacitor $C_{REF}$ to be altered.

The circuitry 564 is positioned between the current source 550 for $I_C$ and the capacitor $C_{P2}$. As illustrated, the circuitry 564 includes a node 676 coupling $V_b$ to the gate of a transistor 678. The transistor 678 forms a binary weighted transistor set in conjunction with transistors 680 and 682. The drains of the transistors 678, 680, and 682 are coupled with switches 684, 686, and 688, respectively that may be actuated to couple and decouple their corresponding transistor to a node 690 that is further coupled to the capacitor $C_{P2}$. The transistor gang is coupled to the gates of transistors 694 and 696 via node 692. The drain of the transistor 696 is coupled to node 690 via a switch 698.

In operation, the current control circuitry 564 may be configured to vary the current provided to the capacitor $C_{P2}$. As with the current control circuitry 560 and 562, the current control circuitry 564 may provide current to its corresponding capacitor $C_{P2}$ based on ratios provided by the transistor set, which may be similar to those provided previously in Table 1. Accordingly, using the current control circuitry, the discharge time of the capacitor $C_{P2}$ may be altered.

Figure 6D:
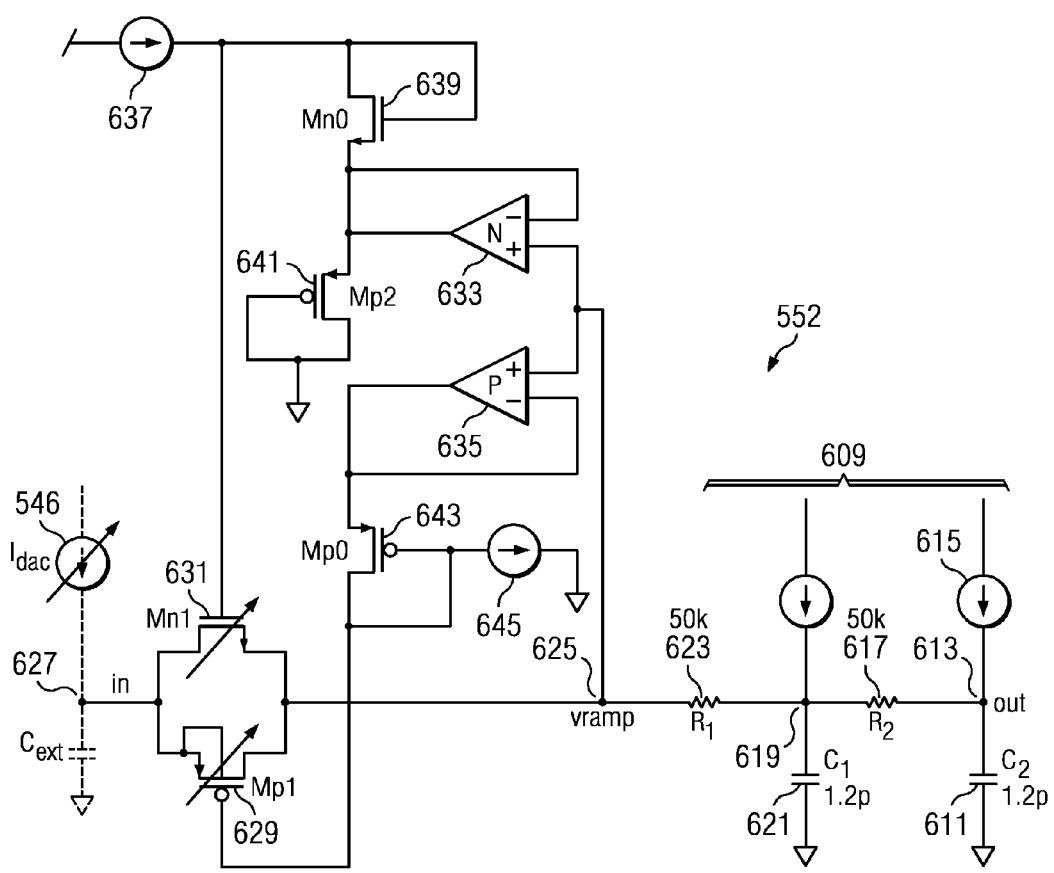
FIG. 6D is a diagram of one embodiment of a programmable filter circuit that may be used in the analog front end circuitry of FIG. 5B.

The filter 552 is a low pass filter and it provides a low pass filter function. As will be described herein below, this filter 552 is operable to provide a variable corner frequency. Referring now to FIG. 6D, there is illustrated a more detailed diagram of the filter 552 illustrating the programmable corner frequency. The bulk of the high frequency signal is filtered out by the two stage low pass filter 609 comprised of a capacitor 611 connected between an output node 613 and ground. A current source 615 provides current IB which drives node 613 with resistor 617 disposed between node 613 and an intermediate node 619. Node 619 has a capacitor connected between node 619 and a capacitor 621 connected between node 619 and ground. A series resistor 623 is connected between node 619 and a node 625.

The programmable aspect of the filter 552 is provided by a complementary transistor switch connected between an input node 627 driven by the current source 546, which node 627 represents an input pad to which the capacitor $C_{EXT}$ is connected, and node 625. The complementary transistor switch is comprised of a P-channel transistor 629 connected in parallel with an N-channel transistor 631 wherein the source/drains thereof are connected in parallel between node 627 and 625. The transistors 629 and 631 are each programmable to provide a select resistance between nodes 627 and 625 when turned on.

A variable corner frequency is provided by varying the resistive path through the complementing pair of transistors 631/629 that is turned on. Further, the corner frequency can be varied as a function of the ramp voltage. This is facilitated by selectively turning on or off the transistors as a function of the ramp voltage. The resistance of the transistors is defined by the size thereof which is programmable.

During each SAR step where both $C_{EXT}$ and $C_{REF}$ are ramped up from "0" volts to the threshold voltage of the comparator, only one of the transistors 631 or 629 are turned on. Initially, transistor 631, the N-channel transistor, is turned on and, as the ramp voltage approaches the threshold voltage, transistor 631 is turned off and transistor 629 turned on. by providing the ability to vary the corner frequency of the filter 552 for each SAR step as a function of the ramp voltage, recognition is given to the fact that a noisier signal at or near the threshold is disadvantageous. This allows one to "open up" the filter response for voltages away from the threshold voltage and "tighten" the filter response for voltages closer to the threshold voltage. Control circuitry is provided for generating the gate voltage for each of these transistors. The ramp voltage that passes through the complementary gate and is received on node 625 will effectively ramp from a zero voltage to the threshold voltage. This node 625 is connected to the positive inputs of an N-buffer 633 and a P-buffer 635. The negative input of both of the buffers 633 and 635 is connected to the output thereof to provide a voltage follower function. A current source 637 is connected to the gate of transistor 631 and also to the gate and drain of an N-channel transistor 639, a diode-connected transistor. The source of transistor 639 is connected to the output of buffer 633 and also to the source of a diode connected P-channel transistor 641 connected between the output of the buffer 633 and ground. It can be seen that, when the ramp voltage on node 625 is low, i.e., essentially ground, at the initiation of the charge cycle, the voltage on the output of buffer 633 will be a low voltage. This will turn off transistor 641, since it is below the $V_T$ thereof. Current source 637 will thus pull the gate of transistor 631 high, turning on transistor 631 as the initial state such that the resistance of transistor 631 will constitute the series resistor with the two stage output low pass filter. As the ramp voltage increases, the output voltage of the N-buffer 633 will reach the $V_T$ of transistor 641, turning on transistor 641 which will pull the gate of transistor 631 low through transistor 639. Since the voltage on node 627 and 625 is at the threshold voltage of transistor 641, transistor 631 will be off.

The P-channel transistor 629 is controlled by the buffer 635 which drives the source of P-channel transistor 643, the drain thereof connected to the source thereof in a diode connected configuration and also to one side of the current source 645 which drives current from the gate of transistor 643 to ground. Transistor 643 has the drain thereof connected to the gate of transistor 629. In operation, when the ramp voltage on node 625 is low, transistor 643 will be turned off and current source 645 will pull the gate of transistor 629 low, turning off transistor 629. When the output of buffer 635 reaches the $V_T$ of transistor 643, transistor 643 will turn on and the drain thereof will be one $V_T$ below the output of buffer 635 such that transistor 629 will turn on, since the voltage on node 625 is at $V_T$ and the gate is one $V_T$ below that voltage. Transistor 629 will then control the corner frequency. The purpose for having this control of the corner frequency is to change the low pass filter function to a lower noise filter, i.e., it will filter out more high frequency energy, as the ramp voltage approaches the comparator threshold voltage $V_{REF}$. As will be described herein below, the values of transistors 631 and 629 are programmable such that the series resistance provided thereby when turned on is programmable.

Figure 6E:
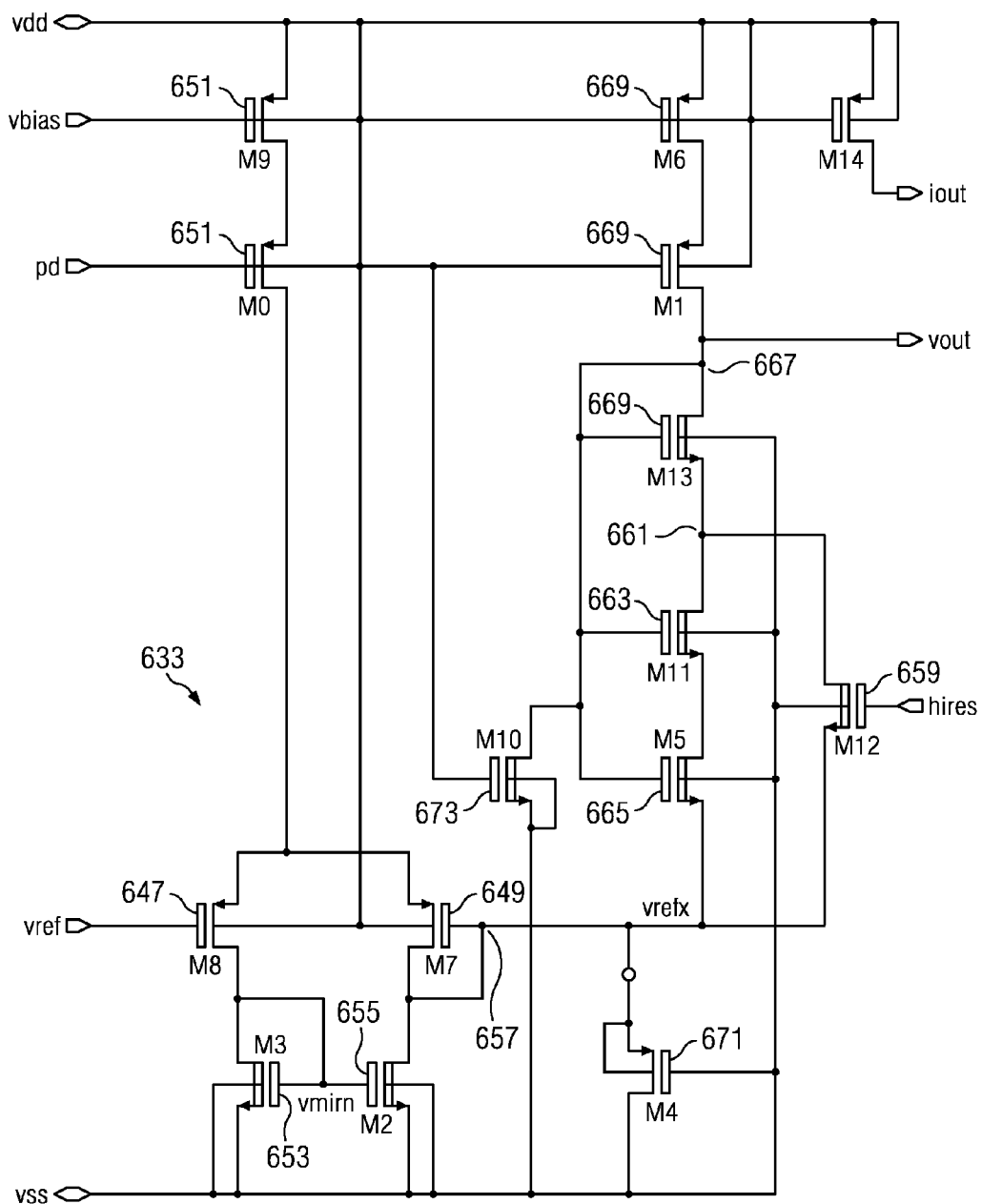
FIG. 6E is a diagram of one embodiment of an NMOS buffer that may be used in the programmable filter circuit of FIG. 6D.

Referring now to FIG. 6E, there is illustrated a detailed schematic diagram which includes the N-buffer 633, the current source 637, the N-channel transistor 639 and the P-channel transistor 641 in FIG. 6D. The reference voltage on the positive input is input to the gate of one transistor 647 of a common source pair of P-channel transistors, the other side thereof comprised of transistor 649 with the sources thereof connected together through two series connected P-channel transistors 651 to $V_{DD}$. A bias voltage vbias and a control voltage pd control respective gates of the two transistors 651. The drain of transistor 647 is connected to the drain of a diode connected N-channel transistor 653, the source thereof connected to ground and the gate thereof connected to the gate of an N-channel transistor 655, the source/drain path thereof connected between ground and a node 657, node 657 connected to the gate of transistor 649 such that transistor 649 is a diode connected transistor. A control voltage hires is connected to the gate of an N-channel transistor 659, the source/drain path thereof connected between node 657 and a node 661, node 661 connected through the source/drain path of an N-channel transistor 663 and a series connected N-channel transistor 665 to node 657. The gates of transistors 663 and 665 are connected together to a node 667 and to the gate of an N-channel transistor 669, the source/drain path thereof connected between node 661 and node 667. Node 667 is connected through the source/drain paths of two series connected P-channel transistors 669 to $V_{DD}$, the gates of the transistor 669 providing the bias and having the gates thereof connected to the gates of transistor 651 to provide bias to node 667. The node 667 drives the gate of transistor 631. The node 657 is connected to ground through the source/drain path of a P-channel transistor 671, the gate thereof connected to ground. The control voltage pd is connected to the gate of an N-channel transistor 673, the source/drain path thereof connected between node 667 and ground.

Figure 6F:
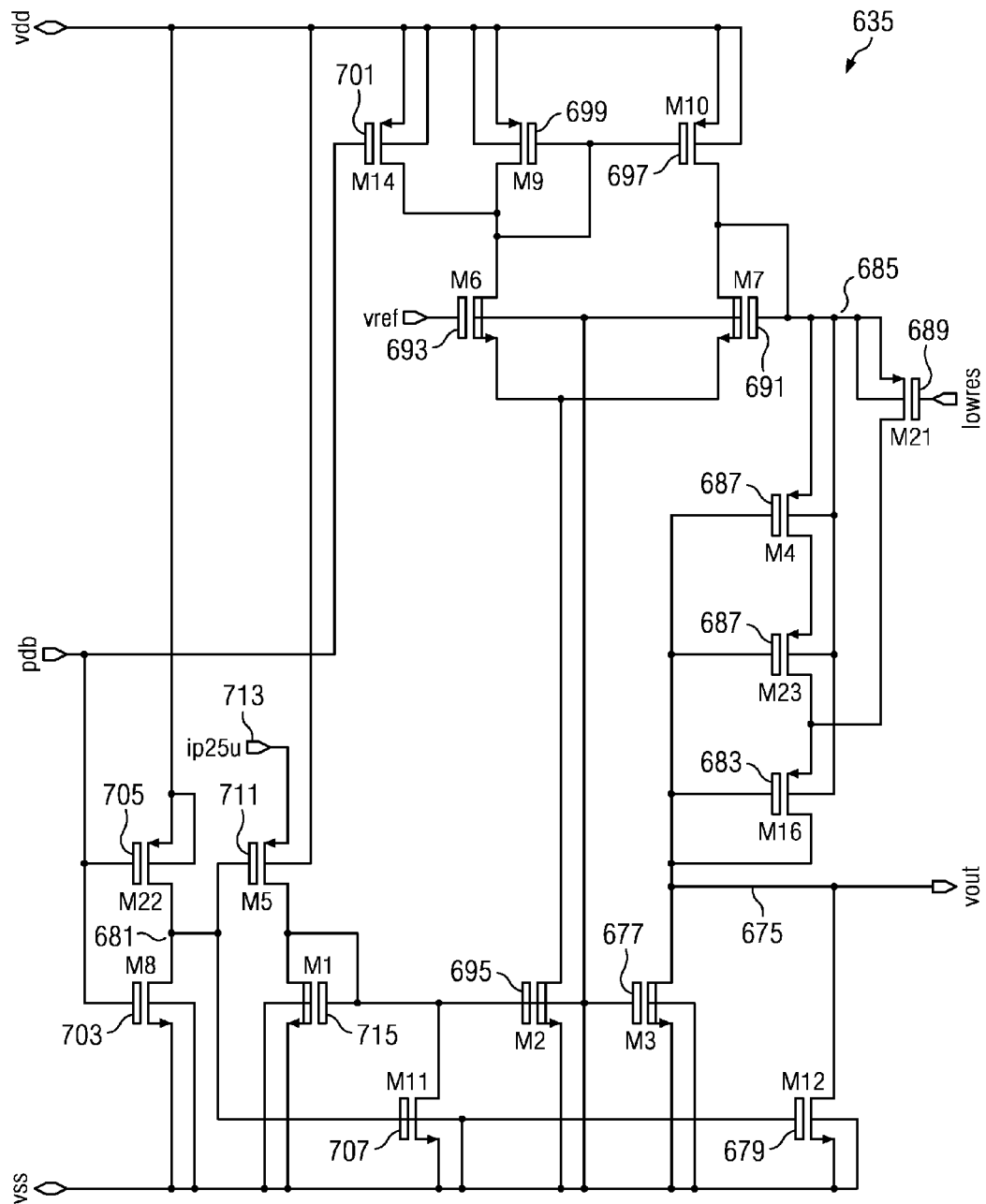
FIG. 6F is a diagram of one embodiment of a PMOS buffer that may be used in the programmable filter circuit of FIG. 6D.

Referring now to FIG. 6F, there is illustrated a detailed schematic diagram which includes the PMOS buffer 635, the current source 645 and the P-channel transistor 643 in FIG. 6D. Node 675 drives the gate of transistor 629. Node 675 is connected to ground through a source/drain path of an N-channel transistor 677 and to the source/drain path of transistor 679. The gate of transistor 677 is connected to a bias voltage vnbias and the gate of transistor 679 is connected to a bias node 681. Node 675 is connected to the drain of a diode connected P-channel transistor 683, the source thereof connected to a node 685 to the source/drain paths of two series connected P-channel transistors 687, the gates thereof connected to the gate of transistor 683, the source/drain path of transistor 683 connected between node 675 and to the source of a P-channel transistor 689. Transistor 689 has the source/drain path thereof connected on the other side thereof to node 685 and the gate thereof connected to a control voltage lowers. Node 685 is connected to the gate of transistor 691 of a common source pair of N-channel transistors, the other transistor being a transistor 693. Transistor 693 has the gate thereof connected to $V_{REF}$ and the common source connection between transistor 693 and 691 is connected to the source/drain path of an N-channel transistor 695 to ground, the gate thereof connected to the vnbias bias line. Transistor 691 has the drain thereof connected to one side of the source/drain path of P-channel transistor 697 to $V_{DD}$, the gate thereof connected to a diode connected P-channel transistor 699 having the source/drain path thereof connected between $V_{DD}$ and the drain of transistor 693. The drain of transistor 693 is connected to the source/drain path of a P-channel transistor 701 to $V_{DD}$, the gate of transistor 701 connected to the control signal pdb. The control signal pdb is also connected to the gate of an N-channel transistor 703 having the source/drain path thereof connected between ground and node 681 and to the gate of a P-channel transistor 705 connected between node 681 and $V_{DD}$, node 681 providing the bias for transistor 679. An N-channel transistor 707 has its source/drain path thereof connected between the vnbias signal and ground and the gate thereof connected to node 681. The node 681 is connected to the gate of a P-channel transistor 711, the source/drain path thereof connected between current input node 713 and to the vnbias line and also to one side of the source/drain path of a diode connected N-channel transistor 715, the other side thereof connected to ground.

Figure 6G:
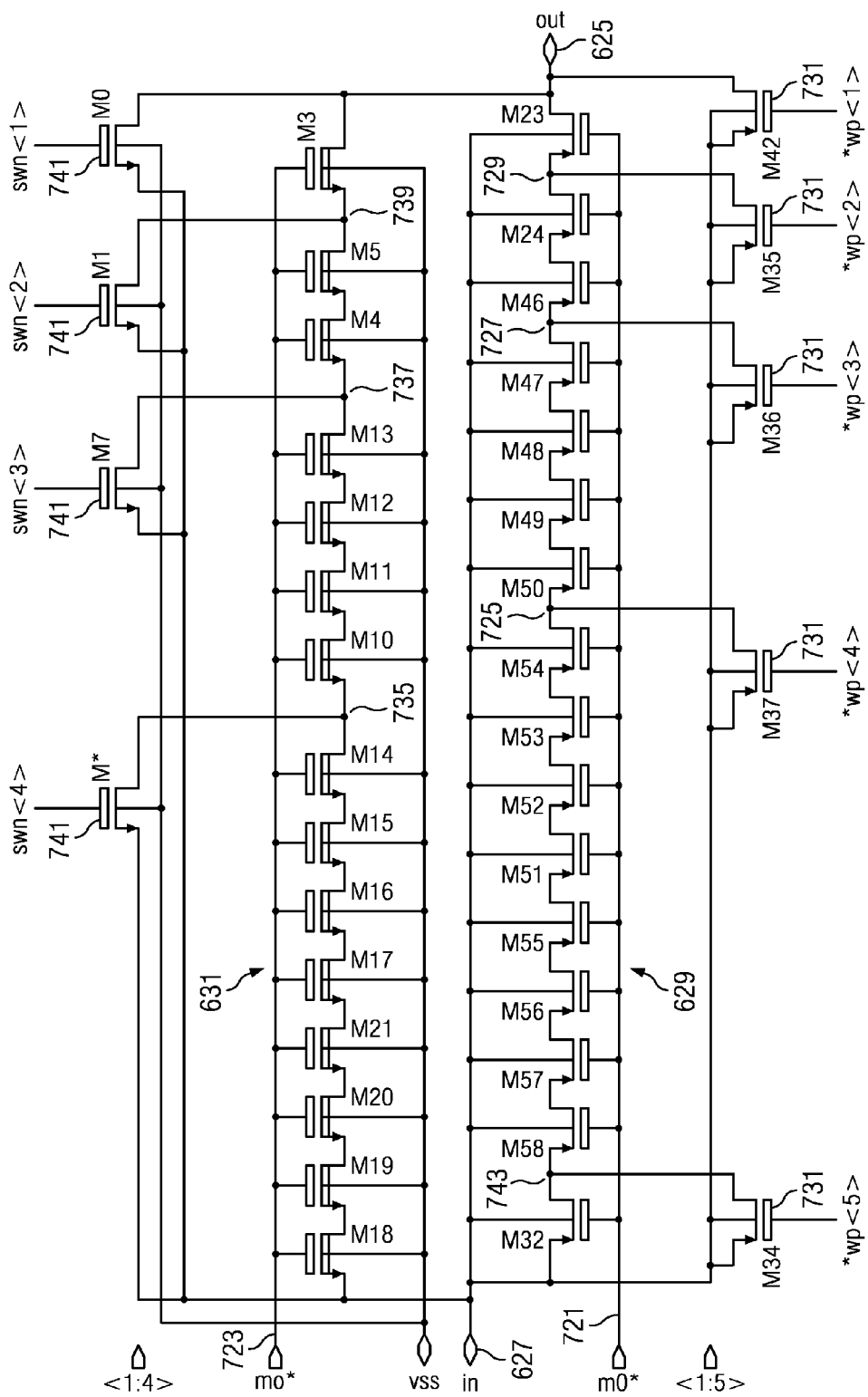
FIG. 6G is a diagram of two programmable transistors coupled in parallel that may be used for corner frequency filtering in the programmable filter circuit of FIG. 6D.

Referring now to FIG. 6G, there is illustrated a circuit diagram of the two parallel connected transistors 629 and 631. Each of these transistors is comprised of a plurality of series connected transistors with the gates of all the P-channel transistors connected to a node 721 and the gates of all the N-channel transistors connected to a node 723. There are provided various taps between the source/drain paths of the series connected transistors that can be shorted to the input node 627 for both the N-channel transistors and P-channel transistors. For the P-channel transistors, there would be a first tap 743 one transistor in from the input node 627, a second tap 725 that is nine transistors in from the input node 627, a third tap 727 thirteen transistors in from the input node 627, a fourth tap 729 fifteen transistors in from the input node 627 which taps can be shorted selectively to the input node 627 by respective P-channel transistors 731, there being one each of these transistors for each of the taps. There will be an additional transistor 731 connected between the input node and the output node 625 to effectively remove all the programmable transistors in the series connected string and replace this by the one transistor 731 connected therebetween. There is provided on the gates thereof control bits SWP<1>-SWP<5>. Similarly, on the N-channel side, there is provided a tap 735 eight transistors in from the input node 627, a tap 737 twelve transistors in from the input node 627 and a tap 739 fourteen transistors in from the input node 627. There are provided four control transistors 741 to control the tap such that the taps 735, 737 or 739 could selectively be connected to the input node 627 or the fourth control transistor 741 for connecting the input node 627 to the output 625. The input control signal for these four transistors 741 comprise the control signals SWN<1>-SWN<4>. Therefore, utilizing an SFR, the number of transistors in either the P-channel string or the N-channel string can be determined to define the series resistance of the complementary gate on either side thereof and, thus, the corner frequency of the filter. This provides a programmable corner frequency.

Referring to FIG. 7A, one embodiment is illustrated of a flow chart depicting a method 700 by which the overall scanning process may be accomplished. In step 702, the scan speed may be defined by modifying the charging time of the capacitor $C_{REF}$ and modifying the coarse value of current $I_A$ that drives $C_{EXT}$. This process will be described below in greater detail. In step 704, a baseline capacitance value may be determined for $C_{EXT}$ as described above and also described in detail in previously incorporated U.S. patent application Ser. No. 12/494,417, filed on Jun. 30, 2009, entitled SYSTEM AND METHOD FOR DETERMINING CAPACITANCE VALUE. In step 706, the scan may be performed as described above and also described in detail in previously incorporated U.S. patent application Ser. No. 12/146,349, filed on Jun. 25, 2008, entitled LCD CONTROLLER CHIP.

Referring to FIG. 7B, one embodiment is illustrated of a flow chart depicting a method 710 by which the charging time of the capacitor $C_{REF}$ of FIG. 5B may be modified to alter the sensing speed with which the capacitive sense block 306 can sense capacitance changes in the touch screen 104. In step 712, a desired sensing speed/resolution is identified for the scanning process. For example, an application designer for a particular application that uses the touch screen 104 may not care about sensing information other than information indicating that a row has been touched. In this case, the designer may configure the circuitry 650 to provide more current to the capacitor $C_{REF}$ in order to shorten the charge time of the capacitor up to the threshold voltage $V_{REF}$. Due to this additional current, the capacitor $C_{REF}$ will hit the threshold more quickly while establishing the baseline capacitance value for $C_{EXT}$ as described previously, which in turn speeds up the race between the voltage on the capacitors $C_{REF}$ and $C_{EXT}$. In order to match the voltage ramps on the capacitors $C_{REF}$ and $C_{EXT}$, the capacitive sense block 306 will increase the current provided to the capacitor $C_{EXT}$ via the current source $I_A$, making the capacitor $C_{EXT}$ also charge more quickly. Because of the more rapid charging, distributed capacitors 401 at the far end 406 of the transmission line 402 may not have time to fully charge. Accordingly, the row and column lines in the touch screen 104 will be scanned more quickly, but the scanning may not detect relatively small changes in capacitance.

Alternatively, the application designer may care more about sensing at a higher resolution than about speed. In this case, the designer may configure the circuitry 650 to provide less current to the capacitor $C_{REF}$ in order to lengthen the charge time of the capacitor to the threshold voltage $V_{REF}$. In turn, the voltage across capacitor $C_{REF}$ will read the threshold more slowly, which slows down the race between the voltage ramp on the capacitors $C_{REF}$ and $C_{EXT}$. In order to match the voltage ramp on the capacitors $C_{REF}$ and $C_{EXT}$, the capacitive sense block 306 will decrease the coarse level of the current provided to the capacitor $C_{EXT}$ via the current source $I_A$, making the capacitor $C_{EXT}$ also charge more slowly. Because of the slower charging, distributed capacitors 401 at the far end 406 of the transmission line 402 will have time to more fully charge, assuming the charge time is sufficiently long. Accordingly, the row and column lines will be scanned more slowly, but the scanning will detect relatively small changes in capacitance.

It is understood that the identified speed/resolution may be selected as desired (e.g., the designer may enter a desired value or a set of parameters that are not limited other than by minimum and maximum values of the system itself) or the speed/resolution may be selected from a predefined set of values that correspond to system resolutions available to the designer.

In step 714, a charge time for the capacitor $C_{REF}$ is determined that corresponds to the speed/resolution identified in step 712. The charge time may be obtained in many different ways. For example, the charge time may selected from one of a plurality of predefined charge times stored in a table in memory that is indexed by speed/resolution or the charge time may be calculated in real time based on the known value of the capacitor $C_{REF}$.

In step 716, a determination is made as to an amount of current $I_B$ needed to charge the capacitor $C_{REF}$ in the charge time determined in step 714, i.e., the maximum time to reach the threshold voltage $V_{REF}$. It is understood that the determination of the amount of current $I_B$ may not only ensure that the capacitor $C_{REF}$ is charged in that period, but that the capacitor $C_{REF}$ reaches its full charge as close to that time as possible (i.e., within the constraints of the controlling circuitry). Accordingly, if the current $I_B$ can be provided at particular defined levels as described previously (e.g., as controlled by three MSB bits used to manipulate binary weighted transistors and the remaining LSBs defining the current source 548 value), then the closest level will be selected, but the current may not exactly match the desired charge time (defined as the time for $C_{REF}$ to charge to $V_{REF}$). In some embodiments, only charge times that correspond to possible current values may be available for use. The current $I_B$ may be obtained in many different ways. For example, the current $I_B$ may selected from one of a plurality of predefined currents stored in a table in memory that is indexed by charge times or the current may be calculated in real time based on the desired charge time.

In step 718, circuitry may be configured to provide the level of current $I_B$ determined in step 716 to the capacitor $C_{REF}$. For example, the current control circuitry 650 may be used to adjust the current level. It is understood that the current $I_B$ may be controlled in many different ways, including direct current manipulation (e.g., if the current $I_B$ is directly controllable) or by using many different types of circuits. The method 710 is directed to manipulating the current $I_B$ in order to change the charge time of the capacitor $C_{REF}$ and is not concerned with how the current is manipulated.

In step 720, a determination may be made as to whether the charge time of the capacitor $C_{EXT}$ needs to be normalized. More specifically, the charge time of the capacitor $C_{REF}$ may be modified in step 718 so as to make it difficult or impossible to establish a valid race condition with the capacitor $C_{EXT}$. For example, assume that the capacitor $C_{EXT}$ must charge within a particular window of time in order for a race condition with the capacitor $C_{REF}$ to be valid. This window may be based on minimum and maximum levels of current available to the capacitor $C_{EXT}$ or on other parameters. If the charge time for $C_{REF}$ is shifted too far in step 718 relative to the window for $C_{EXT}$, then $C_{EXT}$ may have a very limited amount of room (or no room) within which its charge time can be changed to find the best match during the comparisons. For example, if the charge time for $C_{REF}$ is increased until it is outside of or on the upper edge of the window for $C_{EXT}$, then $C_{EXT}$ may be unable to increase its charge time enough to provide a match for the respective ramp voltages during a comparison. In such a case, it is desirable to shift the charging window for $C_{EXT}$ back into line (or at least more in line) with the charge time for $C_{REF}$, which is referred to herein as normalizing the charge time for $C_{EXT}$.

If step 720 determines that no normalization is needed, the method 710 may end. If step 720 determines that normalization is needed, the method 710 continues to step 722. In step 722, a normalized charge time is determined for the capacitor $C_{EXT}$ relative to the modified charge time of the capacitor $C_{REF}$.

Accordingly, in step 724, a determination is made as to an amount of current $I_A$ needed to normalize the charge time of the capacitor $C_{EXT}$, i.e., a coarse adjustment. It is understood that this may be an approximate current level that is simply intended to set $I_A$ at an initial level that can be manipulated in either direction (lower or higher) as needed in order to match the charge time of the capacitor $C_{EXT}$ with the charge time of the capacitor $C_{REF}$ during a comparison.

In step 726, circuitry may be configured to provide the level of current $I_A$ determined in step 722 to the capacitor $C_{EXT}$. For example, the current control circuitry 560 may be used to adjust the current level. It is understood that the current $I_A$ may be controlled in many different ways, including direct current manipulation or by using many different types of circuits. The method 700 is directed to manipulating the current $I_A$ in order to normalize the charge time of the capacitor $C_{EXT}$ relative to the charge time of the capacitor $C_{REF}$ and is not concerned with how the current is manipulated.

Figure 8:
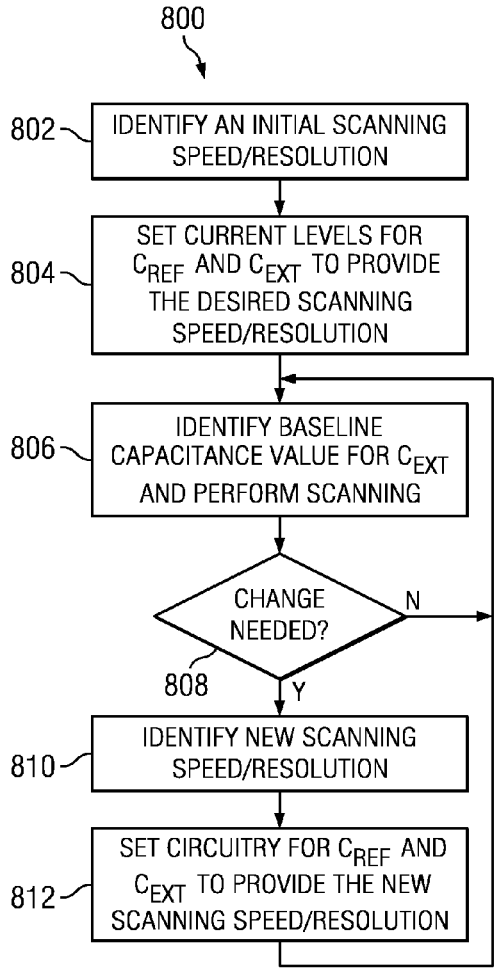
FIG. 8 is a flow chart illustrating another embodiment of a method for setting a scanning speed in the analog front end circuitry of FIG. 5B.

Referring to FIG. 8, one embodiment is illustrated of a flow chart depicting a method 800 by which the charging time of the capacitor $C_{REF}$ of FIG. 5B may be adjusted multiple times to emphasize sensing speed or resolution depending on input or other criteria. In the present example, each adjustment occurs between actual comparisons, but it is understood that one or more of the adjustments may occur during a comparison in some embodiments.

Figure 9A:
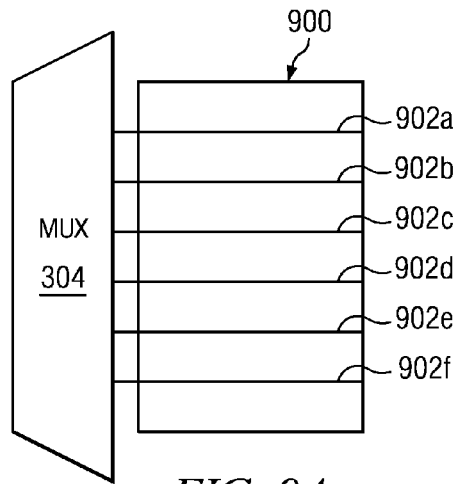
FIG. 9A is a diagram illustrating one embodiment of a touch screen.

The present example also refers to FIG. 9A, in which a simplified embodiment of a capacitive touch screen 900 is illustrated. The capacitive touch screen 900 includes six rows 902a-902f (columns are not shown). Each row 902a-902f will be representative of the transmission line 402 of FIG. 4A, and so will have a series of distributed capacitors 401 and associated series resistances (not shown) as described with respect to FIG. 4A. In the present example, no part of the touch screen 900 is more important from an application standpoint than any other part of the touch screen. However, if the side of the touch screen 900 near multiplexer 304 is of more interest than the side farthest away from the multiplexer, the touch screen may be scanned more rapidly and with higher resolution than if the opposite side is of more interest for reasons discussed above.

In step 802, an initial scanning speed/resolution may be identified. In the present example, the initial scanning speed is set to detect relatively large changes in capacitance and so will scan relatively rapidly and may miss small changes in capacitance. For example, the touch screen 900 may be associated with a device that can be activated from sleep mode via a touch on the touch screen, and so the scanning speed is set so that the capacitive sense block 306 can scan for a capacitance change that signals that the screen had been touched. Where the touch occurred (i.e., column/row information) on the touch screen 900 is not needed, only the fact that the screen was touched. For this reason, minor changes in capacitance can be ignored and the exact location is not necessary. It is understood that a touch occurring to the screen diametrically opposite the multiplexer 304 may result in a relatively small change in capacitance, but the circuitry may be adjusted to allow for a desired level of sensitivity to cover this situation.

In step 804, initial values are set for $I_B$ and $I_A$ in order to align the ramp voltages on $C_{REF}$ and $C_{EXT}$, respectively, with the initial scanning speed identified in step 802. For example, this step may be performed as described previously using the method 710 of FIG. 7B. For this step, the coarse and fine settings are defined for $I_B$ and the coarse setting is set for $I_A$ at the nominal value for the current, and then the fine setting set at one end of the range therefor.

In step 806, once set, the baseline capacitance value for $C_{EXT}$ may be determined and the scanning may be performed as described above.

In step 808, a determination is made as to whether a change is needed in the scanning speed. For example, detection of a capacitance change in the capacitance of one of the rows 902a-902f may trigger the determination of step 808. Continuing the current example, the change would need to be relatively large in order to be detected due to the relatively fast scanning speed selected in step 802.

If no change is needed, the method 800 returns to step 806. This loop may continue until a change is needed due to the detection of a change in capacitance or the scanning process is ended (e.g., the device is powered down). If a change is needed, the method 800 continues to step 810, where a new scanning speed/resolution may be identified. For example, an application may be programmed to detect a touch using the initial faster scanning speed/lower resolution scanning and, once a touch is detected, may be programmed to initiate a scan at a slower scanning speed/higher resolution in order to obtain more detailed information from that point forward. Alternatively or additionally, the application may initiate the lower scanning speed/higher resolution processing in order to gain additional information about the initial touch to the touch screen 900, as the time it takes a user to touch the screen with a finger and retract the finger may allow for multiple scans prior to the removal of the finger.

In step 812, new values are set for $I_B$ and $I_A$ in order to align the ramp voltages on $C_{REF}$ and $C_{EXT}$, respectively, with the new scanning speed/resolution identified in step 808. Once set, the method 800 may return to step 806 and scanning may continue using the new scanning speed/resolution.

It is understood that the method 800 may be used to slow down and speed up the scanning speed, thereby increasing and decreasing the resolution, many times. Furthermore, the criteria used to determine whether to modify the scanning speed/resolution are limited only by the functionality provided by the touch screen 900.

Figure 9B:
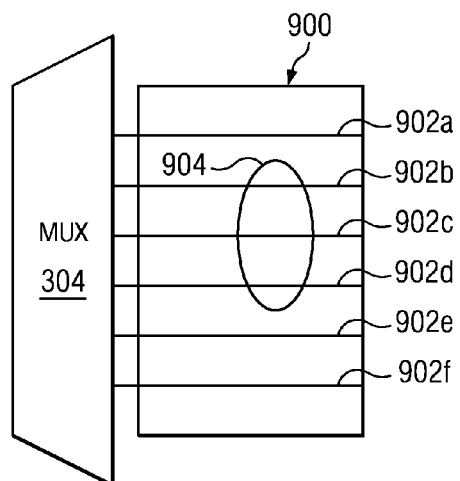
FIG. 9B is a diagram illustrating another embodiment of the touch screen of FIG. 9A.

Referring to FIG. 9B, another embodiment of the capacitive touch screen 900 of FIG. 9A is illustrated (where rows only are illustrated). In the present example, an area 904 has been defined on the touch screen 900. The area 904 may be defined by an application or may be otherwise defined. In this embodiment, the method 800 of FIG. 8 may be configured to scan the rows 902a, 902e, and 902f using a faster scanning speed/lower resolution while scanning the rows 902b-902d (i.e., the rows covering the area 904) at a slower scanning speed/higher resolution. Accordingly, the scanning speed/resolution may be modified between rows, with different rows scanned at different speeds and resolutions. This enables an application designer to designate areas of the touch screen 900 as more important than other areas and to tailor the scanning speed/resolution based on those areas. By defining the scanning speed and resolution, the application designer can customize the interface to provide desired functionality and can also provide power savings by not requiring each row to be scanned at a high resolution. Although not shown, it is understood that scanning may be further tailored by column, with slower/higher resolution scanning only occurring for certain column/row combinations. Further, only certain rows and columns associated with area 904 need be scanned to save power, etc. This may be because rows 902a, 902e and 902f are associated with rows of little or no interest.

MTR Block

Figure 10A:
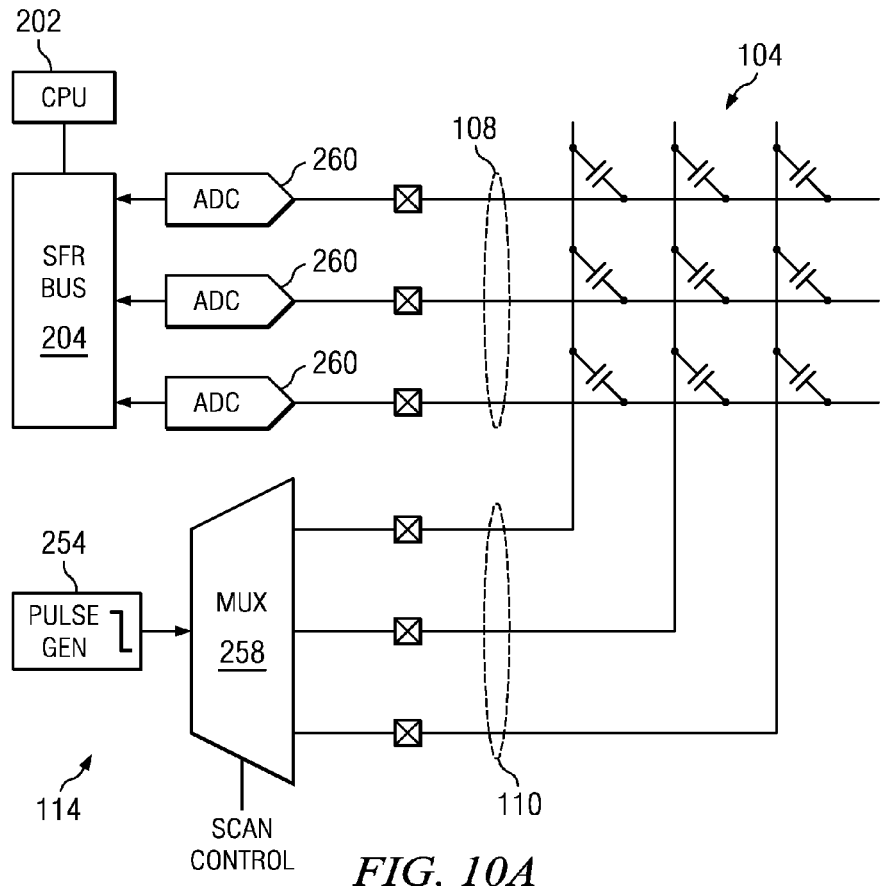
FIG. 10A illustrates a diagrammatic view of the MTR module interfaced with a touch screen.

Referring now to FIG. 10A, there is illustrated a diagrammatic view of the MTR module 114 interfaced with the touch screen 104. There are illustrated only three rows 108 and three columns 110 for discussion purposes, it being understood that there could be multiple rows and columns in a particular touch screen 104. In this embodiment, the rows are each connected to a separate one of the ADCs 260 which, as described herein above, allows each row line to be sensed individually such that a high speed ADC is not required for individually scanning the analog voltage and the output of a row line with a switched multiplexer. For the generation of the pulse, a single pulse must be generated for each column line 110. Therefore, when a pulse is generated on a particular column line, it will be coupled across to the row line and the voltage on the particular row line measured by the associated ADC 260 and this value latched in the output for reading by the CPU 202.

Figure 10B:
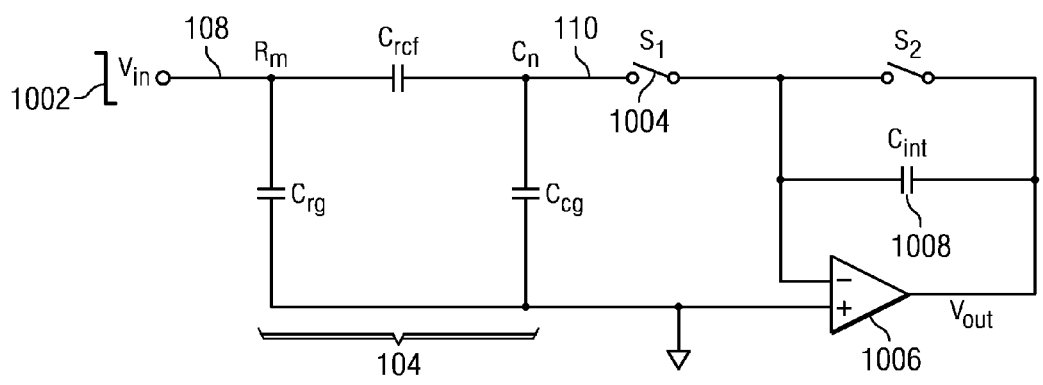
FIG. 10B illustrates a simplified diagram of the MTR circuit.

Referring now to FIG. 10B, there is illustrated a simplified diagram of the MTR circuit. A pulse 1002 is generated by the pulse generator 254 for a particular row line 108. The touch screen 104 for a particular row and column line intersection is illustrated with a capacitance disposed between the row line and ground labeled $C_{RG}$. The column line 110 has a capacitor $C_{CG}$ connected between the column line and ground. The pulse 1002 is a negative going pulse, in this embodiment, which drives the row line and is coupled across to the column line 110 via a coupling capacitor $C_{RCF}$ between the row and column line. A switch 1004 is operable to connect the column line to the input of an amplifier 1006 to allow change from capacitor $C_{RCF}$ to be transferred to the negative input of amplifier 1006 and capacitor 1008 the positive input connected to ground. When this is connected to the negative input, the feedback capacitor 1008 disposed between the negative input of amplifier 1006 and the output thereof (labeled $C_{int}$) will result in a trapped charge being disposed thereon which constitutes the change in capacitor $C_{RCF}$ being transferred thereto. Each of these blocks (there being one block for each of the ADCs 260) will individually trap the charge such that opening of switch 1004 causes it to be trapped. The goal is to sense minute changes (~5 pF) at $C_{RCF}$ caused by the approach of a human finger. A single row or column pulse will be simultaneously input to the column line 110. This pulse will be repeated for each column. 0 to 100 pF is the approximate working range therefor.

During scanning, the user is provided a great deal of versatility in how to scan the touch screen. For example, if there are twenty receivers, the user can choose to: a) read odd numbered receivers, followed by even number receivers; or b) read #0 to #15 receivers first, then read the rest of the four lines; or c) only use a certain number of the MTRs to read certain lines. The user could start the driver or pulse generator from #0 row and move up sequentially, or start from a random number, for example #6, then drive #5, #7, #8, #4, etc. This allows the multi-touch resolve system to focus on a particular area of the touch screen 104 and, even one intersection of a row and column in a particular panel if a user so desired. By so doing, power can be significantly reduced in that less time is required to scan only a portion of the touch screen 104, thus requiring the CPU 202 to be "awake" for less time.

Figures 11, 12A:
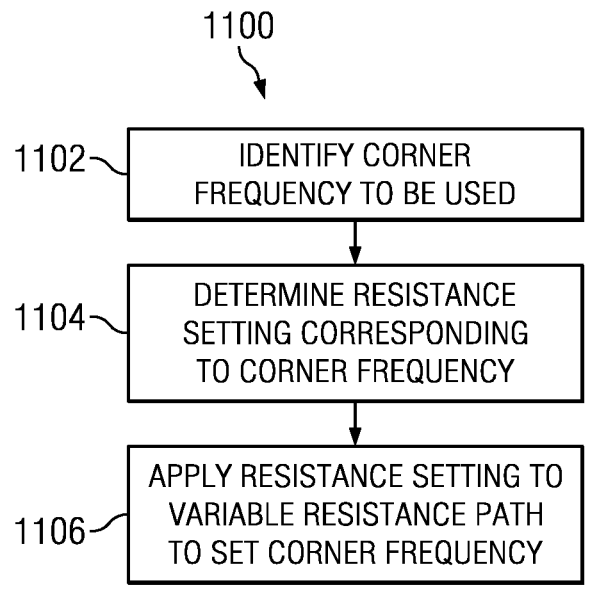
FIG. 11 is a flow chart illustrating one embodiment of a method for configuring a corner frequency via a variable resistance path.
FIG. 12A is a table illustrating one embodiment of control bits that may be used to select predefined ramp rates for an external capacitor.

Referring to FIG. 11, one embodiment is illustrated of a flow chart depicting a method 1100 by which adjustments may be made to the corner frequency via the filter 552 described above with respect to FIGS. 6D-6G. The following description also refers to FIGS. 12A-12D, which provide a specific example of how such adjustments may be implemented in the capacitive sensing circuit described in the present disclosure. However, it is understood that the settings, resistances, and corner frequencies described below with respect to FIGS. 12A-12D are merely for purposes of illustration and that many different settings, resistances, and corner frequencies may be used in both the present circuit and in other circuits to achieve a programmable corner frequency.

The comparators (e.g., comparators 554 and 556 of FIG. 5B) used for capacitive sensing are more sensitive to noise near the threshold $V_{REF}$. Accordingly, better noise performance may be achieved if the corner frequency is lowered near $V_{REF}$. Furthermore, as described previously, the ramp rate of the capacitor $C_{EXT}$ may be configured. As the ramp rate is lengthened, the likelihood of noise affecting the capacitor sensing process increases as more noise sources may be introduced into the process during this extended period. However, with a slower ramp rate, the corner frequency can be lowered nearer to $V_{REF}$, which in turn allows for better filtering of the noise. It is understood that the present embodiment need not be linked to ramp rate, but may be used to filter specific environmental noise even if the ramp rate remains static. Accordingly, the method 1100 may be used to modify the corner frequency related to capacitive sensing for purposes of noise reduction, regardless of whether other portions of the capacitive sensing circuitry such as the ramp rate of the capacitor $C_{EXT}$ are reconfigured.

To accomplish this, a desired corner frequency is identified in step 1102. The corner frequency may be based on a previously identified noise threshold that accounts for any number of factors, such as a desired scanning resolution (with lower resolution scanning having a higher tolerance for noise than higher resolution scanning as the last few bits are the most likely to be lost in noise but are largely irrelevant for lower resolution scanning), compensation for known ambient noise within a particular environment within which the filter 552 is to operate, and/or other factors. The desired corner frequency may be a particular value (e.g., 320 kHz) or may be selected based on a "best fit" of the desired corner frequency from multiple predefined corner frequency options. For example, the desired 320 kHz corner frequency may fall between predefined corner frequency options of 250 kHz and 500 kHz, and the user would select the predefined option that best meets their performance needs.

Once the corner frequency is identified, one or more corresponding resistance settings are determined in step 1104. It is understood that the resistance settings may vary based on the particular circuit implementation. Furthermore, the resistance settings may be selected based on associated ramp settings controlling the ramp rate of $C_{EXT}$ or may be set based on other criteria. For example, the ramp rate may remain static but the corner frequency may still be altered to account for a known noise issue. The term "resistance setting" is used in the present disclosure to refer to any setting that may be used to configure the corner frequency and does need not be in the form of an actual resistance value.

Referring also to FIG. 12A, a table 1200 illustrates four selectable ramp rates for $C_{EXT}$ denoted as T8, T4, T2, and T1. For purposes of example, the ramp rates equate to eight microseconds for T8, four microseconds for T4, two microseconds for T2, and one microsecond for T1. The ramp rates are configurable via two bits ramp_sel<1> and ramp_sel<0> that may be set to select one of T8, T4, T2, or T1. Accordingly, selecting one of the ramp rates T8, T4, T2, or T1 results in configuring $C_{EXT}$ with the selected ramp rate using, for example, circuitry described previously.

Referring also to FIG. 12B, a table 1202 illustrates the four selectable ramp periods T8, T4, T2, and T1 of FIG. 12A with corresponding settings for control bits. In the present example, using the circuit diagram of FIG. 6G as an example circuit, the control bits include three bits sel_lp<2:0>, and setting these three bits results in adding or subtracting resistance via control bits SWP<1>-SWP<5> and control bits SWN<1>-SWN<4>, which were previously described with respect to FIG. 6G. More specifically, the control bits SWP<1>-SWP<5> and control bits SWN<1>-SWN<4> may be controlled via the three bits sel_lp<2:0> in order to provide the resistance needed for a particular corner frequency for a desired time period T8, T4, T2, or T1. Rows in the table of FIG. 12B indicate settings for different levels of resistance for the particular ramp rate T8, T4, T2, and T1, as described below with respect to FIG. 12C.

Referring also to FIG. 12C, a table 1204 illustrates the resistance provided by P-channel transistors (RES_PMOS) and the resistance provided by N-channel transistors (RES_NMOS) when the control bits SWP<1>-SWP<5> and control bits SWN<1>-SWN<4> are set for the ramp rates T8, T4, T2, and T1. In other words, the control bit settings of FIG. 12B result in the resistances illustrated in FIG. 12C. As can be seen, different settings of the three bits of sel_lp<2:0> vary the resistance provided by the transistors 629 and 631, allowing the corner frequency to be selected based on the selected resistance. In the present example, a value of zero for both RES_NMOS and RES_PMOS means that the filter 552 is turned off and the total resistance is only about 3 k Ohm.

Figures 12D, 14:
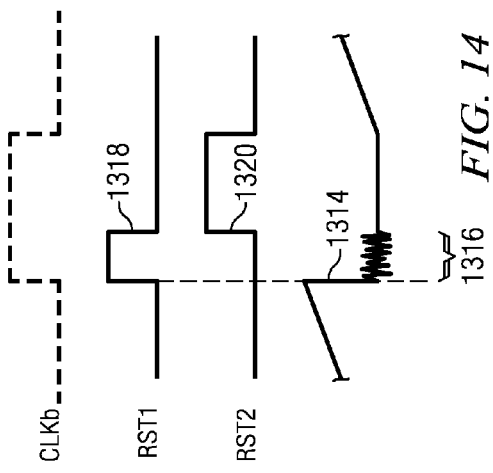
FIG. 12D is a table illustrating one embodiment of corner frequencies corresponding to the resistance values of FIG. 12C.
FIG. 14 illustrates one embodiment of a timing sequence that may be executed using the double reset circuitry of FIGS. 13A and 13B.

Referring also to FIG. 12D, a table 1206 illustrates examples of corner frequencies provided by the P-channel transistors (FREQ_PMOS) and corner frequencies provided by the N-channel transistors (FREQ_NMOS) based on the resistance values of FIG. 12C. In other words, the resistances illustrated in FIG. 12C result in the corner frequencies illustrated in FIG. 12D. It is understood that many different variations may be made to the example of FIGS. 12A-12D, including variations in the number of control bits, the number of selectable ramp rates, and the number of selectable resistances/frequencies. In some embodiments, a particular value for the control frequency may be set rather than a predefined value.

Referring again specifically to FIG. 11, once the resistance settings are determined in step 1104, they may be applied to the circuit in step 1106. As described above, this may entail setting particular bits (i.e., the three bits of sel_lp<2:0>), although the present disclosure encompasses any process that may be used to manipulate the resistances and thereby set the corner frequency to a desired level. For example, the three bits sel_lp<2:0> may be set via control logic, which in turn adds/removes certain transistors from the variable resistance path as described with respect to FIG. 6G and FIG. 12B.

Accordingly, the corner frequency may be modified by changing the resistance of the variable resistance path formed by the two transistors 629 and 631. This enables a user to easily define the corner frequency to implement specific filtering requirements by raising or lowering the corner frequency as desired.

Double Reset

Figure 13A:
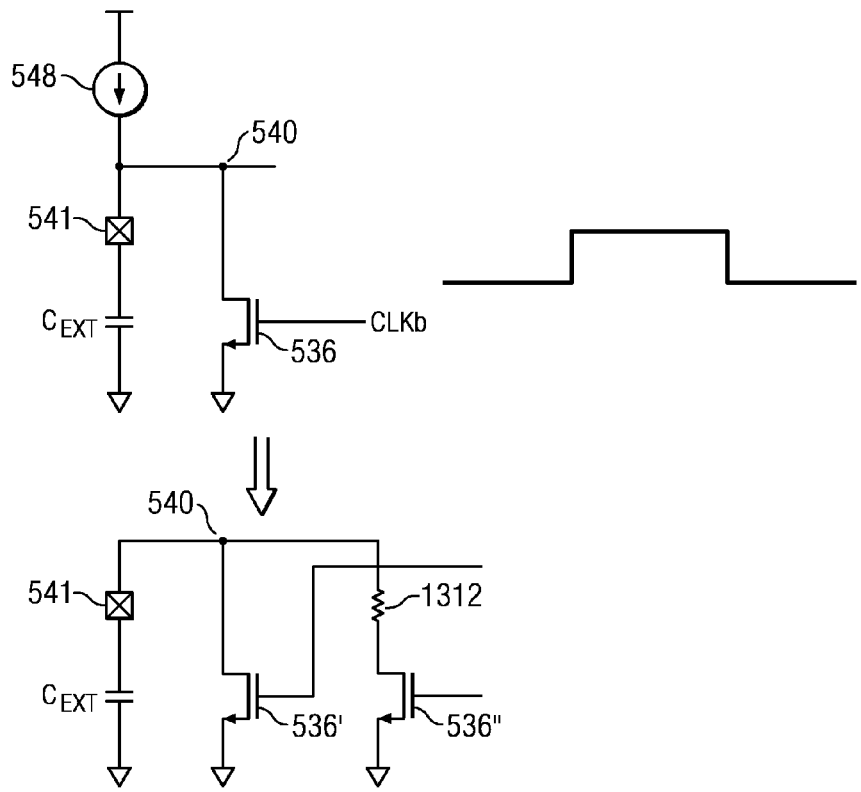
FIGS. 13A and 13B illustrate a diagram of one embodiment of double reset circuitry that may be located in the analog front end circuitry of FIG. 5B.
Figure 13B:
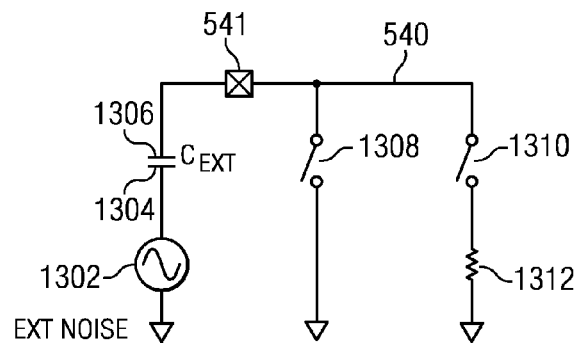

Referring now to FIGS. 13A and 13B, there is illustrated the embodiment wherein a double reset is utilized for discharging the device under test (DUT) which is labeled $C_{EXT}$. In the top portion of FIG. 13A, a detail of discharge circuit for $C_{EXT}$ in the embodiment of FIG. 5 is illustrated with a single reset operation. In this operation, the capacitor $C_{EXT}$ attached to terminal 541 is charged up during the charging portion of the operation with the current source 548. Thereafter, node 540 is pulled low to discharge capacitor $C_{EXT}$. This is in response to Clkb going high. The goal of the operation of transistor 536 is to fully discharge capacitor $C_{EXT}$ for the next charge operation.

Referring now to FIG. 13B, there is illustrated a diagrammatic view of the real world environment wherein external noise is provided by a noise generator 1302. This is connected to a bottom plate 1304 of capacitor $C_{EXT}$, wherein the top plate 1306 is connected to node 541. The noise output by the generator 1302 will cause a noise signal to be superimposed on the bottom plate 1304. If only a single transistor, the transistor 536 in the top of FIG. 13A, were utilized, this would be represented by a switch 1308. This switch 1308 is a low impedance switch, such that there is a very good ground on the top plate 1306 to allow for a low impedance path to ground. If such were the case, this noise at the high frequencies would remain on the capacitor when the switch 1308 were moved from a closed position to an open position due to the top plate 1306 of $C_{EXT}$ being connected to ground through a low impedance path such that residual charge would remain on the capacitor $C_{EXT}$. This is an undesirable situation. To solve this, a second switch 1310 is provided that is closed after switch 1308 is opened. This switch 1310 has an associated impedance or resistance 1312 associated therewith. This impedance is much larger than the impedance of the capacitor $C_{EXT}$. Thus, it can be seen that, when switch 1310 is closed, this results in a series capacitor to node 540 with a shunt resistor 1312. This is a low pass filter. Thus, substantially all of the high frequency noise will be filtered out to result in the DC voltage across capacitor $C_{EXT}$. Any charge that was stored on capacitor $C_{EXT}$ during the time that switch 1308 were closed would be drained off by switch 1310 and resistor 1312 and, since this is a low pass filter and the high frequency noise is filtered out, the noise from generator 1302 would not be imposed thereon. The reason for the switch 1308 is that the capacitor $C_{EXT}$ must be discharged relatively quickly to ensure that each SAR operation can be facilitated in a timely manner, i.e., the overall SAR operation needs to be as fast as possible. If only the switch 1310 were utilized, the decay time for that capacitor $C_{EXT}$ would be so long that the overall time required to resolve the value of a particular capacitor would be significant. The goal is to resolve this value in as short a time as possible. Thus, by utilizing a first low impedance switch to substantially drain all the charge off capacitor with the exception of that associated with external noise, followed by utilizing a higher resistance switch to function as a low pass filter will allow the capacitor to be fully discharged prior to the next charging cycle.

Referring further to FIG. 8, it can be seen that the transistor 536 is divided into two transistors, a transistor 536' and 536". The transistor 536' is a larger transistor and has a bigger WCL ratio than transistor 536". A small polycrystalline silicon resistor could be utilized or, alternatively, a smaller transistor, i.e., more resistive, will be acceptable. The operation is illustrated in the timing chart OF FIG. 14. A first pulse RST1 is initiated at the time that the node 540 passes the threshold and goes into a discharge operation. This is at a point 1314 at which time RST1 goes high. This causes the node 540 to discharge but there will still be some noise 1316 disposed on the capacitor. When RST1 goes low at an edge 1318, RST2 goes high at an edge 1320. This causes the high frequency noise to be drained off of the capacitor $C_{EXT}$. RST1 and RST2 fall within the edges of the original CLKB.

By utilizing this technique to remove this external noise, the overall measurement is improved. This external noise can come from many different factors. It can come from ambient light, from the display that typically underlies the touch screen, etc. Any type of external noise can cause the results of the SAR operation to have a slight error associated therewith. Thus, by removing this external noise, that measurement is improved.

It is understood that the double reset may be implemented in other ways. For example, the single transistor 536 may be used as described previously for the first reset. Following the first reset, the voltage to the transistor 536 may be lowered (e.g., until the transistor is almost off) and the transconductance of the transistor may then be used to provide the resistance. In such an embodiment, the transistor 536" and resistor 1312 are not needed. Accordingly, the double reset is not limited to the circuit implementation of FIGS. 13A and 13B, but is directed to any circuit that provides functionality enabling a first relatively rapid discharge period for a capacitor followed by a second slower discharge period for that same capacitor.

One or both periods of the double reset time may be configurable to account for delays in, for example, capacitors at the end of a transmission line. As such capacitors may need more time to charge and discharge, additional time for resets and double resets may be needed to adjust the circuit accordingly. The time period between the first and second resets may also be configurable. The timing of the reset periods may be configurable by a user via the setting of control bits, the introduction of circuit elements providing the desired timing, or by other means.

Capacitance Sense Port Monitor

Figure 15A:
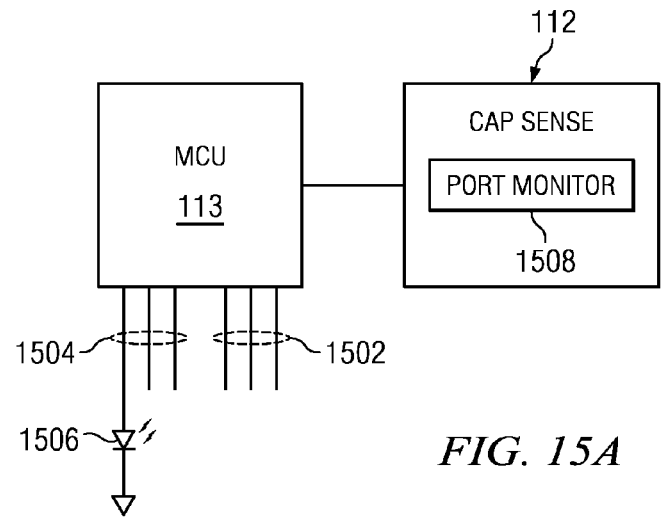
FIG. 15A illustrates one embodiment of the scan control IC interface of FIG. 1B with port monitor functionality.

Referring to FIG. 15A, a block diagram illustrates one embodiment with the MCU 113 coupled to the capacitive sense block 112 (as shown and described with respect to FIG. 1) and to various devices via input pins 1502 and output pins 1504. As described previously, capacitive sensing involves detecting a level of capacitance in an external capacitor (e.g., $C_{EXT}$ of FIG. 5B) and comparing the detected capacitance to a threshold level of capacitance. During a sensing cycle where the capacitor value is sensed and compared, it is important that the reference value for the capacitance remains consistent. For this consistency to occur, the internal common ground for both the reference capacitor $C_{REF}$ (FIG. 5B) and the external capacitor $C_{EXT}$ should remain constant. In other words, while it is acceptable to have an offset between the external ground level and the internal ground level, this offset (if any) must not change between the time the external capacitance is discharged (i.e., reset) and the end of the conversion.

Because capacitive sensing deals with very low currents, there may be time delay on the resistive line along which the capacitance is sensed but there is generally not a voltage drop (at least not a drop of any significance). This means that the internal ground levels are relatively constant compared to the variations possible in external ground levels. However, if something disturbs the internal ground during a conversion process, the conversion result may be degraded due to the change in the reference.

One factor in the behavior of the internal ground is the operation of the MCU 113. The MCU 113 has a limited number of ground pins and these pins may affect the internal ground levels. More specifically, the MCU 113 may be coupled to various devices via the input pins 1502 and output pins 1504. These input pins 1502 and output pins 1504 are toggled on and off to drive devices, communicate, and perform other functions. There is a chain of parasitic resistors between each of the pins and the internal ground of the MCU 113. For example, for the output pin 1504 coupled to an LED 1506, there is a parasitic resistance inside a pull down transistor (not shown) used to turn on the LED, another inside the internal ground routing inside the IC, and another inside the bond wire going from the MCU 113 to the circuit board's ground.

The MCU 113 may affect the internal ground level and therefore may affect the capacitive sensing results because, when the MCU 113 drives the LED 1506 or other high current devices, the internal ground offset may shift. This shift in the internal ground mainly occurs when toggling the output pins 1504 if the output pins are driving a heavy load. For example, the MCU 113 may drive the LED 1506 via one of the output pins 1504 (e.g., a GPIO pin). When the MCU 113 turns on the high output current device that is the LED 1506, the LED is not pulled to true ground, but is instead pulled to some voltage value (e.g., 0.8V) that is higher than ground. Accordingly, when the MCU 113 turns on the LED 1506, the entire ground for the MCU 113 (including the ground for the capacitive sense block 112) moves up. This means that when the LED 1506 is turned on, the opposite (i.e., grounding) pole of $C_{REF}$ is at a different potential than the external ground. Similarly, if the LED 1506 is on and then turned off, $C_{REF}$ is pulled down as the internal ground is pulled down. Therefore, $C_{REF}$ is affected by changes to the internal ground caused when the high current output pins 1504 of the MCU 113 are toggled. The input pins 1502 may generally be ignored as toggling the input pins does not affect the internal ground, at least at a level that causes a problem with capacitive sensing. Similarly, output pins 1504 may generally be ignored if they are floating or not driving a high current load.

Figure 15B:
FIG. 15B illustrates one embodiment of the timing of a "sensitive period" during a capacitor scanning process within which a change in internal ground may be addressed by the port monitor functionality of FIG. 15A.

As illustrated in FIG. 15B, this change in the internal ground affects the conversion process only if the change occurs during a "sensitive" period in the conversion process that begins with the release of the reset signal and ends when the bit conversion stops (i.e., the period between $t_1$ and $t_2$). A change during this sensitive period affects the conversion process because the reference value for the capacitance for that particular conversion will not be constant and the results of the conversion may therefore be degraded. If the change in the internal ground occurs outside of this sensitive period (i.e., prior to $t_1$ or after $t_2$), it does not affect the conversion process because the reference value will be consistent. As described previously, the actual reference value is not important, but consistency of the reference value is important. Therefore, changes to the reference value are not important unless they occur during a conversion.

To prevent this degradation of the conversion result, the capacitive sense block 112 includes a port monitor block 1508 representing the port monitor functionality. The port monitor block 1508 may be configured to monitor pins that are identified by a user as potentially causing problems for the conversion process. For example, since input pins 1502 are ignored, the port monitor block 1508 will not monitor them. Output pins 1504 with low current loads do not adversely affect the ground levels, so those can also be ignored (as set by the user). However, output pins 1504 that potentially have a heavy current load may be identified by the user for monitoring, such as those coupled to a high current device such as the LED 1506 or a communication line. In the present example, ports that may be monitored by the port monitor block include SFR Write to GPIO, UART output toggle, SPI output toggle, SMBus output toggle, PCA output toggle, and CPO output toggle. The monitoring performed by the port monitor block 1508 may depend on the type of pin/device that is being monitored. For example, the port monitor block 1508 may watch an output pin 1506 driving a device to determine whether the MCU 113 drives onto a port control register and may watch a communication line to determine whether it is changing state. As is described below, the port monitor block 1508 is involved in a retry process that enables the conversion process to restart when a toggle occurs during the sensitive portion.

Figure 15C:
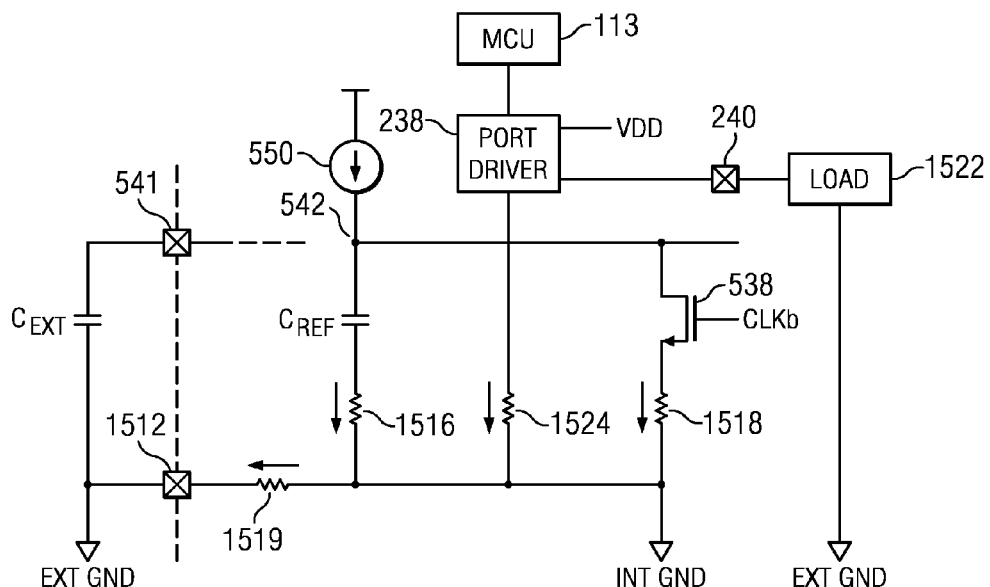
FIG. 15C illustrates a simplified diagram of the circuit of FIG. 15A depicting the internal ground.

Referring now to FIG. 15C, there is illustrated an embodiment further illustrating the practical current flow in the circuitry associated with the capacitive sense operation with respect to internal ground and with respect to external ground. The external ground is connected to a terminal 1512 and this is connected through a bond wire (not shown) to the circuit die. This will result in some resistance associated therewith. Further, this resistance, represented by a reference numeral 1514 represents various internal runs on the die associated with the internal ground. Each circuit can be routed in many different ways to a particular ground. Thus, a circuit may have a certain amount of resistance associated therewith in series between the circuit and the internal ground and the internal ground subsequently separated from external ground by the resistance 1514. As will be described herein below, this can cause a problem with respect to the charge on the capacitor $C_{REF}$ that is attached between node 542 and ground, as internal ground can fluctuate.

The diagram of FIG. 15C illustrates the node 544 being connected to the top plate of capacitor $C_{REF}$. The bottom plate is connected on one side of a series resistor 1516, the other side thereof connected to internal ground and to the chip side of resistor 1514. This resistor 1516 represents the internal runs and conductive paths between the bottom plate of the capacitor $C_{REF}$ and the resistor 1514. Similarly, transistor 538, which is connected between node 540 and internal ground has a series resistance of 1518 associated therewith to internal ground. This, again, represents the series resistance of the various runs and the such required to connect the source of transistor 538 to the chip side of resistor 1514. The output of the overall chip when driving a load with a digital voltage is provided on a terminal 240 which is connected to a load 1522. This is driven by the associated port driver 238. When the port driver 238 is activated, i.e., the state changes from ground to a high voltage or from a high voltage to ground, there will be a current change in that port driver 238. For a heavily loaded port, this could cause a change in the current to internal ground through an internal resistor 1524 to the one side of resistor 1514. This, as would be expected, would cause the internal ground to change in value. Since the current through resistor 1516 and resistor 1518 would be constant regardless of the load, the current driven through resistor 1524 can cause a change in the internal ground voltage level due to the value of the resistor 1514 disposed between the internal ground on the die and the external ground. This will cause the voltage level on the bottom plate of capacitor $C_{REF}$ to change, thus potentially changing the value of the charge stored therein and the voltage on node 540. This can cause an error in the measurement of the capacitance value of $C_{EXT}$.

Figure 15D:
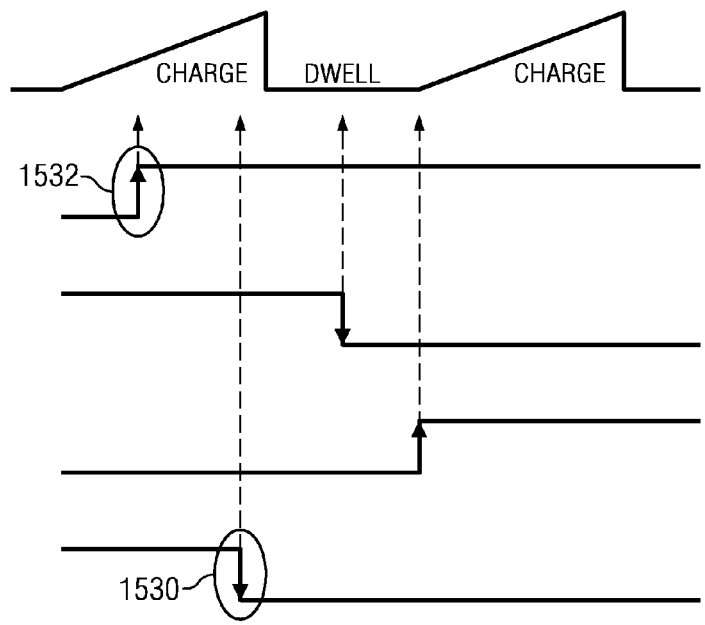
FIG. 15D illustrates a timing diagram for the embodiment of FIG. 15C.

Referring to FIG. 15D, this is illustrated a timing diagram with respect to the charge and dwell portions of the diagram. If at any time during the sampling operation when the capacitor is being charged, a change in state on a port driver driving a fairly large load occurs, an error can occur. This can be seen with respect to two different potential situations 1530 and 1532 where a change from a low to a high or a change from a high to a low occurs during a charge time. If such a change occurs during the testing of any SAR bit, it is desirable to indicate the sample as being bad and discard such sample.

Figure 15E:
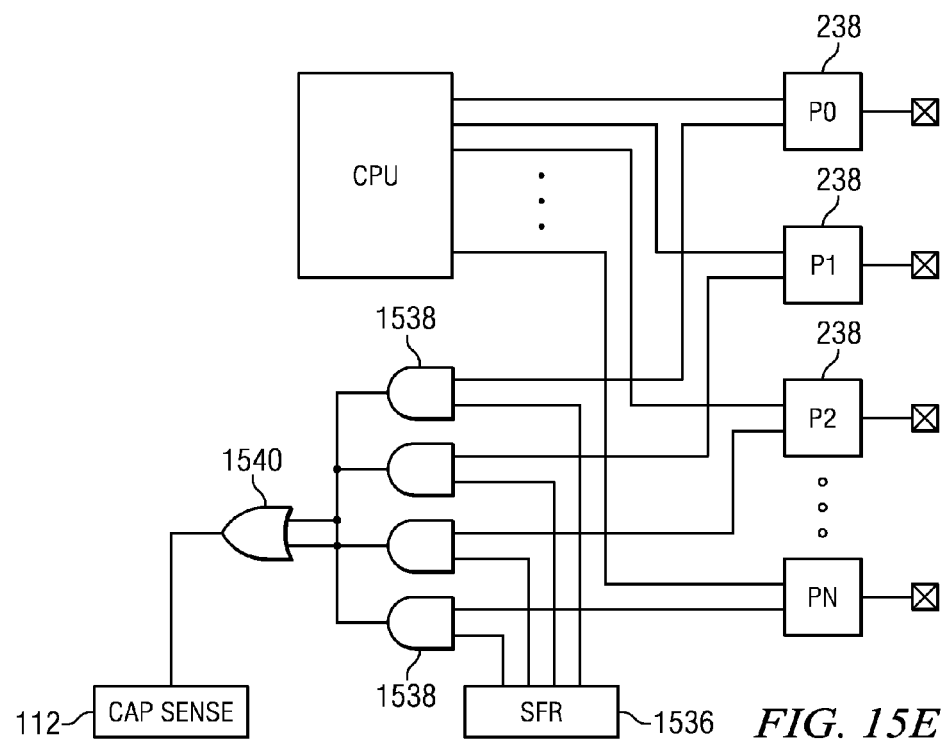
FIG. 15E illustrates an exemplary configuration for the port monitor.

Referring now to FIG. 15E, there is illustrated a diagrammatic view of the port monitor operation. The MCU 113, during operation, will drive the port drivers 238 with signals. Each of the port drivers 238 is associated with combinatorial logic that will sense when a change in state has occurred. When this change in state has occurred, this will cause a signal to be generated. It should be understood that anytime a change of state occurs on an output terminal 240, an error could be declared. However, the error typically occurs when the change is associated with heavily loaded ports. Therefore, the user is provided an SFR 1536 by which to program which ports are enabled for the Cap Sense Port Monitor function. This is facilitated by setting a bit for each available port in the associated SFR 1526. By ANDing this bit with associated AND gates 1528 with the output of an associated port driver 238, and then the output thereof ORed with an OR gate 1530, this provides an output any time one of the port monitors that is enabled indicates a change of state from either a low to a high or a high to a low, thus indicating a current instability. This is input to the cap sense block 112.

Figure 16:
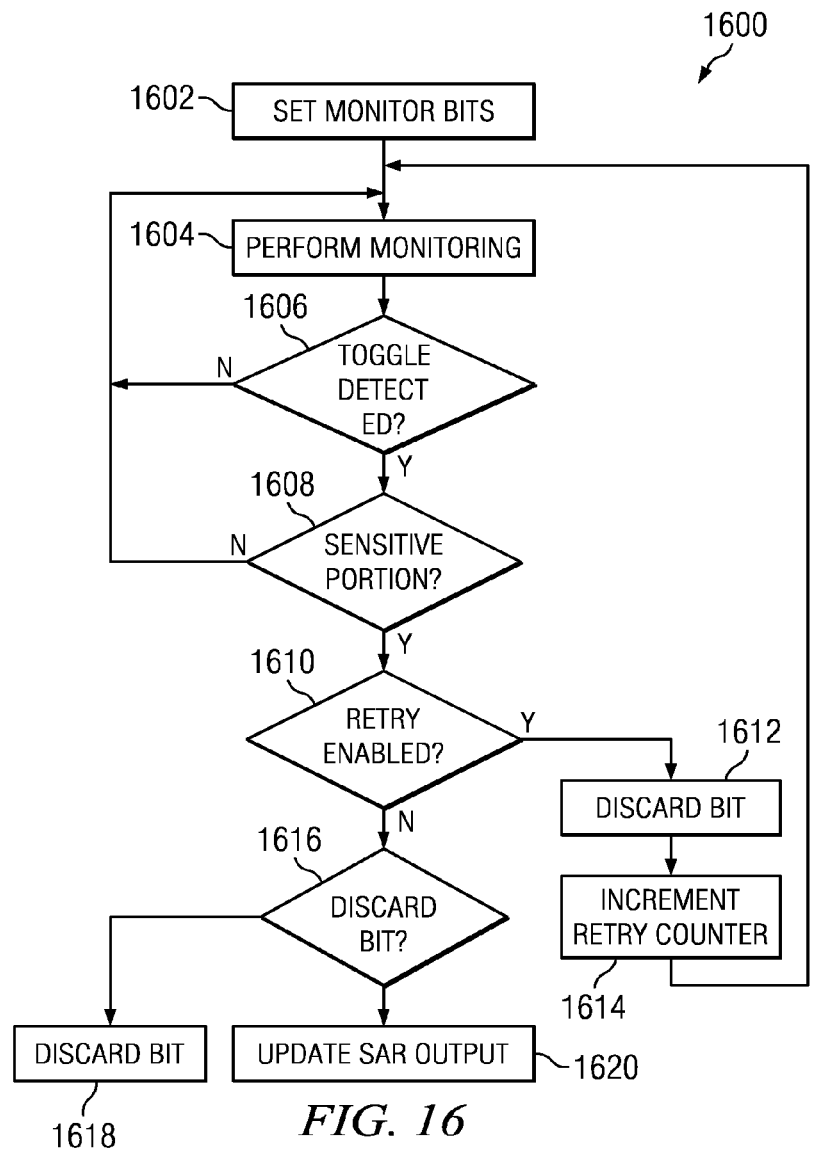
FIG. 16 is a flow chart illustrating one embodiment of a method for detecting a change in internal ground during the sensitive period of FIG. 15B and determining whether to retry the scanning process.

Referring now to FIG. 16, one embodiment is illustrated of a flow chart depicting a method 1600 by which port monitoring may be used to ensure that the conversion process is not adversely affected by a change in the ground level caused by output pin toggling. In step 1602, monitor bits may be set to configure the port monitor block 1508 to identify particular ones of the output pins 1504 that are to be monitored. This provides the user with control over the monitoring process and allows the user to configure the monitoring process to ignore pins that will not cause a problem with the conversion process and to monitor only those pins that may adversely impact the conversion process. In some embodiments, the port monitor block 1508 may have a default configuration that identifies certain pins to be monitored and the user may accept the default configuration or modify it as desired. In step 1604, the method 1600 begins to monitor the identified pins. A determination is made in step 1606 as to whether a toggle has been detected via the output of OR gate 1540 going high. If not, the method returns to step 1604 and continues to monitor. This loop of steps 1604 and 1606 may continue until a toggle is detected or the monitoring process is stopped.

If a toggle occurs, as determined in step 1606, the method 1600 continues to step 1608, where a determination is made as to whether the conversion process is in the sensitive period (i.e., the period that begins with the release of the reset signal and ends when the bit conversion stops) where a change in the ground level caused by the pin toggle can affect the result. If the conversion process is not in the sensitive period, the method 1600 returns to step 1604 and continues the monitoring process.

If the conversion process is in the sensitive period, the method 1600 continues to step 1610, where a determination is made as to whether a retry process is enabled. The number of retries may be configurable to provide a user with control over the retry process. For example, a default value for the number of retries may be unlimited, with a retry performed each time a toggle is detected. This retry is for the particular SAR bit being tested at that time. However, in a noisy environment, this may result in a high number of retries for that SAR bit until the pin settles enough for a retry to be successful. Accordingly, a user may set a maximum number of retries per conversion to ensure that the retry process eventually ends and the method 1600 is able to continue. The retry process may be disabled by the user, may be disabled due to the maximum number of retries being reached, or disabled for other reasons, such as when capacitive sensing is disabled.

The retry process involves discarding the SAR bit resulting from the current conversion process and starting the conversion process over for that SAR bit. For example, assume that the conversion process is on bit 4 when a toggle is detected on a port that is monitored by the port monitor block 1508. In this case, bits 1-3 have already been converted and the conversion occurred prior to the toggle. This means that bits 1-3 were determined using a constant reference and were not affected by a change in the internal ground caused by the toggle. However, the toggle occurred while bit 4 was undergoing conversion (i.e., in the sensitive period) and so a retry is needed for bit 4. Accordingly, if a retry is available, the method 1600 discards the current result bit in step 1612 and increments a retry counter in step 1614. Following step 1614, the method 1600 returns to step 1604 where the monitoring begins for the next conversion cycle that will retry the capacitive sensing process for the current bit.

If the retry process is disabled in step 1610, the method 1600 continues to step 1616, where a determination is made as to whether the bit from the conversion process is to be discarded or kept. This may be configured by a user to allow the user to determine whether to keep a particular bit or not. For example, in a noisy environment, the user may allow some number of retries before keeping the final result. If the bit is to be discarded, the method 1600 moves to step 1618 and discards the bit. If the bit is to be kept, the method 1600 moves to step 1620 and updates the SAR output to reflect the bit.

The user may configure different aspects of the conversion/retry process other than the pins to be monitored. For example, the user may opt to keep data rather than discard it (e.g., keep data if the environment is so noisy that retries are unlikely to succeed). The user may also define what functions are allowed to discard data and how much data is to be discarded (e.g., two bits). The user may also see what has been discarded and make determinations regarding the data at that point. Accordingly, the user may have a substantial amount of control over the conversion/retry process.

Figure 17:
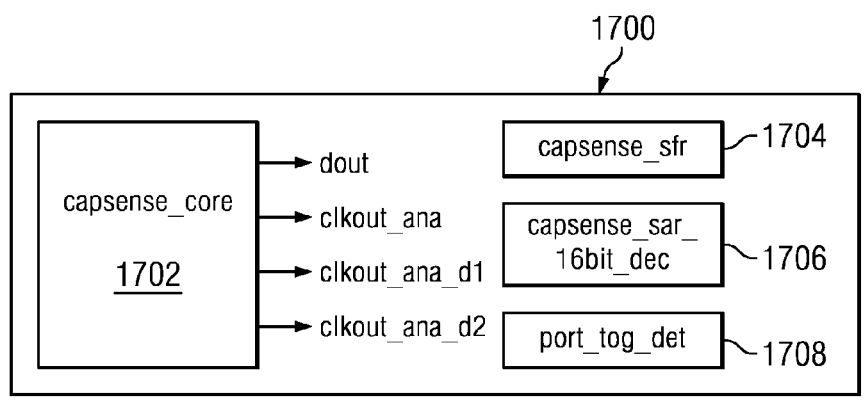
FIG. 17 illustrates one embodiment of port monitoring logic within a capacitive sensing block in the scan control IC interface of FIG. 15A.

Referring to FIG. 17, a block diagram illustrates another embodiment of port monitoring logic 1700 associated with the capacitive sensing function that may be used to implement the method of FIG. 16. The port monitoring logic 1700 includes core logic 1702 that generates signals dout, clkout_ana, clkout_ana_d1, and clkout_ana_d2. A capsense_sfr block 1704 may be used to set port monitoring bits (i.e., "port toggle" enable bits) that allow a user to define which ports/pins are to be monitored. A capsense_sar_16 bit_dec block 1706 handles SAR decisions such as whether to retry. A port_tog_det block 1708 determines whether a toggle has occurred.

Figure 18:
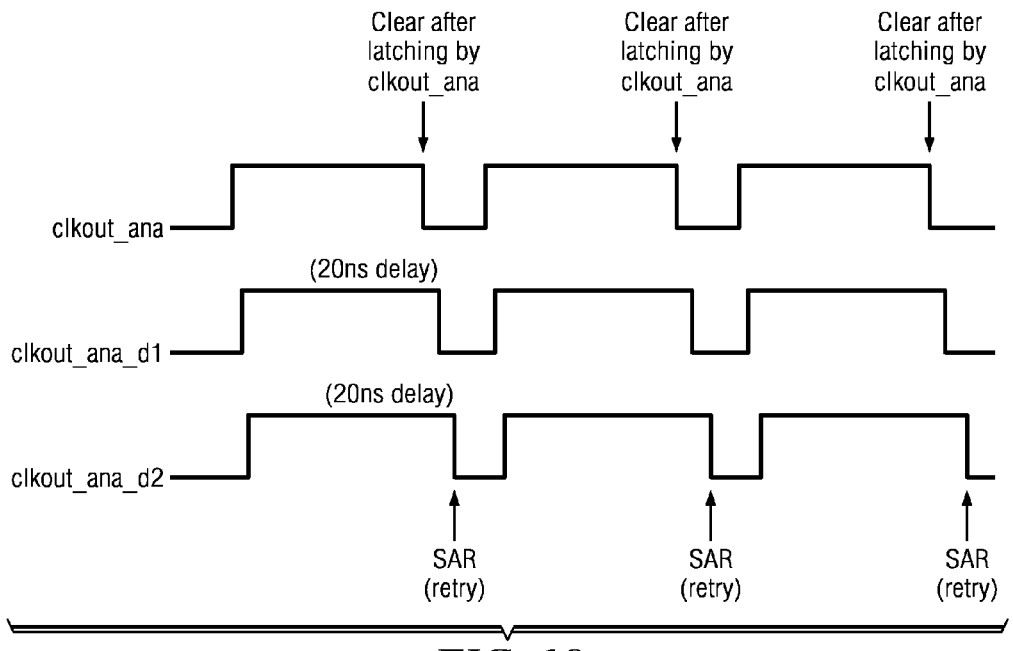
FIG. 18 illustrates one embodiment of a timing diagram for a port toggle latch the port monitoring logic of FIG. 17.

Referring also to FIG. 18, one embodiment of a timing diagram for a port toggle latch illustrates that the port toggle latch is set by a sysclk signal when the port_tog_det block 1708 detects that there is a pin toggle and cleared when (1) capacitive sensing is disabled or retry is disabled; (2) capacitive sensing begins after the toggle occurs; (3) on a clkout_ana_f signal (FIG. 19); or (4) on clkout_ana_d1 and clkout_ana_d2 during a suspend mode. In the present example, the falling edge of clkout_ana_d2 indicates the timing for a retry after a forty nanosecond delay.

Figure 19:
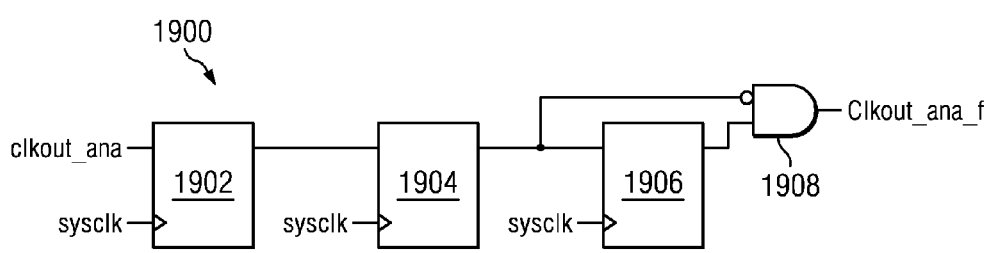
FIG. 19 is a diagram of one embodiment of logic circuitry for generating a clkout_ana_f signal based on sysclk and port_ana signals to reset the port toggle latch in the port monitoring logic of FIG. 17.

FIG. 19 illustrates one embodiment of a circuit 1900 that may be used to produce the clkout_ana_f signal. The signal clkout_ana serves as the toggle input for a flip-flop 1902 and the sysclk signal is the clock signal for the flip-flop. The output of the flip-flop 1902 is a time-shifted clkout_ana, which serves as the toggle input to the next flip-flop 1904, which also has the sysclk signal as the clock signal. The output of the flip-flop 1904 is a time-shifted clkout_ana, which serves as the toggle input to the next flip-flop 1906, which also has the sysclk signal as the clock signal. The output of the flip-flop 1904 also provides an input to an inverting input pin of an AND gate 1908. The other input (non-inverting) of the AND gate 1908 is provided by the output of the flip-flop 1906. The output of the AND gate 1908 is the signal clkout_ana_f.

Figure 20:
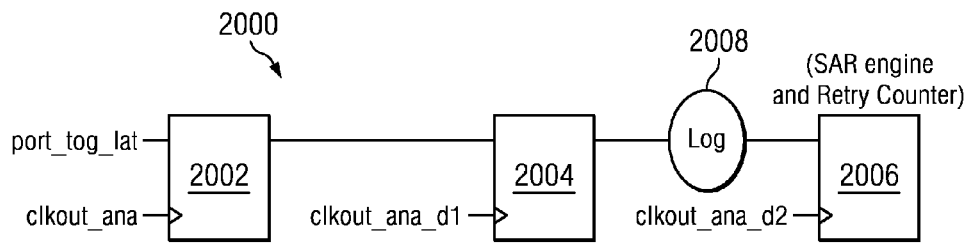
FIG. 20 is a diagram of one embodiment of logic circuitry for producing a delay prior to the performance of SAR tasks in the port monitoring logic of FIG. 17.

FIG. 20 illustrates one embodiment of a circuit 2000 that may be used for timing of the SAR tasks such as retry counter incrementing and retry. The signal port_tog_lat serves as the toggle input for a flip-flop 2002 and the clkout_ana signal is the clock signal for the flip-flop. The shifted output port_tog_lat of the flip-flop 2002 serves as the toggle input to the next flip-flop 2004, which has the clkout_ana_d1 signal as the clock signal. The shifted output port_tog_lat of the flip-flop 2004 triggers a log 2008 and serves as the toggle input to the next flip-flop 2006, which has the clkout_ana_d2 signal as the clock signal. The flip-flop 2006 services a SAR retry counter and provides timing for SAR engine tasks.

Figure 21:
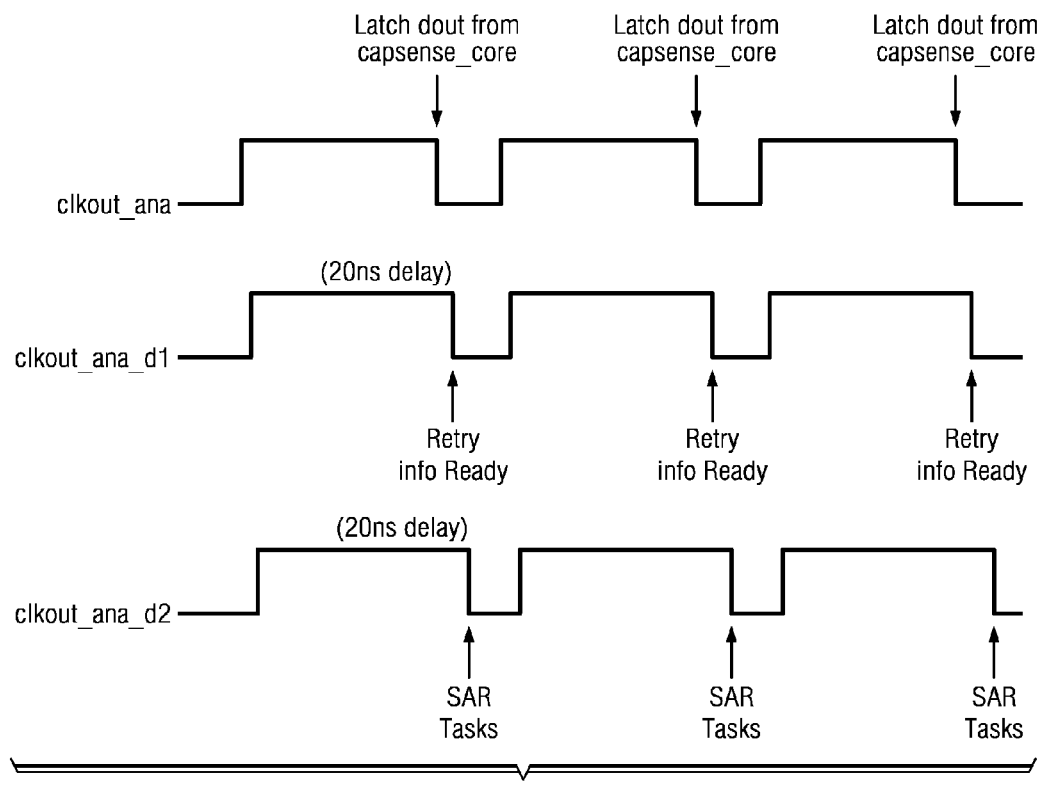
FIG. 21 illustrates one embodiment of a timing diagram for the performance of SAR tasks in the port monitoring logic of FIG. 17.

Referring also to FIG. 21, one embodiment of a timing diagram for the SAR engine illustrates that the capsense_sar_$_{16}$ bit_dec block 1706 responds to the clkout_ana signal by suspending the current conversion process. The falling edge of clkout_ana_d1 indicates that the information for a retry is ready and the falling edge of clkout_ana_d2 indicates the timing for SAR tasks (e.g., retry, incrementing the retry counter (Log), and updating the SAR output).

Accordingly, capacitive sensing may be performed at the same time as high current signaling by the MCU 113, since disruptions in the ground level caused by the MCU signaling can be dealt with by the present embodiment. Otherwise, in order to avoid degradation of the conversion process output, output current loads such as digital transmissions at full power or LED signaling would require a halt in capacitance sensing, significantly decreased converter resolution, or periodic cessation of communications so that capacitance sensing could be performed.

Programmable Converter Resolution

Figure 22:
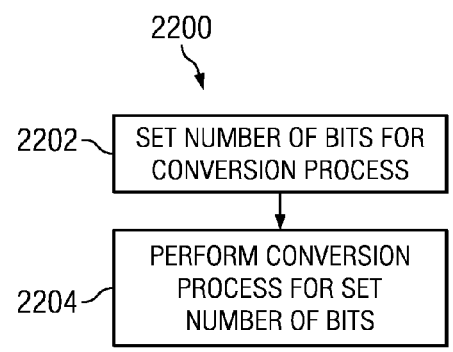
FIG. 22 is a flow chart illustrating one embodiment of a method for setting a number of bits for use by a converter for a capacitive scanning process.

Referring to FIG. 22, one embodiment is illustrated of a flow chart depicting a method 2200 by which a converter resolution may be selected. As is known, conversion time for capacitance conversions using a SAR converter such as is described above has a direct relationship to the number of bits being converted. In other words, the length of time it takes to do a conversion is directly related to the number of bits being converted, with larger numbers of bits taking increasing amounts of time. Furthermore, the length of time is also related to power consumption, as the power required for the conversion process is related to the number of bits converted, with power requirements increasing as the number of bits increases.

Although the converter of the present example is capable of sixteen bit conversion, all sixteen bits are frequently not needed because some of the lower bits (e.g., the lower three or four bits) may be lost due to the impact of ambient noise on the capacitive sensing process. This loss may occur despite various methods for attempting to accurately obtain the bits. Accordingly, converting these lower bits is an ineffective use of both time and power. Merely discarding them after the conversion process does not address this inefficiency as the converter has still gone through the entire conversion process.

Rather than discarding these bits after performing the conversion process, the present embodiment is directed to instructing the conversion process to simply skip the conversion on these bits. In other words, while the converter has the resolution needed for the bits (i.e., it is capable of sensing and converting at a sixteen bit resolution), the converter may be configured to simply stop the conversion process before doing these later bits.

Therefore, in step 2202, a number of bits are set for the conversion process (e.g., twelve bits if the last four of the sixteen bits are to be skipped). In step 2204, the method 2200 performs the conversion process on the set number of bits as described previously. When the set number of bits have been converted, the method 2200 ends even though it may be possible to convert more bits (e.g., the last four bits that were skipped). This process enables the user to adjust the resolution of the converter to match the environment in which sensing is performed, thereby optimizing speed and power consumption by skipping the conversion of bits that are not needed.

By way of example, consider that during operation of a touch screen, there are certain situations that are more noisy than others. If, for example, a phone with a touch screen were disposed on a table, and no interaction with the display were present, this would be a relatively low noise environment. However, if the phone were picked up or the screen touched, this would result in a more noisy environment in the locale of the finger touch or the display in general. Since the display is being continuously scanned, it will continuously consume power. Further, in order to fully sample any $C_{EXT}$ with the full SAR conversion size of 16 bits (the width of the SAR in this example) a certain amount of time is required for each scan of the panel. Thus, an entire panel scan will be achieved after a predetermined amount of time. In noisy environments, it may not be necessary to utilize the full resolution of the ADC. Since the last number of bits, i.e., the last few LSBs, may not be required for this operation, they could be discarded and not utilized. If this were done, this would save time for each scan as the time to resolve the value of $C_{EXT}$ for each row/column could be reduced. For the capacitance sense operation that senses the actual capacitance value to ground and the mutual capacitance sensing operation of the multi-touch resolve block, there will be a certain amount of time required to run the capacitive sensing operation. Thus, for the MTR operation, which requires a SAR conversion for each intersection of row and column lines, the below described programmable resolution would be applicable although it is described with respect to the capacitive sense operation.

In certain applications, the resolution of the ADC can be lowered since the application is would operate in a noisy environment. For other operations or applications where the noise is low, the resolution would be increased. For example, when the panel is picked up and a touch has been detected, the scanning speed can be increased and the power reduced by lowering the resolution. When a touch is detected, this indicates a much noisier environment, i.e., there has been some perturbation detected and resolution of the ADC is then decreased, resulting in faster scanning and less power required for each SAR operation. This will result in the overall scan of the panel being longer shorter also. Thus, the conversion resolution change is a function of the application, this application being one of, for example, checking the noise associated with the overall scanning operation. In the noise reduction application, samples are taken and compared with each other to determine a standard deviation and the variance is then determined. If the variance is above a certain level, this indicates a noisy environment which will require a lower resolution. By processing numerous samples and evaluating those samples, some indication can be received of activity on the display which is the result of an external perturbation of some sort, it being ambient noise or a touch. From an ambient noise standpoint, there are situations where the display that underlies the touch screen can come on and actually create noise. In that type of application, i.e., scanning a display while the display is active, could result in a higher or lower resolution being required.

Figure 23A:
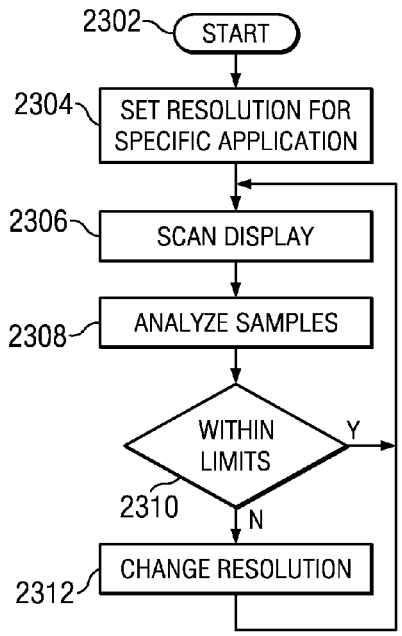
FIGS. 23A and 23B illustrate flow charts for the resolution setting operation.

Referring now to FIG. 23A, there is illustrated a flow chart depicting the operation of the programmable converter resolution. This is initiated at a block 2302 and then proceeds to a block 2304 to set the resolution for a specific application. This is an SFR user programmable operation. The program then proceeds to a function block 2306 to scan the display with a touch screen, and then flows to a block 2308 to analyze the various samples. It is the analysis of the samples that makes a determination as to whether a particular user programmable level is to be selected. The program then flows to a function block 2310 to determine if the analysis is within predetermined limits, i.e., the activity of the display as indicated by the value of the samples in any way indicates that the resolution should be changed. It is not within the limits, i.e., a change is required, the program flows along an "N" path to a function block 2312 to change the resolution in accordance with the SFR. The program then flows back to a function block 2306. If no change is required, the program flows along a "Y" path back to the input of block 2306. This continues until the resolution has changed.

Figure 23B:
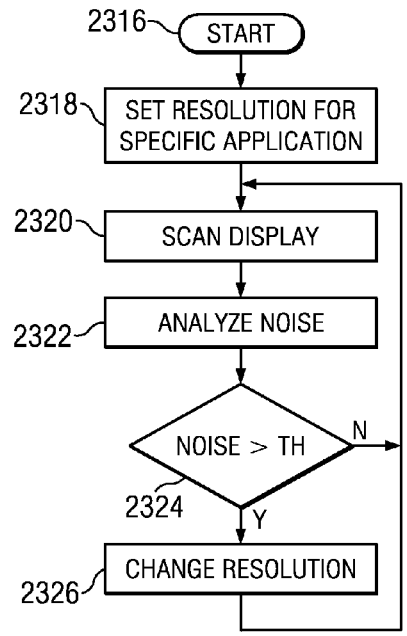

Referring now to FIG. 23B, there is illustrated a more specific flow chart, which is initiated at a block 2316 and then proceeds to a function block 2318 to set the resolution for a specific application and then to a block 2320 to scan the display and then to a block 2322 to analyze the noise in the sample. If the noise is greater than a threshold, in this example, as indicated by decision block 2324, the program flows to a function block 2326 to change the resolution and then back to the input of the scan block 2320. If the noise is still below the threshold, i.e., it is within the limits of a non-noisy environment, the program flows along a "N" path back to the input of the block 2320.

Figure 23C:
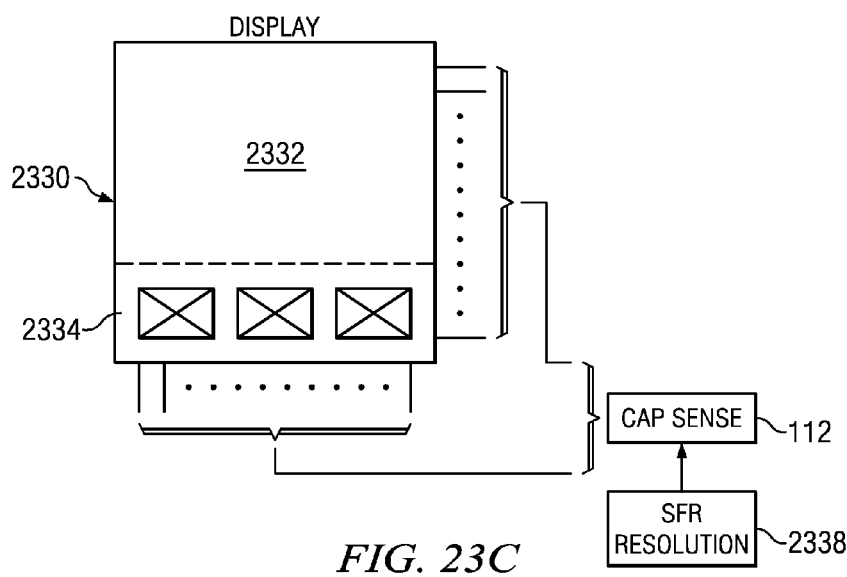
FIG. 23C illustrates a diagrammatic view of the display which shows two areas.

Referring now to FIG. 23C, there is illustrated a diagrammatic view of the display 2330 which shows two areas, an area 2332 which is typically not touched and an area 2334 which is associated with keys such as a touch screen keyboard. The keyboard is typically at the bottom of the display. This particular area would typically be an application that would have a different noise threshold than the region 2332. Thus, each of these areas would be scanned with a different application. The resolution for the various areas is stored in an SFR 2338 and the cap sense block 112 will have the resolution thereof set, depending upon the overall display, i.e., one resolution for a specific application, or the resolution can be individually changed for each area. For example, all of the row lines for the section 2332 may continue to have a low resolution, since they will not be in a typically noisy environment, wherein the column lines will all be changed of function of the noise level. The row lines for the area 2334 will have a different analysis associated therewith, i.e., there will be a more discerning noise analysis, for example.

It will be appreciated by those skilled in the art and having the benefit of this disclosure that the capacitive sense circuit and methods described herein provide a flexible solution to provide configurable capacitive sensing capabilities for a capacitive sensor array. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A system for reducing noise when detecting a capacitance value of a capacitor in a touch display that operates in a potentially noisy environment, comprising:
   a capacitance sensor for determining a size of the capacitor in the touch screen display and the capacitor sensor including a charging circuit that charges the capacitor and a discharge circuit that resets the charge of the capacitor to substantially zero;
   a control circuit that controls the capacitance sensor charging and discharge circuits in accordance with a predetermined charging/discharging algorithm to resolve the value of the capacitor and output such value in a sampling operation;
   wherein the control circuit operating in accordance with the charging/discharging algorithm is subject to errors as a function of the noisy environment, which errors will be reflected in the output value; and
   noise reduction circuitry for modifying the operation of the control circuit to reduce noise without repeating the charge and discharge of the capacitor.

2. The system of claim 1, wherein the system is disposed on an integrated circuit chip in a package and the capacitor is external thereto.

3. A system disposed on an integrated circuit for reducing noise when detecting a capacitance value of a capacitor external to the integrated circuit in a touch display that operates in a potentially noisy environment, comprising:
   a capacitance sensor for determining a size of the capacitor in the touch screen display and the capacitor sensor including a charging circuit that charges the capacitor and a discharge circuit that resets the charge of the capacitor to substantially zero;
   a control circuit that controls the capacitance sensor charging and discharge circuits in accordance with a predetermined charging/discharging algorithm to resolve the value of the capacitor and output such value in a sampling operation;
   wherein the control circuit operating in accordance with the charging/discharging algorithm is subject to errors as a function of the noisy environment, which errors will be reflected in the output value;
   noise reduction circuitry for modifying the operation of the control circuit to reduce noise, wherein the noise is internally generated in the integrated circuit; and
   the noise reduction circuitry includes a detector for detecting and determining when the noise has been generated and the noise reduction circuitry modifying the operation of the control circuit during portions of the charging/discharging operation when the noise is above a certain level during such portions.

4. A system disposed on an integrated circuit for reducing noise when detecting a capacitance value of a capacitor external to the integrated circuit in a touch display that operates in a potentially noisy environment, comprising:
   a capacitance sensor for determining a size of the capacitor in the touch screen display and the capacitor sensor including a charging circuit that charges the capacitor and a discharge circuit that resets the charge of the capacitor to substantially zero;
   a control circuit that controls the capacitance sensor charging and discharge circuits in accordance with a predetermined charging/discharging algorithm to resolve the value of the capacitor and output such value in a sampling operation;
   wherein the control circuit operating in accordance with the charging/discharging algorithm is subject to errors as a function of the noisy environment, which errors will be reflected in the output value; and
   noise reduction circuitry for modifying the operation of the control circuit to reduce noise;
   wherein the charging and discharge circuits operate to deliver a bit value in a SAR operation in accordance with the SAR algorithm of the ADC having a fixed bit length and resolution, the control circuit operable to control the charging circuit and the discharge circuit to successively charge and discharge the capacitor in accordance with a SAR operation and the noise reduction circuitry is operable to vary the resolution of the SAR operation as a function of noise.

5. The system of claim 4, wherein the integrated circuit chip includes a processor wherein the processor operates to evaluate successive resolved values of the capacitor to determine if the capacitor is in a noisy environment and generates a modified resolution for the ADC operation.

6. The system of claim 5, wherein the processor is configurable to scan a plurality of capacitors in the touch screen in accordance with a scanning algorithm and wherein the resolution of the ADC is varied as a function of an application running on the processor.

7. A system disposed on an integrated circuit for reducing noise when detecting a capacitance value of a capacitor external to the integrated circuit in a touch display that operates in a potentially noisy environment, comprising:
   a capacitance sensor for determining a size of the capacitor in the touch screen display and the capacitor sensor including a charging circuit that charges the capacitor and a discharge circuit that resets the charge of the capacitor to substantially zero;

a control circuit that controls the capacitance sensor charging and discharge circuits in accordance with a predetermined charging/discharging algorithm to resolve the value of the capacitor and output such value in a sampling operation;

wherein the control circuit operating in accordance with the charging/discharging algorithm is subject to errors as a function of the noisy environment, which errors will be reflected in the output value; and noise reduction circuitry for modifying the operation of the control circuit to reduce noise, wherein the discharge circuit includes:

a first discharge circuit for discharging the capacitor through a low impedance path to ground;

a second discharge circuit for discharging the capacitor through a high impedance path to ground; and the noise reduction circuitry including timing circuitry to control the first and second discharge circuitry to first discharge the capacitor during a discharge operation through the low impedance path to remove a substantial portion of charge therefrom followed by discharging the capacitor through the high impedance path such that the second discharge circuit operates as a low pass filter to remove high frequency external noise from the capacitor.

8. The system of claim 7, wherein the noise is high frequency noise generated on a bottom plate of the capacitor connected to external ground external to the display.

9. The system of claim 7, wherein:

the first discharge circuit comprises a first transistor for discharging the capacitor to ground by connecting the top plate of the capacitor opposite the bottom plate thereof to internal ground internal to the display; and the second discharge circuit comprising a resistor in series with a second transistor, the second transistor for discharging the top plate of the capacitor through the series resistor to internal ground.

10. The system of claim 7, wherein:

the first discharge circuit comprises a first transistor for discharging the capacitor to ground by connecting the top plate of the capacitor opposite the bottom plate thereof to internal ground; and the second discharge circuit comprising a second transistor for discharging the capacitor to ground by connecting the top plate of the capacitor opposite the bottom plate thereof to ground, the second transistor having a substantially higher on impedance than the first transistor.

11. The system of claim 7 wherein the first discharge circuit operates for a shorter period of time in the second discharge circuit.

* * * * *